(12) United States Patent
Ogawa et al.

(10) Patent No.: US 6,237,218 B1
(45) Date of Patent: May 29, 2001

(54) METHOD AND APPARATUS FOR MANUFACTURING MULTILAYERED WIRING BOARD AND MULTI-LAYERED WIRING BOARD

(75) Inventors: Akira Ogawa, Ome; Yoshitaka Fukuoka, Hachioji, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/355,438

(22) PCT Filed: Jan. 29, 1998

(86) PCT No.: PCT/JP98/00369

§ 371 Date: Jul. 28, 1999

§ 102(e) Date: Jul. 28, 1999

(87) PCT Pub. No.: WO98/33366

PCT Pub. Date: Jul. 30, 1998

(30) Foreign Application Priority Data

Jan. 29, 1997 (JP) ................................. 9-015313
Jan. 29, 1997 (JP) ................................. 9-015313

(51) Int. Cl.⁷ .................................. H05K 3/36
(52) U.S. Cl. ................. 29/830; 29/846; 29/740; 29/741; 174/254; 428/209
(58) Field of Search ............... 29/840, 830, 740, 29/741, 846; 428/209

(56) References Cited

U.S. PATENT DOCUMENTS

| | | | |
|---|---|---|---|
| 3,833,553 | 9/1974 | Luttmer | 29/830 |
| 4,463,673 | 8/1984 | Moore . | |
| 4,536,239 | 8/1985 | Benson . | |
| 5,046,238 | 9/1991 | Daigle et al. | 29/830 |
| 5,048,178 | 9/1991 | Bindra et al. . | |
| 5,384,952 | 1/1995 | Matsui | 29/830 |
| 5,950,306 | 9/1999 | Suzuki et al. | 29/830 |

FOREIGN PATENT DOCUMENTS

| | | | |
|---|---|---|---|
| 3-91993 | 4/1991 | (JP) . | |
| 4-62993 | 2/1992 | (JP) . | |
| 4-267586 | 9/1992 | (JP) . | |
| 4-352385 | 12/1992 | (JP) . | |
| 5-67696 | 3/1993 | (JP) . | |
| 5-198946 | 8/1993 | (JP) . | |
| 5-299878 | 11/1993 | (JP) . | |
| 6-283866 | 10/1994 | (JP) | 29/830 |
| 7-99397 | 4/1995 | (JP) . | |
| 7-170079 | 7/1995 | (JP) . | |
| 8-78912 | 3/1996 | (JP) . | |
| 8-162559 | 6/1996 | (JP) . | |
| 8-204334 | 8/1996 | (JP) . | |
| 8-250827 | 9/1996 | (JP) . | |
| 8-316686 | 11/1996 | (JP) . | |
| 9-23067 | 1/1997 | (JP) . | |
| 9-162553 | 6/1997 | (JP) . | |
| 9-172243 | 6/1997 | (JP) . | |
| 9-191177 | 7/1997 | (JP) . | |

*Primary Examiner*—Carl J. Arbes
(74) *Attorney, Agent, or Firm*—Finnegan, Henderson, Farabow, Garrett & Dunner, L.L.P.

(57) ABSTRACT

A method for manufacturing multi-layered wiring board in which the positions of alignment marks are detected by irradiating a base material with X rays, and the position of the base material is corrected in accordance with the detected positions of the alignment marks. Then, the aligned base material is successively laminated upon another so as to improve the lamination accuracy. In the method, in addition, such a constitution is adopted that, when the laminating process is repeated twice or more, the position of each base material is corrected by offsetting the base material from the laminating position and the base material is laminated upon another base material at the laminating position by backing the base material to the laminating position. Namely, the positional displacement between the base materials to be laminated upon another is corrected by deciding the position of each base material against the preset optical axis of X rays. When such a constitution is adopted, a plurality of base materials can be laminated upon another with accuracy.

22 Claims, 36 Drawing Sheets

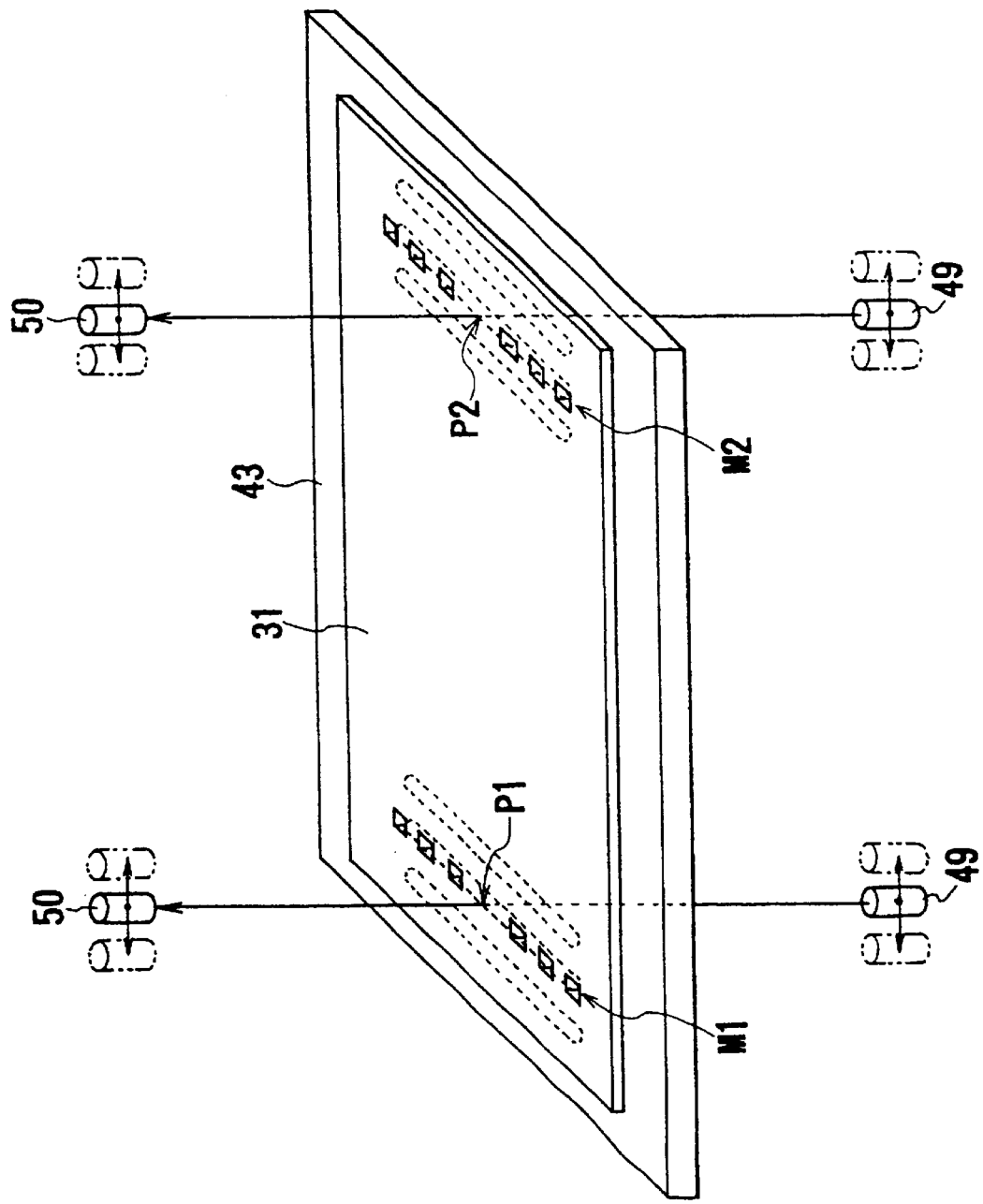

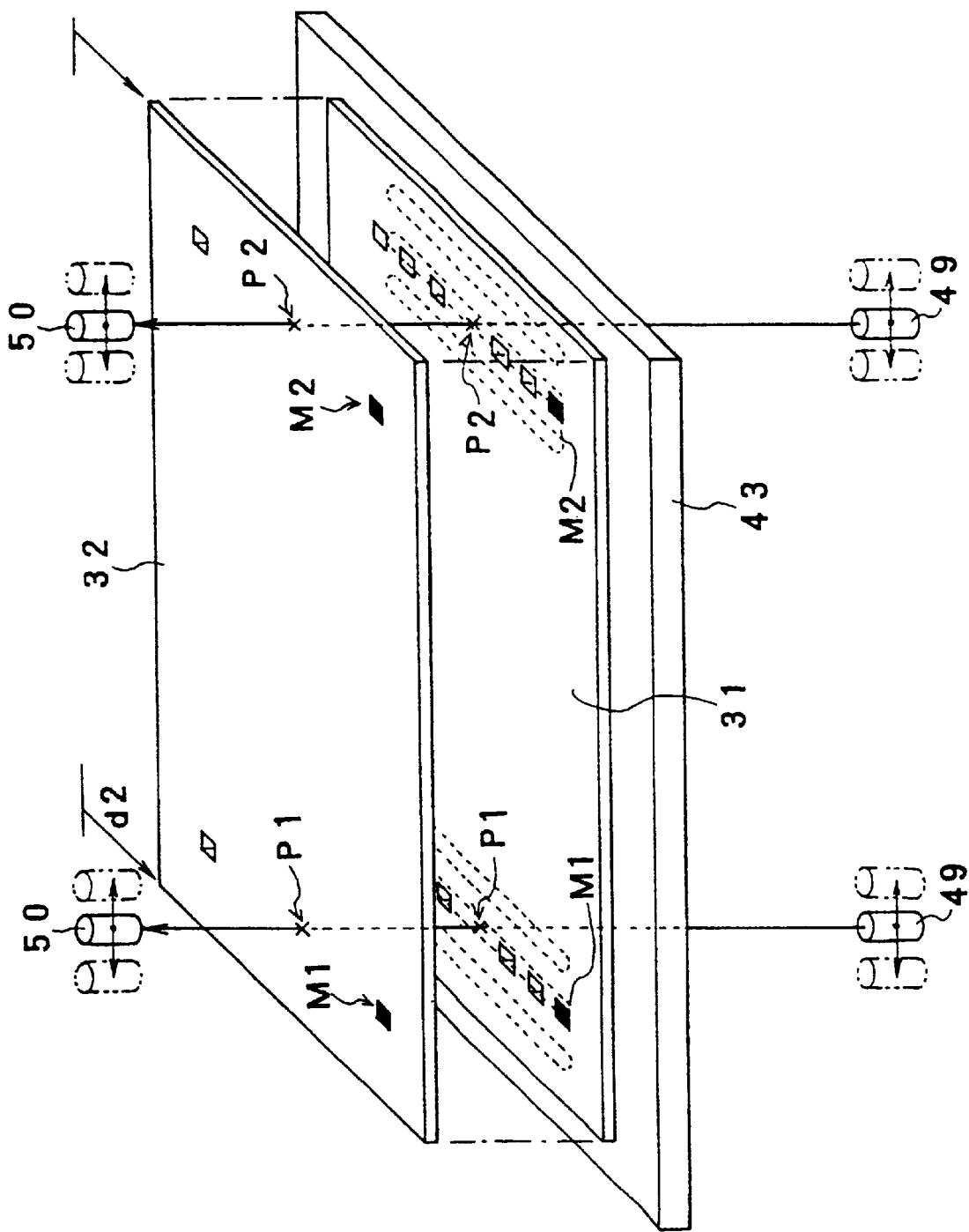

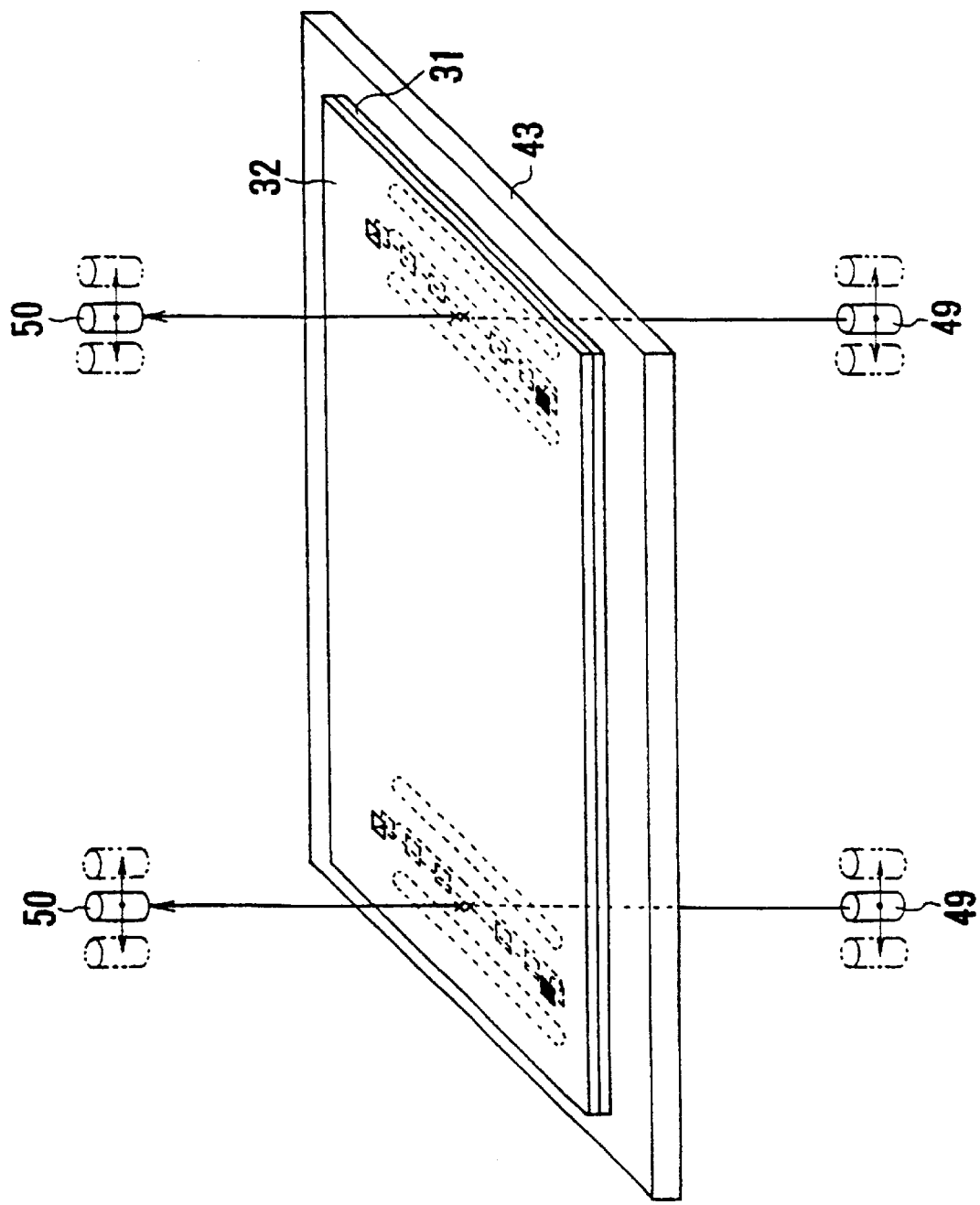

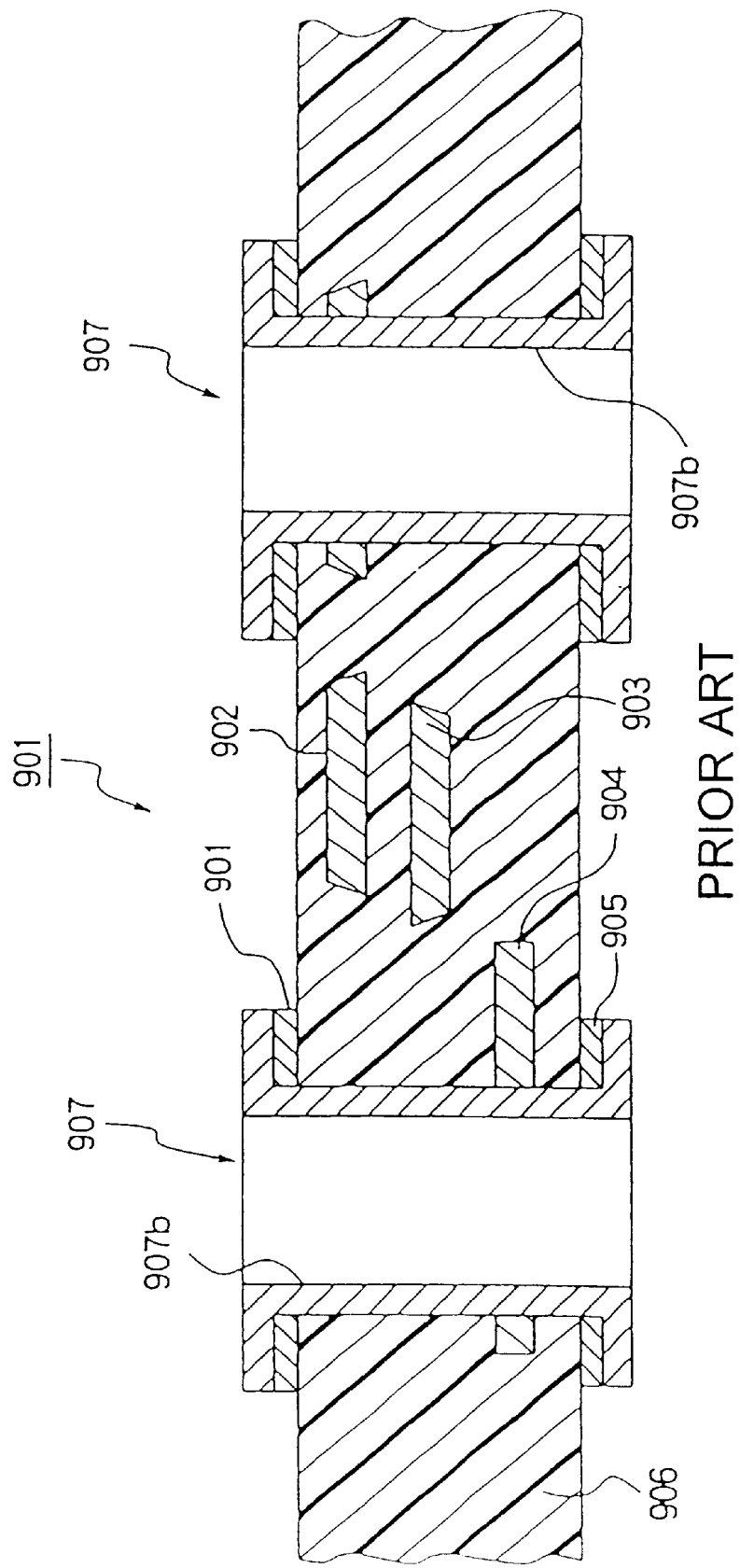

PRIOR ART

PRIOR ART

METHOD AND APPARATUS FOR MANUFACTURING MULTILAYERED WIRING BOARD AND MULTI-LAYERED WIRING BOARD

TECHNICAL FIELD

The present invention relates to an apparatus and method for manufacturing multi-layered wiring boards, particularly relates to an apparatus and method for laminating plural base materials comprising wiring layers and insulating layers.

Further, the present invention relates to an apparatus and method for manufacturing a multi-layered wiring board, in particular, relates to an apparatus and method that perform inter-layer connection among plural wiring layers using conductive pillars.

Furthermore, the present invention relates to a multi-layered wiring board, in particular relates to a multi-layered wiring board which can be laminated accurately with high productivity.

BACKGROUND ART

As various kinds of electronic instrument become smaller in size and higher in performance, a demand for higher electronic component packaging density is increasing. As for wiring boards, multi-layered wiring boards in which insulating layers and wiring layers are stacked alternately are widely used reflecting the demand. The multi-layered wiring boards respond to the demand for higher density and higher performance due to the multi-layered wiring structure. In the multi-layered wiring boards, the connection among wiring pattern layers is performed through via-connection or the like.

FIG. 28 is a cross sectional view showing an example of a cross section structure of an existing ordinary multi-layered wiring board. In this figure, a multi-layered wiring board 901, wiring circuits formed over five layers are connected by via-holes. Each of a first wiring circuit 901, a second wiring circuit 902, a third wiring circuit 903, a fourth wiring circuit 904 and a fifth wiring circuit 905 is formed respectively by patterning a conductor layer. Each wiring circuit of the respective layers is insulated each other by an insulating layer 906.

An existing ordinary method for manufacturing the multi-layered wiring boards as illustrated in FIG. 28 will be described. First, in order to perform interlayer connection between a double-sided laminate board prepared by adhering conductor layers such as copper foils on both surfaces of an insulating layer, through-hole 907 will be formed at a portion where the double-sided laminate is electrically connected. An inner wall surface of the through-hole 907 is plated by chemical plating, further, plating by electrical plating is given to enhance reliability of the interlayer connection by thickening the conductor layer 907b of the inner wall surface of the through-hole.

Next, the conductor layers on both surfaces are patterned with prescribed circuits using, for example, photo-etching etching method or the like.

Then, the patterned conductor layers are laminated thereon by insulating layers such as, for example, prepreg cloth or the like, further by conductor layer such as copper foil. Thereafter, they are heated and pressed to integrate into one body. The processes from the formation of the through-hole to the patterning of the circuit are repeated to obtain multi-layered structure.

The multi-layered wiring boards in which interlayer connection between wiring layers is made by using via-hole, have a problem that the multi-layered wiring boards are difficult to cope with high density packaging.

For example, in an ordinary way, in a region where a through-hole is disposed, wiring cannot be formed, and an electronic component cannot be disposed. Accordingly, attaining higher wiring density and higher packaging density are restricted. Further, as the packaging density of the electronic component goes up, the wiring density of the wiring board becomes higher in recent years. If diameters of the through-holes are made small to meet with such finer wiring patterns, there occurs a problem that reliability of the interlayer connection becomes difficult to secure.

In addition, the formation of connection between wiring layers by a through-hole involves through-hole formation process, plating process or the like, accordingly the manufacturing processes are redundant and are unfavorable from the viewpoint of productivity.

For example, the through-hole formation process is carried out by boring the through-holes one by one with a drill or the like. Accordingly, it takes long time for boring operation. Further, after boring a through-hole, polishing step is necessary for removing burrs. In addition, the through-holes are required to be formed with high positioning accuracy, and compatibility with plating has to be considered for the inner wall surface of the through-hole. Therefore, the accuracy of through-hole formation and management of formation condition become troublesome.

In addition, the plating process for obtaining electrical connection among plural wiring layers by through-holes requires a sophisticated process control such as concentration and temperature control of chemicals, or the like. Further, both the through-hole forming process and the plating process require large scale apparatus.

Such interlayer connection of a multi-layered wiring board by through-holes lowers productivity of printed wiring boards (PWB), accordingly, it is difficult to meet with the demand for cost reduction or the like.

To simplify the electrical connection between wiring layers of a multi-layered wiring board, a method is proposed in which the connection between wiring layers are made by conductive bumps. In this method, conductive bumps are formed at via-lands placed on the wiring circuits and formed for interlayer connections. By putting the conductive bumps through an interlayer insulating layer in the thickness direction, connection between via-lands formed on the opposing wiring layer is established.

FIG. 29A and FIG. 29B show an example of a method for manufacturing a multi-layered wiring board in which wiring layers are connected by conductive bumps described above.

First, a double-sided wiring board 913 in which wiring circuits 912 consisting of copper are formed on both surfaces of an insulating resin base material 911 consisting of, for example, paper-phenol system is prepared as an inner layer core. The wiring circuits 912 formed on both surfaces of the insulating resin base material 911 have via-lands 912a for interlayer connection. On these via-lands 912a, conductive bumps 914 formed by printing conductive paste, for example, are formed.

Next, an insulating resin sheet 915 of B stage (semi-cured state) and a copper foil 916 are laminated, and on both sides of the double-sided wiring board 913, the wiring circuits 912 and copper foil 916 are disposed facing oppositely through the insulating resin sheet 915 (FIG. 29A).

Thereafter, this laminate is pressed and heated. Thereby, the insulating resin sheets 915 of B stage are cured to form a board having all layers in one body. At this time, by pressing, the conductive bumps 914 is put through the insulating resin sheets 915 of B stage (semi-cured) and is connected with the copper foil 916 in a body while deforming plastically. Thus, connection between conductive layers by the conductive bump is formed.

Then, through-holes 917 are formed at prescribed positions, conductive material, for example, silver paste 918 is filled in this through-hole 917, or the conductive material such as, for example, silver paste is coated on the inner wall of the through-holes 917. Thereby, conductor layers on the external surfaces of the board are connected. The copper foils 916 of the external surfaces are patterned by, for example, a photo-etching method or the like to form prescribed wiring circuit 916b including via-lands 916a. Thereby, a multi-layered wiring board in which the conductive bumps and the through-holes are combined to form interlayer connection between the wiring circuits is formed (FIG. 29B).

FIG. 30A and FIG. 30B are diagrams showing another example of the method for manufacturing multi-layered wiring boards that are connected between the wiring layers by conductive bumps.

First, a double-sided wiring board 923 in which wiring circuits 922 are formed by laminating copper foils, curing and patterning on both surfaces of base material 921, for example, a glass cloth and an epoxy resin, is prepared as an inner layer core. The wiring circuits 922 formed on both surfaces of the double-sided wiring board 923 have via-lands 922a for interlayer connection.

On the other hand, copper foils 925 thereon conductive bumps 924 are formed, and prepregs 926 of epoxy resin system are prepared, respectively. The conductive bumps 924 are formed at the positions corresponding to the via-lands 922a when the copper foil 925 is laminated with the double-sided wiring board 923. Next, as shown in FIG. 30A, the copper foils 925, after being disposed on both sides of the double-sided wiring board 923 through the prepregs 926, pressed and heated to integrate all the layers. At this time, due to the pressing, the conductive bumps at the two sides are disposed oppositely. At this time, as a result of the pressing, the conductive bumps 924 are put through the prepregs 926 of B stage (semi-cured state), and are integrated and connected with the via-lands 922a while being formed plastically. Thus, connection between conductor layers by the conductive bumps is formed.

Next, through-holes 927 are formed at prescribed positions. To these through-holes 927, conductor layers 928 such as copper or the like, for example, are plated to connect between respective conductor layers.

Thereafter, the copper foils 925 of the external layers are patterned by, for example, photo-etching method or the like into prescribed wiring circuits 925b including via-lands 925a. Thereby, a multi-layered wiring board in which the conductive bumps and plated through-holes are combined to connect the interlayer of the wiring board is formed (FIG. 30B).

The interlayer wiring circuit connection adopting the conductive bumps mentioned above has advantages of simplicity in construction, high productivity due to small number of processing steps, and ability of replying demands for higher density packaging, or the like.

Now, in manufacturing the multi-layered wiring board described above, we must prepare base materials consisting of a laminate of a wiring layer (or a Cu foil) and an insulating resin layer. Accordingly, upon laminating a plurality of base materials, securing accuracy of their relative positions is an important technical point.

Even when the interlayer connection is performed by conductive pillars for example, and also when the interlayer connection is performed by through-holes or the like, the interlayer connection cannot be performed appropriately unless the accuracy of respective wiring layer positions is secured.

So far, upon laminating and positioning base materials constituting such a multi-layered wiring board, pin insertion mounting method and eyelet mounting method are generally used.

In the pin insertion mounting method, holes (guide holes) for positioning are disposed in advance at prescribed positions of base materials to be laminated. Stacking and laminating of base materials obtaining proper positioning of base materials are carried out by putting pins disposed on a stainless-steel plate mold (normally approximately 8 mm thick) through the holes of the base materials. Then, in a state in which each of the stacked plural base materials is kept its proper positioning, they are integrated to a laminate by pressing while heating through a mirror plate, for example. In the eyelet mounting method, the base materials are laminated by pressing while heating in a state in which the base materials are tentatively fixed by eyelets and holes for positioning described above.

However, manufacturing of the multi-layered wiring boards employing existing laminating method have following inconveniences.

First, in the pin insertion mounting method, the respective base material must be provided with guide holes. The providing with guide halls increases the processing step and lowers productivity. In addition, another problem of this method is that the resin such as prepreg or the like permeates into the guide holes formed for positioning. As the resin permeates, the base material tends to deform. Further, the pins for positioning and the guide holes are stuck solidly by the permeated resin to tend to induce displacement and surface damage. Further, another problem of this method has a difficulty in making the laminating step automatic.

On the other hand, the eyelet mounting method have a problem that the pressing cannot be uniform due to projected eyelet portions at a step of integrating base materials to a laminate by heating/pressing.

Further, the base materials (for example, prepreg or the like) constituting a multi-layered wiring board tend to cause displacement of positions upon boring guide holes, or tend to cause displacement of positions and deformation after pulling out the pins from positioning holes after carrying out integrating lamination, since the base materials usually tends to induce dimension variation due to heating/pressing. That is to say, when the base materials are constrained by the pins for positioning, free dimension variation in the surrounding is restricted, and the base materials cause distortion and non-uniform dimension variation due to stress of the base material caused by the pins. The dimension variation and distortion are likely to occur also when the pins are pulled out and the stress is released. Such distortion and dimension variation of the base materials as described above induce non-uniformity of the insulating resin layers constituting the interlayer insulating layers of the multi-layered wiring board, resulting in deterioration of reliability of the interlayer insulation.

The distortion or dimension variation of the base materials means change in pitch or deformation of the guide holes formed on the base material. When lamination of the base material is required to perform in plural steps, different guide holes are required for every step of lamination. Accordingly there is a problem that the manufacturing productivity of the multi-layered wiring boards is remarkably lowered. Metallic molds and pressing plates are necessary to prepare in plural kinds for manufacturing a definite multi-layered wiring boards, giving rise to an increase of manufacturing cost and a reduction of effective area for formation of wiring pattern due to an increase of area for the guide holes.

As described above, the conventional technology has a problem that there is a difficulty in laminating plural base materials with high accuracy and high productivity in producing multi-layered wiring boards. The problem becomes remarkable as the scale down of wiring pattern is advanced, number of laminating is increased, or total thickness is reduced. Particularly in recent years the scale down of wiring pattern is remarkable since wiring boards are required to reply to the demand for higher integration of electronic components and various kinds of electronic instruments. Accordingly, establishment of a technology that enables manufacturing wiring boards of high accuracy with high productivity is demanded. Here, the accuracy of laminating plural base materials and the accuracy of interlayer connections are directly related to the reliability of the wiring board.

The present invention is carried out to solve the problem described above.

That is, an object of the present invention is to provide a method and an apparatus for manufacturing multi-layered wiring boards that enables to manufacture multi-layered wiring boards of high accuracy with high productivity.

Another object of the present invention is to provide multi-layered wiring boards having a structure that enables to perform the interlayer connection of high accuracy. Still another object of the present invention is to provide multi-layered wiring boards having a structure that enables to manufacture them with high productivity.

DISCLOSURE OF THE INVENTION

In order to solve the problem described above, the present invention adopts the following constitution. A method of the present invention for manufacturing a multi-layered wiring board by laminating base materials disposed thereon electrically conductive alignment marks comprises a step of detecting the position of an alignment mark by irradiating an X ray onto a base material, and a step of correcting the position of the base material based on the detected position of the alignment mark.

In addition, the step of detecting the position of the alignment mark and the step of correcting the position of the base material are preferably carried out by offsetting from the position of laminating the base material to prevent from a deterioration of accuracy due to overlapping of alignment marks.

An apparatus of the present invention for manufacturing a multi-layered wiring board by laminating base materials disposed thereon an electrically conductive alignment marks comprises;

(a) a step of feeding a base material by a first offset amount in a first direction perpendicular to a normal line direction of the base material, (b) a step of detecting displacement of the alignment mark from an X ray optical axis by irradiating the X ray in a direction along a normal line of the base material onto the base material and;

(c) a step of correcting the position of the base material based on the detected displacement; and (d) a step of backing the base material by the first offset amount in a second direction opposite to the first direction.

The method may further comprises, (e) a step of transporting the base material in a direction along a normal line of the base material and stacking with another base material.

Further, a method of the present invention for manufacturing a multi-layered wiring board by laminating base materials disposed thereon an electrically conductive alignment mark comprises;

(a) a step of holding a base material on a first surface of a first holding means having a flat first surface;

(b) a step of irradiating an X ray in a direction along a normal line of the first surface;

(c) a step of feeding the first holding means in a first direction by a first offset amount up to a position where the alignment mark is irradiated by the X ray;

(d) a step of detecting the alignment mark displacement from the optical axis of the X ray;

(e) a step of correcting the position of the first holding means based on the detected displacement; and (f) a step of backing the first holding means by the first offset amount in a second direction opposite to the first direction, and may further comprises, (g) a step of stacking the base material on a second surface of a second holding means that has the second surface opposing to the first surface of the first holding means.

Further, a method of the present invention for manufacturing a multi-layered wiring board by laminating a first base material of an insulating resin layer in a semi-cured state laminated with a conductor layer and second base material, comprises a step of disposing the first base material on a second surface of a second holding means; a step of coating solder on the first surface of the first base material; a step of disposing the second base material on the first surface of the first base material; and a step of fixing the first base material by melting the solder and the second base material.

In this method for manufacturing the multi-layered wiring board, the step of disposing the first base material on the second surface of the second holding means may comprises a step of holding the first base material on a first surface of a first holding means having a flat first surface; a step of feeding the first holding means by a first offset amount in a first direction a step of detecting a displacement of the alignment mark from the optical axis of an X ray by irradiating the X ray in a direction along a normal line of the first surface and a step of correcting the position of the first holding means based on the detected displacement a step of backing the first holding means by the first offset amount to a second direction opposite to the first direction; and a step of holding the first base material on the second surface of the second holding means.

Similarly, the step of disposing the second base material on the first surface of the first base material may further comprises a step of holding the second base material on the first surface of the first holding means having a flat first surface; a step of feeding the first holding means by a second offset amount in a first direction; a step of detecting a displacement of the alignment mark from an optical axis of an X ray by irradiating the X ray in a direction along a normal line of the first surface and; a step of correcting the position of the first holding means in accordance with the detected displacement; a step of backing the first holding means the second offset amount in a second direction opposite to the first direction; and a step of stacking the second base material to the first surface of the second base material.

Further, the method for manufacturing multi-layered wiring boards may further comprises a step of curing the insulating resin layer by pressing and heating the soldered first base material and second base material.

An apparatus of the present invention for manufacturing a multi-layered wiring board laminating base materials disposed thereon an electrically conductive alignment mark comprises a detecting means for detecting an alignment mark by irradiating an X ray onto an base material; and a correcting means for correcting the position of the base material based on the detected positions of the alignment mark.

The apparatus further comprises a offsetting means for offsetting the base material corrected its position; and a stacking means for stacking the offset base material to other sheet material.

Further, an apparatus of the present invention for manufacturing a wiring board laminating base materials disposed thereon electrically conductive alignment marks, comprises a first holding means having a flat first surface for holding a base material; a irradiating means for irradiating X rays in a direction along a normal line of the first surface; a transporting means for transporting the first holding means that keeps the normal direction of the first surface parallel to the optical axis of the X rays; a detecting means disposed opposed to the X ray source for detecting the aligned mark displacement from the optical axis of the X ray by measuring the irradiated X ray; and a correcting means for correcting the position of the first holding means based on the detected displacement.

Further, the irradiating means are preferably disposed at least in a pair. Plural irradiating means can enhance the accuracy of the positioning.

Further, the first holding means may comprise at least a pair of slits disposed in parallel.

Further, the transporting means may comprise a means for transporting the first holding means in parallel by a first offset amount in a first direction, and transporting the first holding means in parallel by the first offset amount in a second direction opposite to the first direction.

The transporting means may further comprise a means for transporting the first holding means in parallel to the direction along a normal line of the first surface.

Further, the correcting means may correct the position of the first holding means to make the displacement becomes minimum.

For performing the correction, the correcting means can correct by transporting in parallel or rotating the first holding means based on the detected displacement to make the first surface kept perpendicular to the optical axis of the X rays.

Further, the detecting means may have an image sensor of which center of the imaging field coincides with the optical axis of the X rays. Then, the correcting means comprises a mechanism for bringing the center of the alignment mark to the viewing field center of the image sensor. Further, when the irradiating means comprises irradiating mechanisms disposed at least in a pair, the correcting means can perform its function by minimizing displacement of the center of the alignment mark and displacement of the viewing field center of the image sensor so that the respective displacements are equalized.

A multi-layered wiring board of the present invention comprises a rectangular base material having a first area and a second area; a wiring pattern disposed on the first area of the base material; an interlayer connection, disposed on the wiring pattern, consisting of conductive resin; and alignment marks consisting of the conductive resin and disposed in row on the second area of the base material in parallel with shorter sides of the base material.

As the alignment mark, a conductive pillar having an approximately conical shape conical conductive pillar, through-hole, IVH, conductor pattern patterned wiring layer, or the like may be employed for example. The alignment marks may be disposed independent from the wiring pattern, or may be disposed as a part of the wiring pattern.

That is, the present invention, upon manufacturing multi-layered wiring boards, detects positions of alignment marks by irradiating X rays on a base material, and corrects the position of the base material based on the detected position of the alignment marks. The base materials that went through the positioning are laminated in turn, resulting in improvement of laminating accuracy.

When the laminating step is repeated two or more times, the alignment marks are sequentially stacked onto one alignment mark. Then the overlapping of plural alignment marks deteriorates the lamination accuracy. Accordingly, in the present invention, the base material is offset from the position for laminating and is corrected the position, thereafter the base material is backed by the displacement amount and is laminated there. The positioning among the base materials being laminated are performed by determine the respective base material position with reference to the predetermined optical axis of an X ray.

For example, the base material is fed from the actual position for laminating to a offset position, is corrected its displacement at the position by irradiating an X ray onto the base material, thereafter, the base material is backed by the displacement amount and can be laminated there. By adopting such a constitution, positioning among the base materials becomes unnecessary to overlap the subsequent alignment mark to the alignment marks already stacked by plural layers even when the step of lamination is repeated plural times. Therefore, the lamination accuracy is enhanced, and multi-layered wiring boards of high accuracy and high reliability in interlayer connection can be provided.

The displacement of the feed and the back can be performed for example, by transporting the base material by a first displacement amount in a first direction perpendicular to a normal line direction of a main surface of the base material, and back the base material by a first displacement amount in a second direction opposite to the first direction. Further, the displacement may be performed by a transport system, for example, capable of parallel motion and rotating motion in a same plane. Upon performing the offsetting step the accuracy of the transporting the base material for offsetting is required to be sufficiently high compared with the accuracy of the initial position of the base material.

The method for manufacturing multi-layered wiring boards of the present invention corrects the position of base materials being laminated by the aforementioned method to laminate sequentially. At this time, a plurality of base materials may be stacked through metallic material or alloy material of relatively low melting point such as solder.

For example, before the first base material is disposed and the second base material is stacked on the first base material, solder is coated on a partial area of the first base material. This coated area can be heated using a heating bar or the like to melt the solder and, through solidification thereof, the first base material and the second base material can be fixed. By fixing the first base material and the second base material by the solder, positional displacement liable to occur when the whole of the first base material and second base material are cured by heating and pressing the prepreg of semi-cured state, can be prevented and improvement of accuracy of the multi-layered wiring boards can be obtained. In addition, the productivity can be improved.

The aforementioned alignment marks and solder coated areas are preferably disposed on the peripheral region of the base material.

When two alignment marks are disposed on a base material, positioning can be performed with higher accuracy as the distance between the two alignment marks is larger. Accordingly, the alignment marks can be preferably disposed along opposing two short sides of the base material when the base material to be laminated being rectangular. Similarly, the solders that fix temporarily the base materials are also preferably disposed distant as far as possible on plural zones.

In this invention, the alignment marks are required to comprise material that can scatter at least a part of an irradiated X ray since the position of the alignment mark is detected by irradiating an X ray on the base material.

The alignment mark described above may employ a part of wiring pattern or dedicated alignment marks may be disposed. Even when the dedicated alignment mark is disposed, the alignment marks can be formed simultaneous step with the patterning of the wiring pattern, or simultaneous step with formation of conductive pillars for interlayer connection, for example. That is also preferable from the viewpoint of productivity.

As wiring layer constituting a multi-layered wiring board of the present invention, metallic materials that can be used as wiring materials including copper and aluminum can be employed. Further, conductive resins can be employed. Wiring layers having wiring circuits having prescribed pattern and alignment marks can be formed by patterning the conductive layer using photo-etching method, or by printing conductive resin using screen printing method.

The conductive pillars that are used for interlayer connection of the multi-layered wiring board of the present invention may be composed of the conductive composite such as conductive resin, conductive paste or the like. In addition, the conductive pillars may be composed of a various kinds of metallic materials. This conductive pillar may be employed as the alignment mark; alternatively the alignment mark may be employed as the conductive pillar.

Here, as the conductive composite, a conductive resin can be cited. The conductive resin is obtained by mixing or dispersing conductive powder or conductive fine particles such as Ag, Au, Cu, solder powder or the like as filler in a binder consisting of a resin material. The conductive material may use a plurality of metals or alloys by combining them.

As the resin of binder component, for example, thermoplastic resin such as polycarbonate resin, polysulfone resin, polyester resin, phenoxy resin or the like, thermosetting resin such as phenolic resin, polyimide resin, epoxy resin or the like can be generally cited. Other than these, ultra-violet light curing resins or electron beam curing resins such as, for example, acrylic acid esters such as methyl methacrylate, diethyl methyl methacrylate, trimethylol propane triacrylate, diethylene glycol diethyl acrylate, acrylic acid methyl, acrylic acid ethyl, acrylic acid diethylene glycol ethoxylate, acrylate of ε-caprolactam denatured dipentaerythritol, or methacrylic acid ester can be cited. In addition, as need arises, solvent may be employed.

The conductive pillars with such conductive resins can be formed by using a screen printing method with a mask such as a metallic mask, for example. The conductive pillars can be formed in a desired form by controlling shape, aperture of opening, and thickness of the metallic mask on one hand, and controlling the physical properties such as viscosity, thixotropy, and surface tension of the conductive resin layer, or surface tension of the mask controlled on the other hand. In order to control the shape of the conductive pillars, the viscosity of the conductive resin is preferably adjusted in a broader range than that of the normally used conductive resin layer. Further, a conductive resin having thixotropy may be applied controlling the conductive resin thixotropy by using for example, ultra-sonic vibration.

The conductive resin thus filled in the holes of the mask, by separating the mask and the conductor layer in the normal direction of the conductor layer, deforms while being pulled between the conductor layer and the metallic mask, to form the conductive pillars of approximate conic shape on the conductor layer. Using such a method, the conductive pillars of which angle of contact θ with a surface of the conductor layer is small, and that has a connection shape alleviating notch effect can be obtained.

Further, if the conductive pillars of high aspect ratio are needed, for example, the shape of the mask hole, physical properties of the conductive resin or the like may be controlled, or with the mask re-disposed at the same position, the screen-printing may be repeated.

Further, the conductive pillars, without restricting to the screen-printing method, may be formed using a stamping method that pushes out the conductive paste of the holes of the mask. With such method too, similarly with the screen-printing method, the conductive pillars of high aspect ratio can be formed from the conductive paste, conductive resin or the like. With a plating method or the like, the conductive pillars consisting of metal may be formed.

The conductive pillars may be formed on the conductor layer such as copper foil, or on patterned wiring layer. Further, they may also be formed on electrode of an electronic component such as a semiconductor element.

Further, the conductive pillars are formed on synthetic resin sheets (for example, fluoride resin such as polyvinylidene fluoride) that are excellent in, for example, stripping property, thus formed conductive pillars are filled in insulating resin layer of semi-cured state, and the bottom surface thereof and copper foil or the wiring layer may be pressed to stick.

Incidentally, the use of the conductive pillars is not restricted to the interlayer connection of multi-layered wiring board. For example, the conductive pillars can be formed on electrode of an electronic component such as a semiconductor element to connect the electronic component and the wiring circuit thereon the electronic component is being mounted.

As insulating layer that constitutes a multi-layered wiring board of the present invention and separates electrically between the wiring layers that are connected by the conductive pillars, for example, generally used insulating resin materials can be used. The thickness can be set according to needs, and may be set in the range of approximately from 40 to 800 μm. Further, the thickness of the insulating layers may be set together with the height of the conductive pillars.

Here, as thermoplastic resin materials that can be employed as the insulating layer, for example, polycarbonate resin, polysulfone resin, thermoplastic polyimide resin, polytetrafluoroethylene resin, hexafluoropolypropylene resin, polyetheretherketone resin, or the like can be cited. These insulating resin materials may be employed in sheet form.

Further, as thermosetting resin materials, for example, epoxy resin, bismaleimide-triazine resin, polyimide resin, phenolic resin, polyester resin, melamine resin, or butadiene rubber, butyl rubber or the like can be cited. Further, as thermosetting resin materials, the sheet kind of crude rubber such as natural rubber, neoprene rubber, silicone rubber or the like can be employed.

These insulating resin materials may be used alone, or may be filled by insulating inorganic substances or organic substances. Further, they can be employed combined with reinforcement materials such as glass cloth or matte, synthetic fiber sheet or matte, or paper.

BRIEF DESCRIPTION OF DRAWINGS

FIG. 8A, FIG. 8B, FIG. 8C and FIG. 8D are diagrams for describing an example of operation of a apparatus for manufacturing multi-layered wiring boards of the present invention;

FIG. 28 is a cross section showing an example of a cross setional structure of a general multi-layered wiring board;

BEST MODE FOR CARRYING OUT THE INVENTION (Embodiment 1)

A multi-layered wiring board thereto the present invention is applicable will be described.

Figure 1:
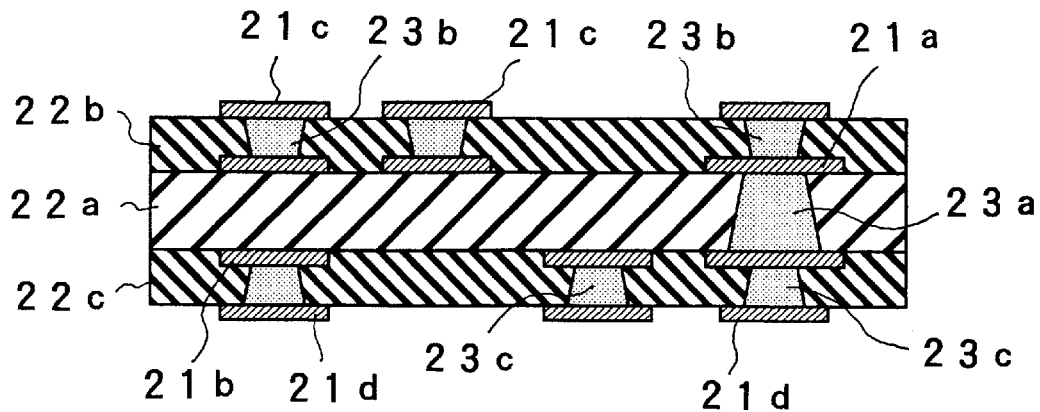
FIG. 1 is a diagram showing schematically an example of a structure of a multi-layered wiring board therein interlayer connection is performed with conductive pillars.

FIG. 1 is a diagram showing schematically an example of a structure of a multi-layered wiring board therein interlayer connection is carried out with a conductive pillar.

This multi-layered wiring board has four layers of wiring layer, and there are disposed via-lands 21a, 21b, 21c and 21d forming a part of the wiring layers. The respective wiring layers are insulated each other by insulating resin layers 22a, 22b, and 22c such as, for example, prepreg. The conductive pillars 23a, 23b, and 23c are threaded the insulating resin layers 22a, 22b and 22c to connect via-lands 21a, 21b, 21c and 21d of the respective wiring layers.

Figure 2A:
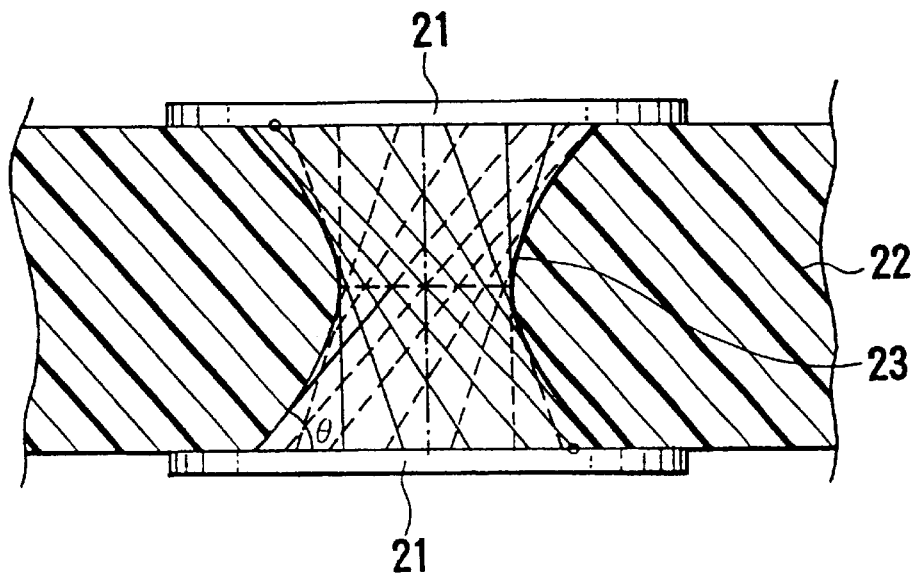
FIG. 2A is a diagram showing schematically a cross-sectional structure of interlayer connection of a multi-layered wiring board of the present invention.
Figure 2B:
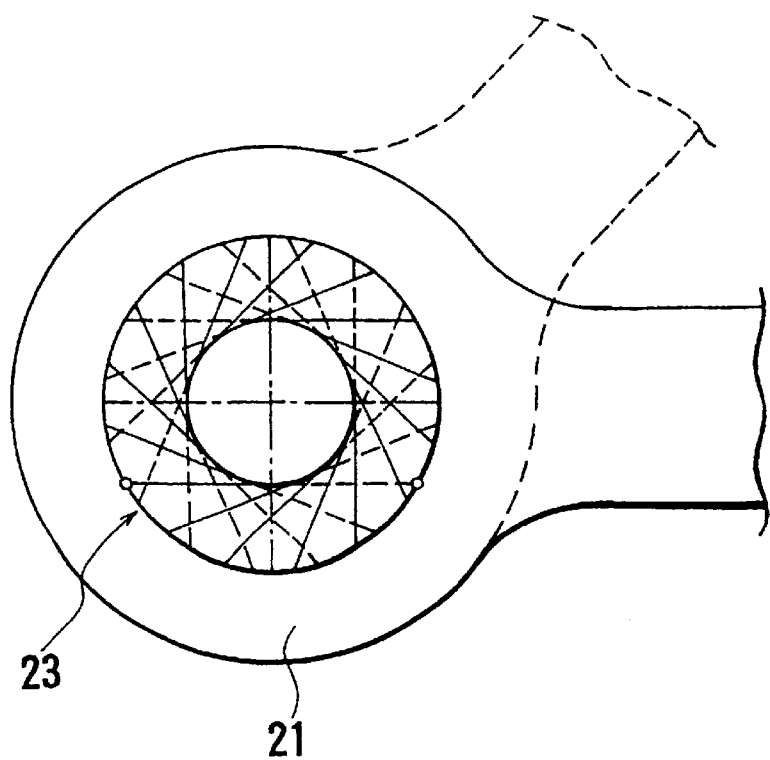
FIG. 2B is a diagram showing schematically a structure of the interlayer connection shown in FIG. 2A by seeing in perspective manner from an axial direction of a conductive pillar.
Figure 2C:
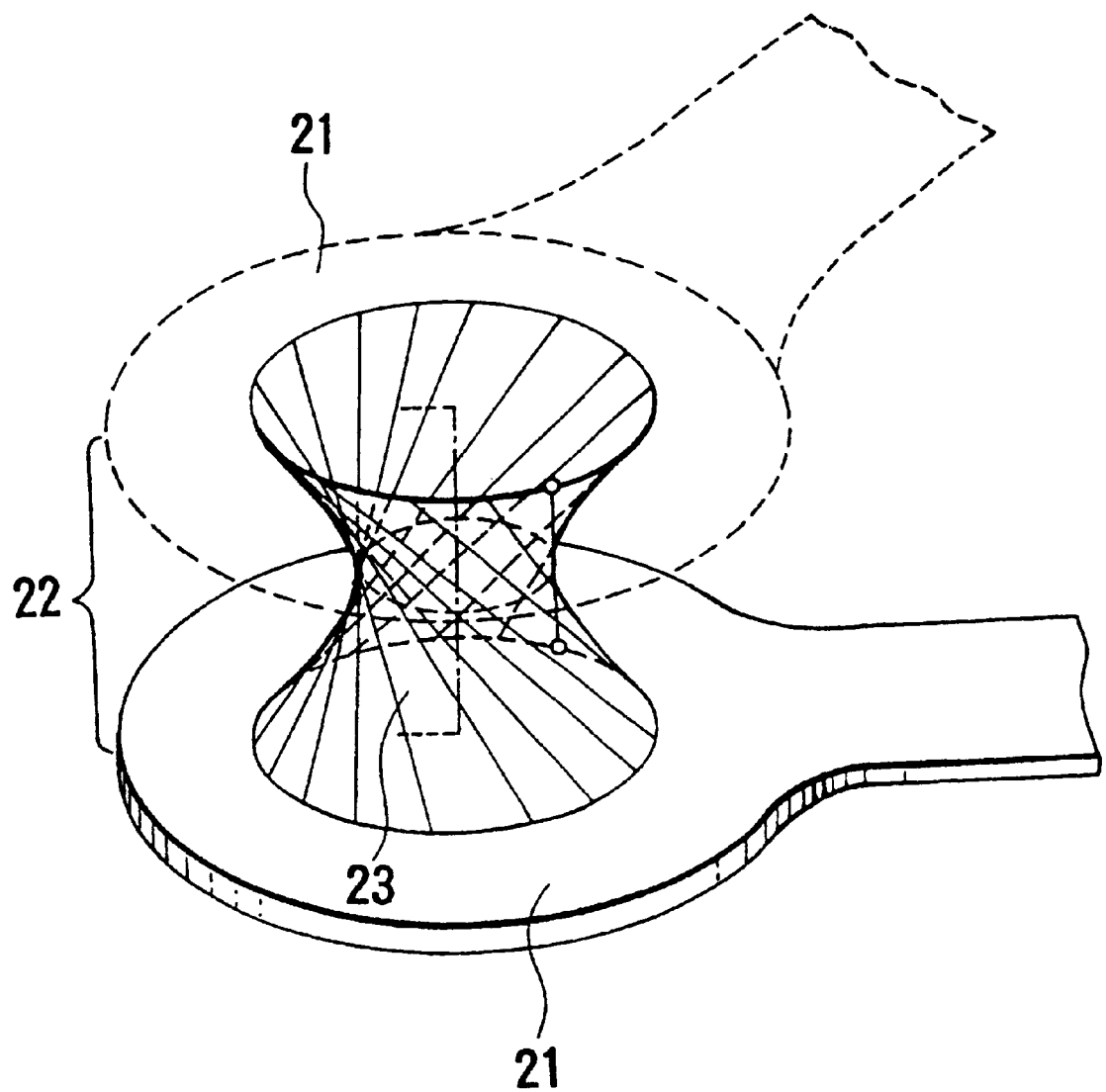
FIG. 2C is a perspective view showing schematically the structure of the multi-layered wiring board shown in FIG. 2A.

FIG. 2A is a diagram showing schematically a cross sectional structure of an interlayer connection of a multi-layered wiring board of the present invention. FIG. 2B is a perspective view seen from an axial direction of a conductive pillar showing schematically a structure of the interlayer connection shown in FIG. 2A, and FIG. 2C is a perspective view showing schematically the structure of the interlayer connection shown in FIG. 2A.

Incidentally, in this example, a four layer board that has four wiring layers is illustrated, however layer number of the wiring layer is not restricted to this number, and may be further increased to such multi-layer as, for example, six layers, eight layers and so on.

Figure 3:
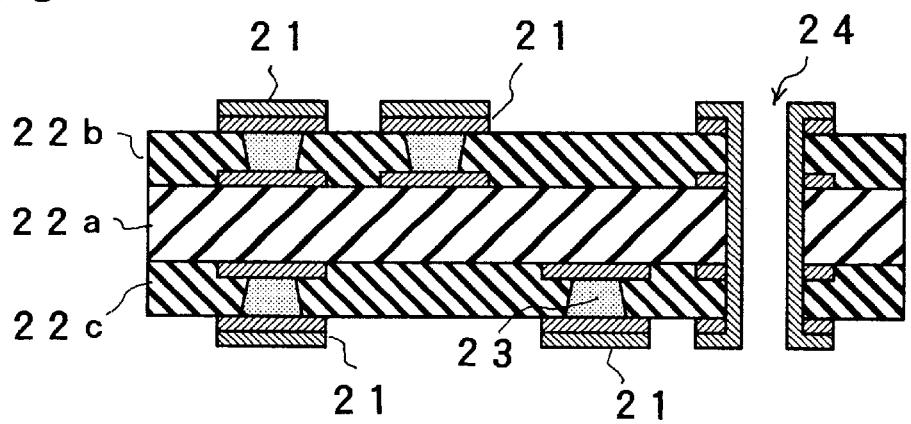
FIG. 3 is a diagram schematically showing an example of a structure of a multi-layered wiring board therein interlayer connection is performed with a combination of conductive pillar 23 and through-hole 24.

FIG. 3 is a diagram showing schematically an example of a structure of a multi-layered wiring board that is connected between layers with a combination of conductive pillars 23 and a through-hole 24.

Figure 4:
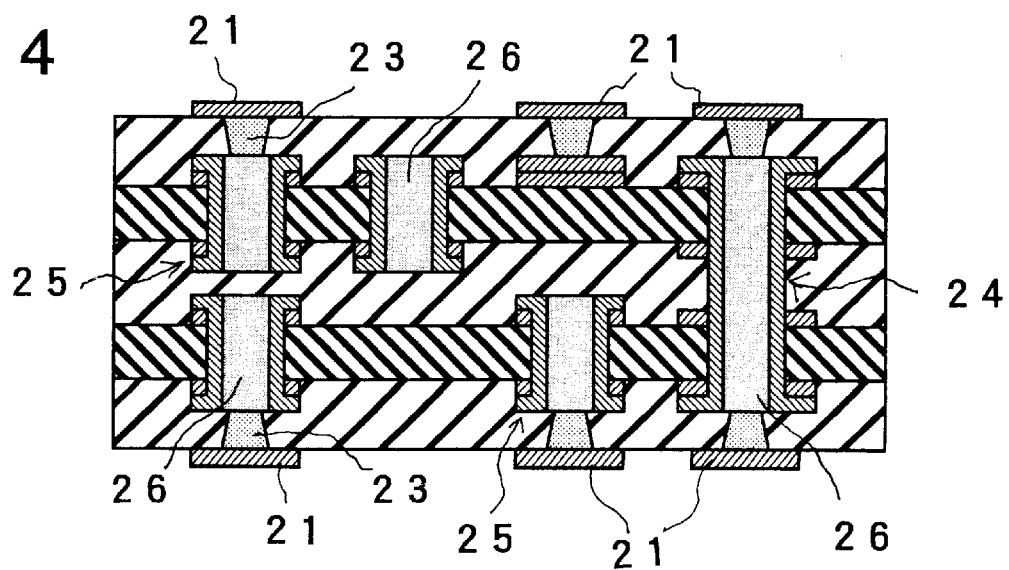
FIG. 4 is a diagram schematically showing an example of a structure of a multi-layered wiring board therein interlayer connection is established using a combination of conductive pillar 23 and through-hole 24 and IVH 25.

FIG. 4 is a diagram showing schematically an example of a structure of a multi-layered wiring board that established interlayer connection with a combination of conductive pillars 23 and through-holes 24 and IVHs 25. In this multi-layered wiring board, outside of core layers where conductive resin 26 is filled in holes of the through-holes 24 or IVHs 25, external layers are disposed to the core layers to perform interlayer connection using the conductive pillars 23.

There are various kinds of structures for the multi-layered wiring board thereto the conductive pillars are employed like this, the present invention can be applied without depending on the constitution of the multi-layered wiring board. For the aforementioned diverse manufacturing methods of the multi-layered wiring boards, there are common features and specific features for the respective structures, however, in the following description, the multi-layered wiring boards all of which interlayer connection is performed with the conductive pillars will be illustrated.

Figure 5:
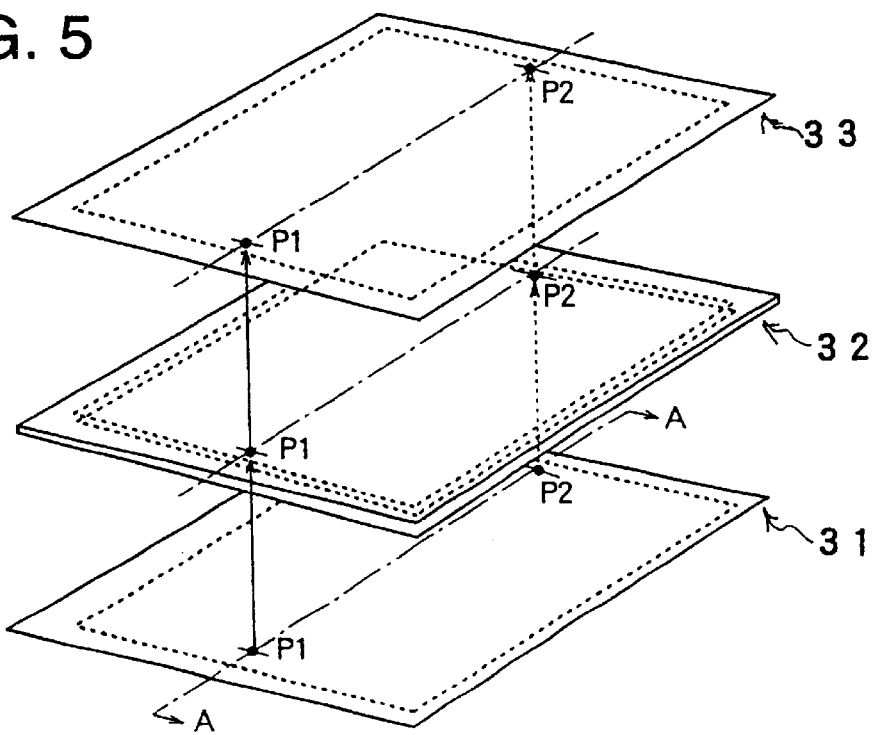
FIG. 5, FIG. 6A and FIG. 6B are diagrams for describing a principle of a apparatus for manufacturing multi-layered wiring boards of the present invention.
Figure 6A:
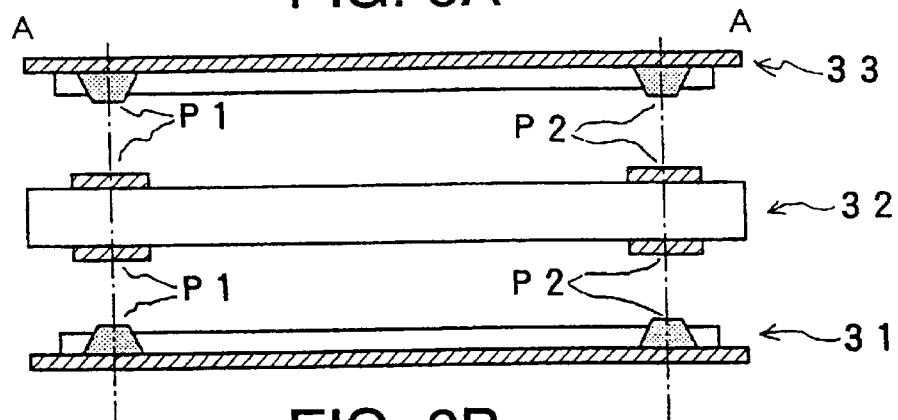
Figure 6B:
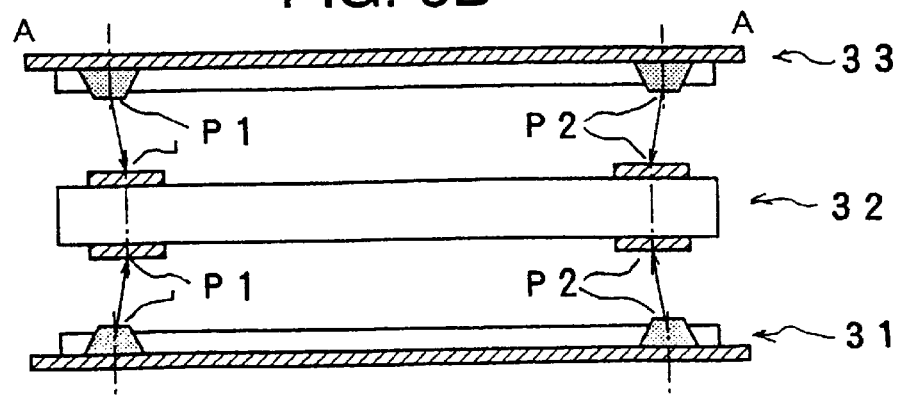

FIG. 5, FIG. 6A and FIG. 6B are diagrams for explaining a principle of a apparatus for manufacturing multi-layered wiring boards of the present invention. FIG. 6A and FIG. 6B show a cross section of AA direction of FIG. 5.

In this example, three sheet shaped base materials are laminated to prepare a multi-layered wiring board having four layers of wiring layer. Here, a base material 32 having wiring layers on both surfaces thereof is a core material, and on the external layer thereof base materials 31 and 33 consisting of an insulating resin layer of semi-cured state and a copper foil are laminated as the external layer materials. The situation where the core material and external layer materials are laminated is shown.

As shown in FIG. 5, to the respective base materials, alignment points P1 and P2 are determined in advance, and after lay up (operation of laminating the respective base materials while aligning to connect tentatively) of the respective base materials, the respective base materials are integrated by a press machine to form a multi-layered body. Incidentally, to these alignment points, the alignment marks are not required to dispose. Namely, these alignment points may be virtual alignment points.

As shown in FIG. 6A, for example, over a plurality of base materials, the respective alignment points P1 and P2 are aligned, thereby positional relation between the wiring patterns formed on the respective base materials and the conductive pillars for connecting the layers can be made the most approached to the ideal constitution. However, the distances between the alignment points P1 and P2 disposed on the respective base materials are not necessarily same actually. In such a case, as shown in FIG. 6B, the alignment points P1 and P2 are equalized according to proportional distribution, that is, are aligned so that the displacements are equalized and minimized.

To perform lay up (stack) of the base materials following this fundamental principle, for example, a manufacturing apparatus that will be described later may be employed. In the present invention, the alignment marks are detected by irradiating X rays (including soft X rays) onto the base materials, and the respective base materials, thereafter the displacements of the alignment points P1 and P2 of the respective base materials are aligned to be are equalized and minimized. For the position detection of the alignment marks, for example, a mark position recognition function (function to recognize marks by a position detection means consisting of an X-ray generator and an X-ray detector and to calculate a center of the marks) can be provided with.

Now, as described above, for example, as illustrated in FIG. 6A and FIG. 6B, when the respective base materials are disposed as the respective alignment points P1 and P2 dictate, the following inconvenience occurs. That is, in the case of, after the lay up of the base materials 31 and 32, the base material 33 being tried to lay up further, upon recognizing the positions of the alignment points P1 and P2 of the base material 32, the respective alignment marks of the base materials 31 and 32 therefor the alignment is already over overlap. In this state, the X rays are irradiated, resulting in deterioration of accuracy.

In the present invention, the alignment marks are disposed at positions that are offset from the alignment points P1 and P2. Thereby, such a problem is solved. The direction of offsetting may be any direction, however, the alignment marks may be offset, for example, in a direction perpendicular with respect to a straight line combining the alignment points P1 and P2.

(Embodiment 2)

Figure 7:
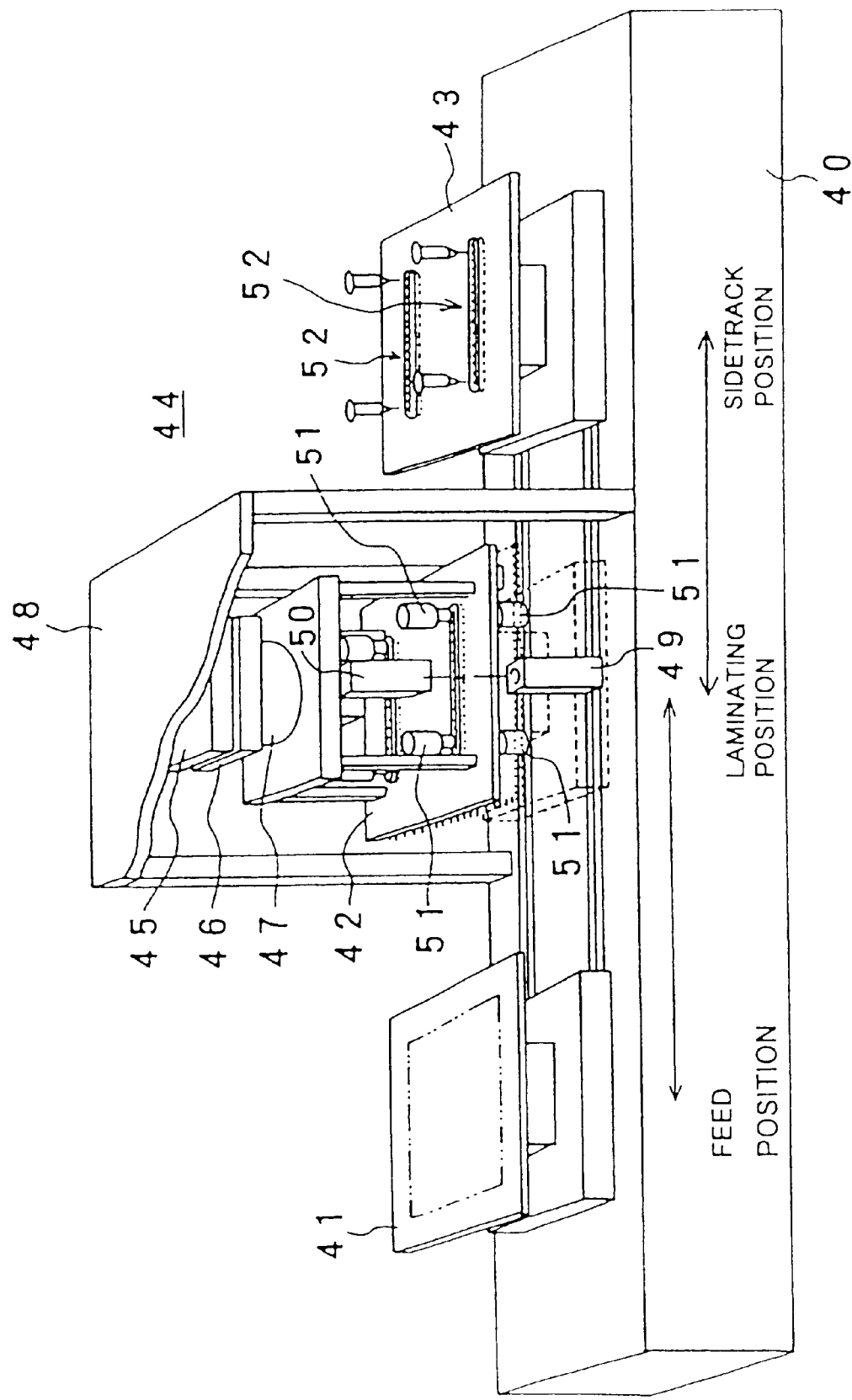
FIG. 7 is a diagram showing an example of a constitution of a apparatus for manufacturing multi-layered wiring boards of the present invention.

FIG. 7 is a diagram showing an example of a constitution of a apparatus for manufacturing multi-layered wiring boards of the present invention.

This manufacturing apparatus comprises, on a base 40, a feed table 41 for feeding a base material (called as a work), a position correction table 42 (the first holding means) for determining relative positions of base materials when the base materials are laminated, and a laminating table 43. The feed table 41 is a table for delivering a fed base material to the position correction table 42, and the laminating table is a table (the second holding means) for piling up the base materials aligned at the position correction table 42 to laminate.

The feed table 41 comprises a fixing means such as a vaccuum chuck, for example, that receives and fixes the base materials, an up and down driving mechanism for raising and lowering the table, and a movement system between two points for moving between two positions of a feed position and a laminating position of the base materials.

The position correction table 42 also comprises a fixing means such as, for example, a vacuum chuck for receiving and fixing the base materials, and thereon two grooves 44 (slit) for transmitting X rays are disposed. The grooves 44 need only be disposed according to the number of X-ray generators. Here, an example in which at least a pair of alignment marks is disposed on the respective base materials is shown. Therefore, two grooves 44 are formed.

The position correction table 42 is held by an X-axis movement mechanism 45, Y-axis movement mechanism 46, and θ-axis movement mechanism 47 while being suspended from a frame 48. Here, the X-axis movement mechanism 45, Y-axis movement mechanism 46, and θ-axis movement mechanism 47 move in an X-axis direction, Y-axis direction and θ-axis (rotation) direction controlling accurately amount of movement. The position correction table 42 further comprises a driving up and down mechanism keeping a normal line direction of the table surface constant.

Two sets of optical systems each system consisting of light source 49 and an image sensor 50 obtaining two-dimensional image by receiving the X ray being opposed to the light source through the position correction table 42. Incidentally, these X-ray optical systems have optical axes parallel to a normal line direction of the main surface of the position correction table 42. These optical axis are placed to conform to the virtual alignment points P1 and P2 of the base material as much as possible as the base material to be stacked is held at a prescribed position of the position correction table 42.

Furthermore, four pairs of heating bars 51 are disposed oppositely putting the position correction table 42 between the opposing bars. The heating bars 51 melt solder coated on the base material at a side track position. It is only necessary for the heating bars 51 to be disposed to areas such as periphery area of the base material corresponding to the areas where the base materials thereon the solder are coated are laminated to fix.

The laminating table 43 also has a fixing means such as a vacuum chuck for receiving and fixing the base material, and further has two grooves 52 (slit) for transmitting X rays. In addition, the laminating table 43 further has a mechanism for driving up and down the table, and a mechanism for moving between two points of the laminating position of the base material and the side track position of the base material.

In addition, at the side track position of the laminating table 43, solder feeding devices 52 for coating such as paste solder on the connecting areas of each base material are disposed.

(Embodiment 3)

Next, operation of an apparatus of the present invention for manufacturing multi-layered wiring board illustrated in FIG. 7 will be described.

Here, in this example, three sheet shaped base materials 31, 32 and 33 are laminated sequentially. (The base materials 31 and 32 are external layer materials for example, and the base material 33 is a core material for example).

FIG. 8A, FIG. 8B, FIG. 8C, and FIG. 8D are diagrams for describing an example of operation of a apparatus for manufacturing multi-layered wiring boards of the present invention. For simplicity, in FIG. 8A, FIG. 8B, FIG. 8C, and FIG. 8D, only the base materials 31 and 32, and the laminating table 43 are shown.

Stacking operation is carried out as described in the following.

First, the base material 31 is set on the feed table and held by a holding system such as a vacuum chuck.

Then, the feed table 41 is moved from feeding position to laminating position, thereafter, the table surface is raised up so as to put the base material 31 between the feed table surface and the position correction table 42 surface.

Then, a vacuum of the position correction table 42 is turned on, and a vacuum of the feed table 41 is turned off. Thereby, the base material 31 is transferred to the position correction table 42. At this time, the virtual alignment points P1 and P2 of the base material 31 are set to be in the viewing field of the image sensor 50 of each X-ray optical system.

After the base material 31 is delivered to the position correction table 42, the feed table 41 is backed to the feeding position to receive the next base material 32.

When the position correction table 42 is moved in parallel by an offset amount d1 in the same plane, the alignment marks M1 and M2 of the base material 31 come into a viewing field of the image sensor of the X-ray optical system (M1 and M2 are disposed by offsetting by d1 from P1 and P2, respectively).

Then, the position of the position correction table 42 is corrected by driving the X-axis driving mechanism 45, Y-axis driving mechanism 46 and θ-axis driving system 47 in order that the displacements of the alignment marks (M1 and M2), from the optical axes of the respective X rays, in other words from the centers of viewing fields of the image sensors, are equalized and minimized (hereinafter this operation is referred to as centering). That is, by aligning the alignment marks M1 and M2 to the optical axes of the X rays, the position displacement of the base material is corrected.

After the correction of the position, the position correction table 42 is backed by the amount of offset d1. As a result of this operation, the alignment points P1 and P2 of the base material 31 become a state aligned to the respective X-ray axes (FIG. 8A). At this time, the position of the position correction table, provided that the position where the base material 31 is held is the regular position, should be backed to that position.

Thereafter, to perform alignment of the base material 32 that will be stacked on the base material 31, the base material 31 is sidetracked memorizing its position. Namely, the laminating table 43 is moved from the sidetrack to the laminating position, the surface thereof is raised, and the base material 31 is transported from the position correction table 42 to the laminating table 43. The laminating table 43 is lowered and is moved from the laminating position to the sidetrack. At the sidetrack position, the solder feed device coats connecting member such as solder paste on the connecting area of the base material 31.

On the other hand, while the base material 31 is in the sidetrack, the base material 32 is set on the feed table 41, and the vacuum is turned on to hold the base material 32 onto the tabletop.

Then the feed table 41 is moved from the feeding position to the laminating position, and the table surface is lifted to transfer the base material 32 from the feed table 41 to the position correction table 42. Thereafter, the feed table 41 is backed to the feeding position to receive the next base material 33.

Figure 8B:
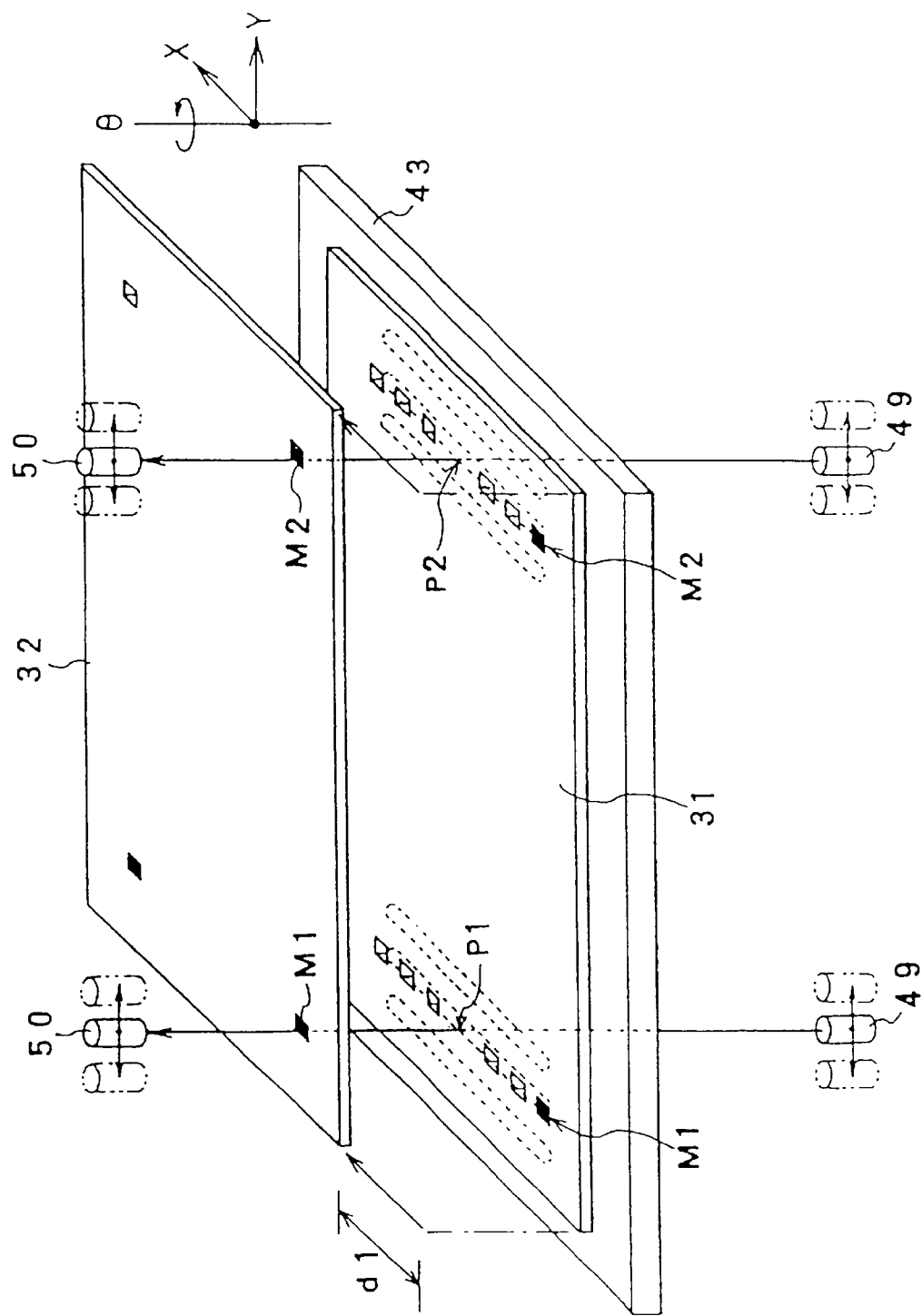

Similar to the position correction of the base material 31, the position correction table 42 is moved parallel by the displacement amount d1 in the same plane (FIG. 8B). (Incidentally, in FIG. 8B, the base material 31 and the sidetrack table 43 are shown, however, actually they are in the sidetrack position).

Then, the position of the position correction table 42 is corrected by driving the X-axis driving mechanism 45, Y-axis driving mechanism and θ-axis driving mechanism 47, so as to equalize and make minimum the displacements of the alignment marks M1 and M2 from the optical axes of the respective X rays, namely from the centers of viewing fields of the image sensors (hereinafter, this operation is referred to as centering). That is, the position displacement of the base material 32 is corrected by aligning the alignment marks M1 and M2 to the optical axes of the respective X rays.

After the position correction, the position correction table 42 is backed by the displacement amount d1. Thereby, the alignment points P1 and P2 of the base material 32 are aligned to the optical axes of the X rays.

Then, the base material 31 is placed at the corrected position by moving the sidetracked table 43 from the sidetrack position to the laminating position (FIG. 8C). Then, the tabletop is lifted to laminate the base materials 31 and 32. At this time, the alignment points P1 and P2 of both the base materials 31 and 32 are aligned to the optical axes of the X rays. Accordingly, the wiring pattern disposed on the base material 31 and the wiring pattern disposed on the base material 32 are laminated in coordinated state (FIG. 8D).

In this state, by putting the respective connecting areas of the base material 31 and the base material 32 between the heating bars 51, the solder coated on the connecting areas of the base material 31 can be melted. Upon removing the heating bars 51 distant away, the solder solidifies to connect the respective connecting areas of the base material 31 and the base material 32 each other through the solder.

Here once, while leaving the laminated base material 31 and the base material 32 on the position correction table 42, the vacuum of the laminating table 43 is turned off to lower. Thereafter, the position correction table 42 is moved in parallel by the displacement amount d2 to catch the alignment marks N1 and N2 of the base material 32 in the viewing field of the image sensors 50 of the X-ray optical system, thus, the aforementioned centering is performed. Then, by backing the position correction table by the displacement amount d2, the virtual alignment points P1 and P2 are made conformed to the X-ray axes.

Then, after the laminating table 43 is lifted, the laminated base material 31 and base material 32 are transferred from the position correction table 42 to the laminating table 43.

Thereafter, the stacking table 43 is lowered and moved from the laminating position to the sidetrack. At the sidetrack, on the connecting areas of the base material 32, solder is coated using the solder feeder to prepare for integration with the base material 33.

In the meantime, the base material 33 is set on the feed table 41 and is held on the table surface by turning on the vacuum. Then, the feed table 41 is moved to the laminating position.

Then, the table surface is raised to transfer the base material 33 to the position correction table 42. The feed table 41 is backed to the feeding position to receive the next base material (for example, base material 31).

Then, similar to the way described above, the position correction table 42 is moved in parallel in the same plane by the offset amount d2. At this position, the centering between the alignment marks N1 and N2, and the respective optical axes of X rays are performed. When backed further by the offset amount d2 to the initial position, the displacements between the alignment points P1 and P2, and the optical axes of X rays are equalized and minimized.

Here, the laminating table 43 in the sidetrack position is moved to the laminating position to back to the previously aligned position. Then, the table surface is lifted to stack further the base material 33 on the laminate of the base material 31 and the base material 32. Thereafter, putting the respective connecting areas of the base materials 31, 32, and 33 between the heating bars 50, the solder coated on the connecting areas of the base material 32 is melted. Thereafter, the base materials 31, 32 and 33 are fixed by solidifying the solder.

Here, the vacuum of the position correction table 42 is turned off and the mutually laminated and fixed base materials 31, 32 and 33 are transferred on the sidetrack table 43. Then, the sidetrack table 43 is lowered to move to the sidetrack. The vacuum of the sidetrack table 43 is turned off followed by taking out a plurality of base materials already laminated. Thereby, a series of lay up steps are completed. Incidentally, the multi-layered wiring board can be obtained by curing the insulating resin layers of semi-cured state and integrating as a whole by pressing while heating at the later step.

Incidentally, in this example, the laminate of three sheet shaped base material is described as one set. However, by repeating the similar operation, a plurality of base materials can be laminated further.

With such operations, the base materials 31, 32 and 33 can be laminated in coordinate. Therefore, the relative positions of wiring patterns disposed on the respective base materials, and conductive pillars, through-holes, IVHs or the like for interlayer connection, can be enhanced in their accuracy.

(Embodiment 4)

FIG. 9A, FIG. 9B, FIG. 9C and FIG. 9D are diagrams for describing laminating operation of a apparatus for manufacturing multi-layered wiring boards of the present invention.

Here, as illustrated in FIG. 5, FIG. 6A and FIG. 6B, for each base material, the alignment marks M1 and M2 are disposed at positions that are offset by d1, and the alignment marks N1 and N2 are disposed at positions that are offset by d2, in a perpendicular direction with respect to a straight line connecting alignment points P1 and P2, respectively.

The operation of laminating is carried out as follows.

First, the lamination of the base material 31 and the base material 32 will be described.

Figure 9A:
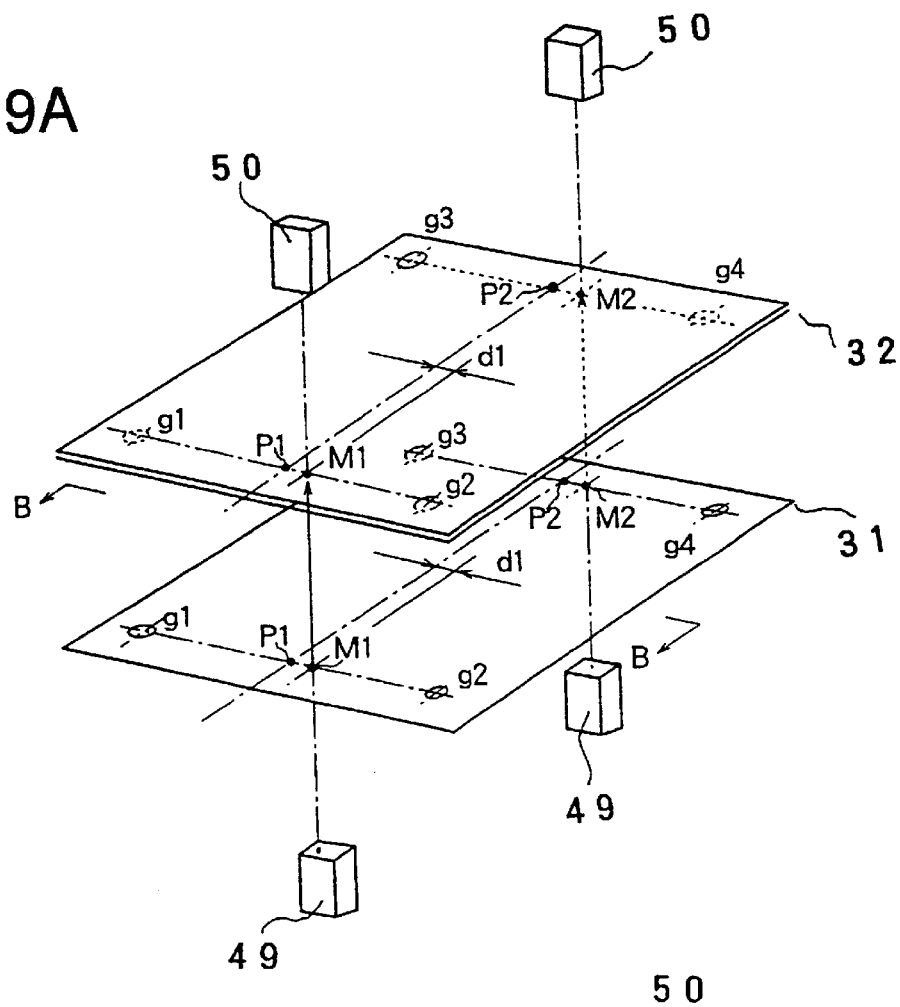
FIG. 9A, FIG. 9B, FIG. 9C and FIG. 9D are diagrams for describing laminating operation of a apparatus for manufacturing multi-layered wiring boards of the present invention.

For the respective base materials 31 and 32, the alignment marks M1 and M2 disposed at points that are offset by d1 from the P1 and P2 respectively are detected by the respective X-ray optical system. As described above, after the centering of the alignment marks (M1 and M2) and the optical axes of X rays (alignment axes) are carried out, the displacement amount d1 is backed. By this operation, the respective alignment points P1 and P2 of the base materials 31 and 32 and the optical axes of X rays are aligned (FIG. 9A).

Figure 9B:
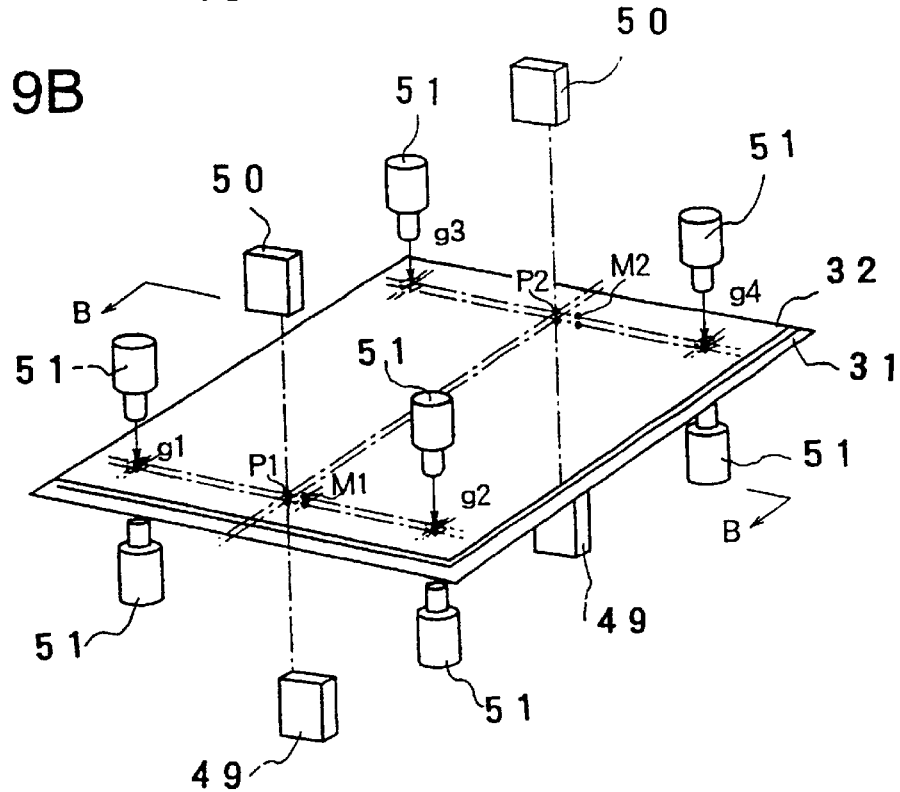

As described above, solders coated in advance on connecting areas of g1, g2, g3, and g4 of the base material 31 are melted and solidified. Thereby, the respective facing portions of the connecting areas g1, g2, g3, and g4 of the base material 31 and connecting areas g1, g2, g3, and g4 of the base material 31 are joined and maintain their relative positions (FIG. 9B).

Next, to the laminated base materials 31 and 32, the base material 33 is further laminated.

Figure 9C:
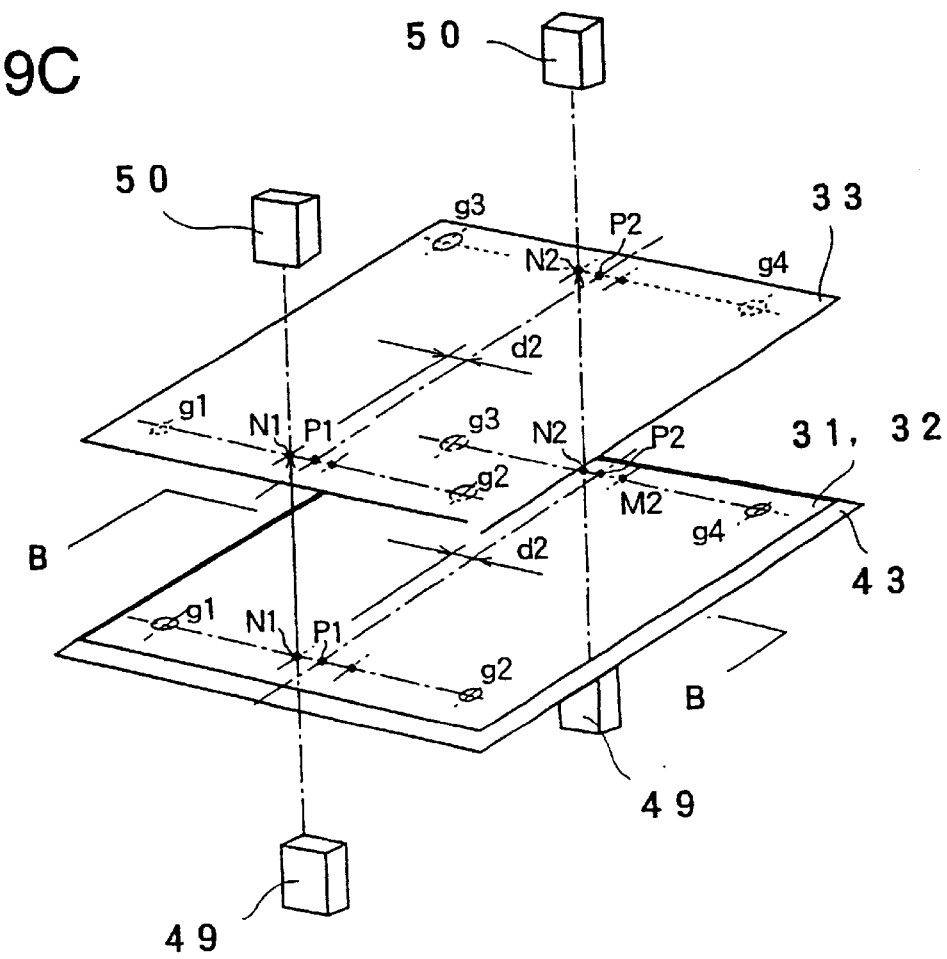

Similar to the way described above, for each of the base materials 31, 32 and 33, the positions of the alignment marks N1 and N2 disposed at positions that are offset by d2 are detected respectively by X-ray optical system. Thereby, as described above, the centering is carried out for the alignment marks (N1 and N2) and the optical axes of X rays (alignment axes) (FIG. 9C). Thereafter, the offset d2 is backed. By this operation, the respective virtual alignment points P1 and P2 of the base materials 32 and 33 are aligned with the optical axes of X rays.

Figure 9D:
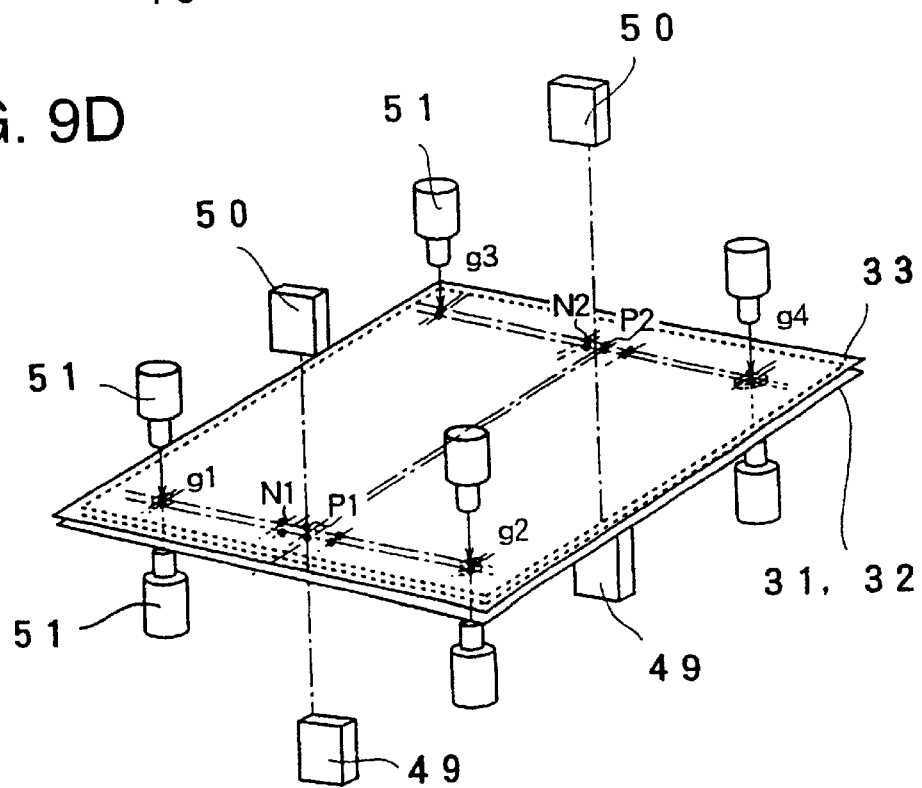

Further, as described above, by melting and solidifying the solder coated in advance on the connecting areas g1, g2, g3, and g4 of the base material 32, the respective facing portions of the connecting areas g1, g2, g3, and g4 of the base material 32 and the connecting areas of g1, g2, g3, and g4 of the base material 33 are connected to maintain the relative position thereof (FIG. 9D).

(Embodiment 5)

FIG. 10A, FIG. 10B, FIG. 10C, FIG. 10D, FIG. 10E, and FIG. 10F are diagrams for explaining still another example of laminating operation of a apparatus for manufacturing multi-layered wiring boards of the present invention.

Here, an example of the case where the respective base materials are coordinated as to their positions in more equalized way over the whole areas of the base materials will be described.

Figure 10A:
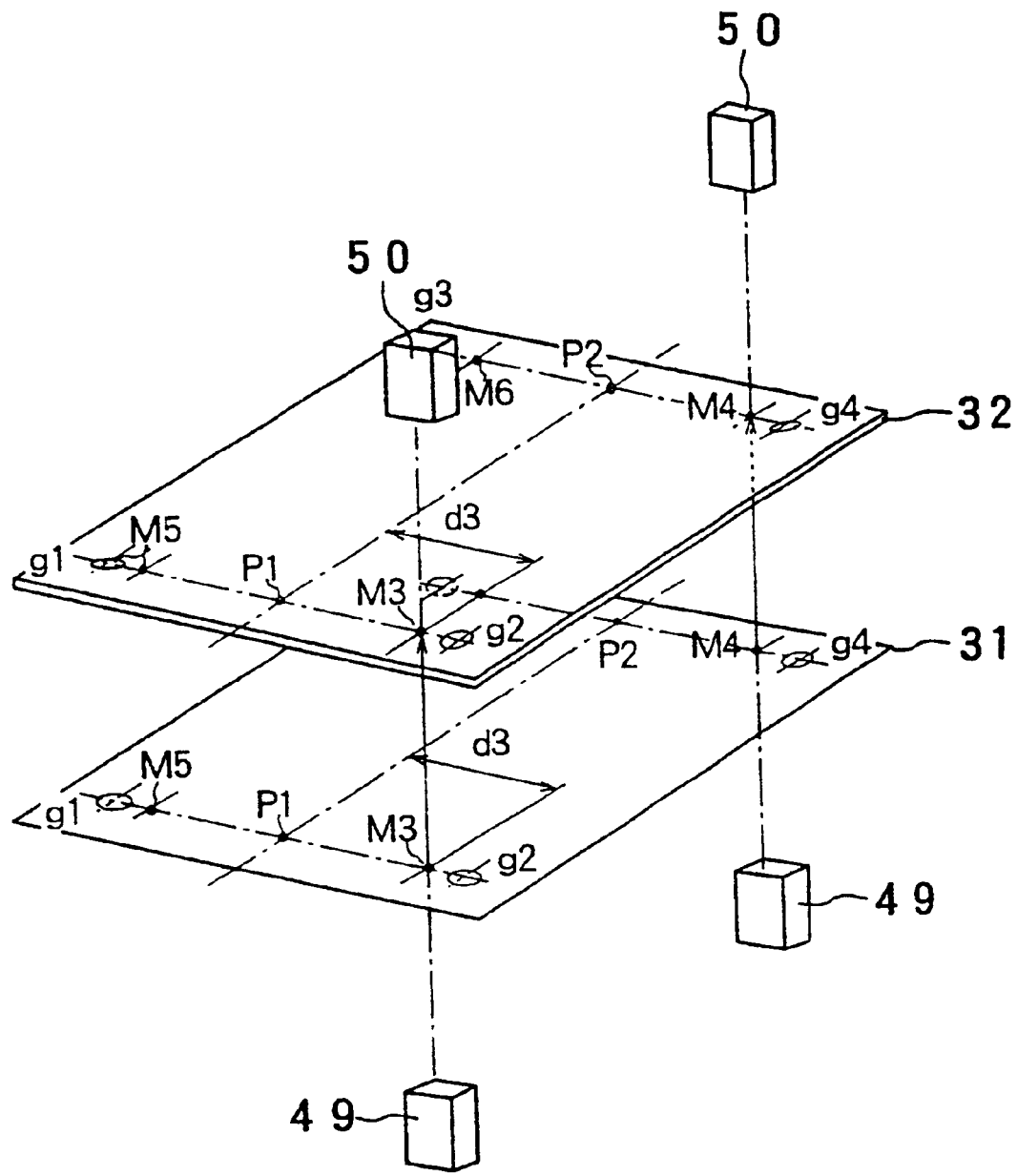
FIG. 10A, FIG. 10B, FIG. 10C, FIG. 10D, FIG. 10E and FIG. 10F are diagrams for describing another example of the laminating operation of a apparatus for manufacturing multi-layered wiring boards of the present invention.

As shown in FIG. 10A, upon piling the base material 31 and the base material 32, the alignment marks M3 and M4 disposed by offsetting by d3 from the alignment points P1 and P2 are detected by the X-ray optical system for each of the base material 31 and the base material 32, respectively. Thereby, as described above, the centering of the alignment marks M1 and M2, and the optical axes of X rays (alignment axes) is performed.

Figure 10B:
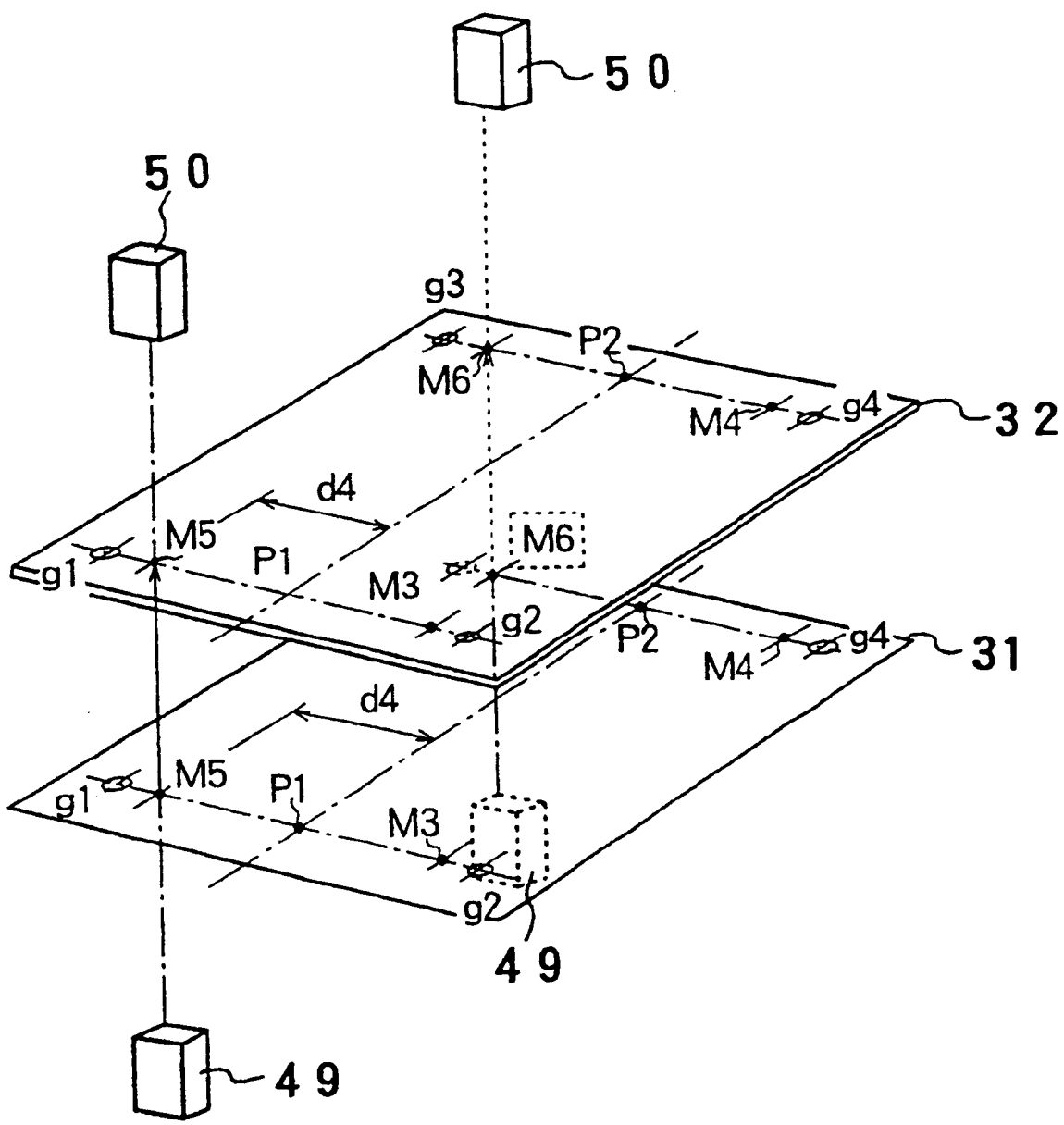

Thereafter, the base materials 31 and 32 are backed by the offset amount d3 making use of that position as the starting point. Further, the alignment marks M5 and M6 disposed offsetting by d4 are detected respectively by X-ray optical system (FIG. 10B). Then, positional relation between the respective alignment marks M3, M4, M5, and M6 are calculated, amounts of back to the alignment points P1 and P2 are calculated by proportionally distributing, and the base material is backed by the calculated amount. Thereby, the respective alignment points P1 and P2 of the base materials 31 and 32 are aligned with the optical axes of the X rays.

Figure 10C:
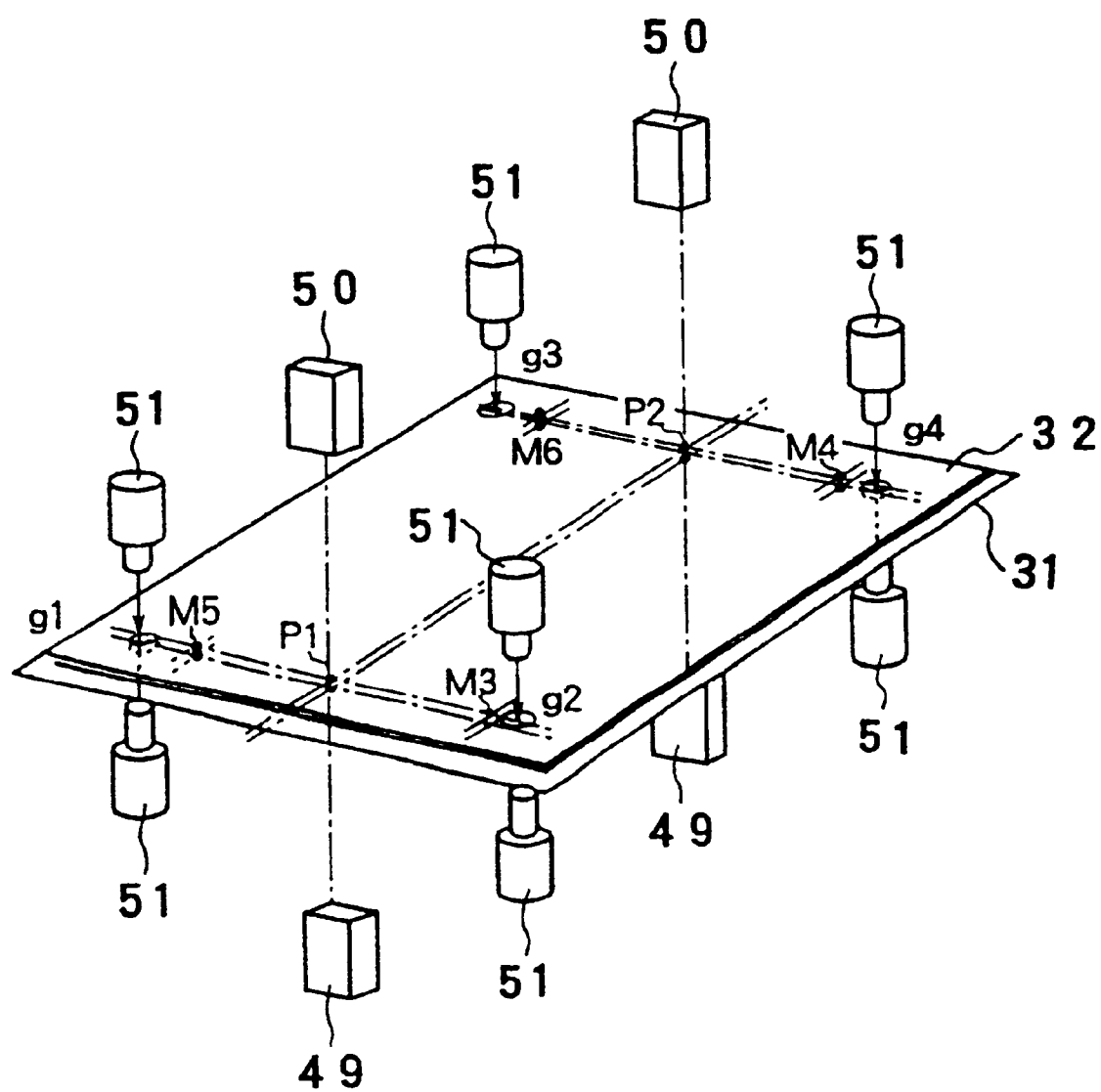

While maintaining this positional relation, the base materials 31 and 32 are contacted in parallel with the optical axis direction of the X rays, and the solder coated in advance on the connecting areas g1, g2, g3, and g4 of the base material 31 is melted and solidified to connect the base materials 31 and 32. Thereby, relative positional relation is maintained (FIG. 10C).

Then, to the laminated base materials 31 and 32, the base material 33 is further laminated.

Figure 10D:
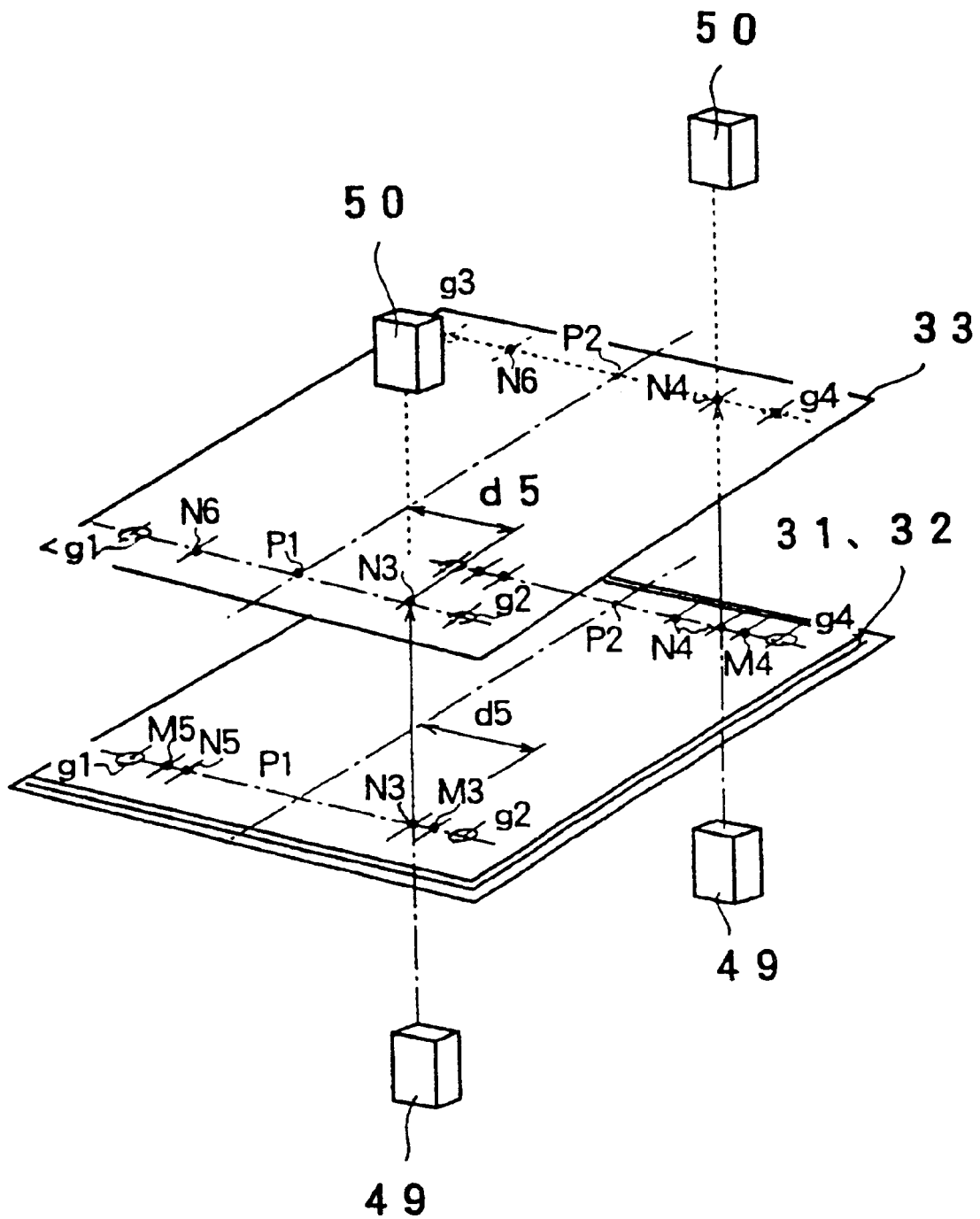

Similar to the way described above, for each of the base materials 31, 32 and 33, the alignment marks N3 and N4 disposed by offsetting by d5 from the alignment points P1 and P2 are detected by the respective X-ray optical system. Thereby, as described above, the centering of the alignment marks N3 and N4, and the optical axes of the X rays (axis of matched arrangement) are carried out (FIG. 10D).

Figure 10E:
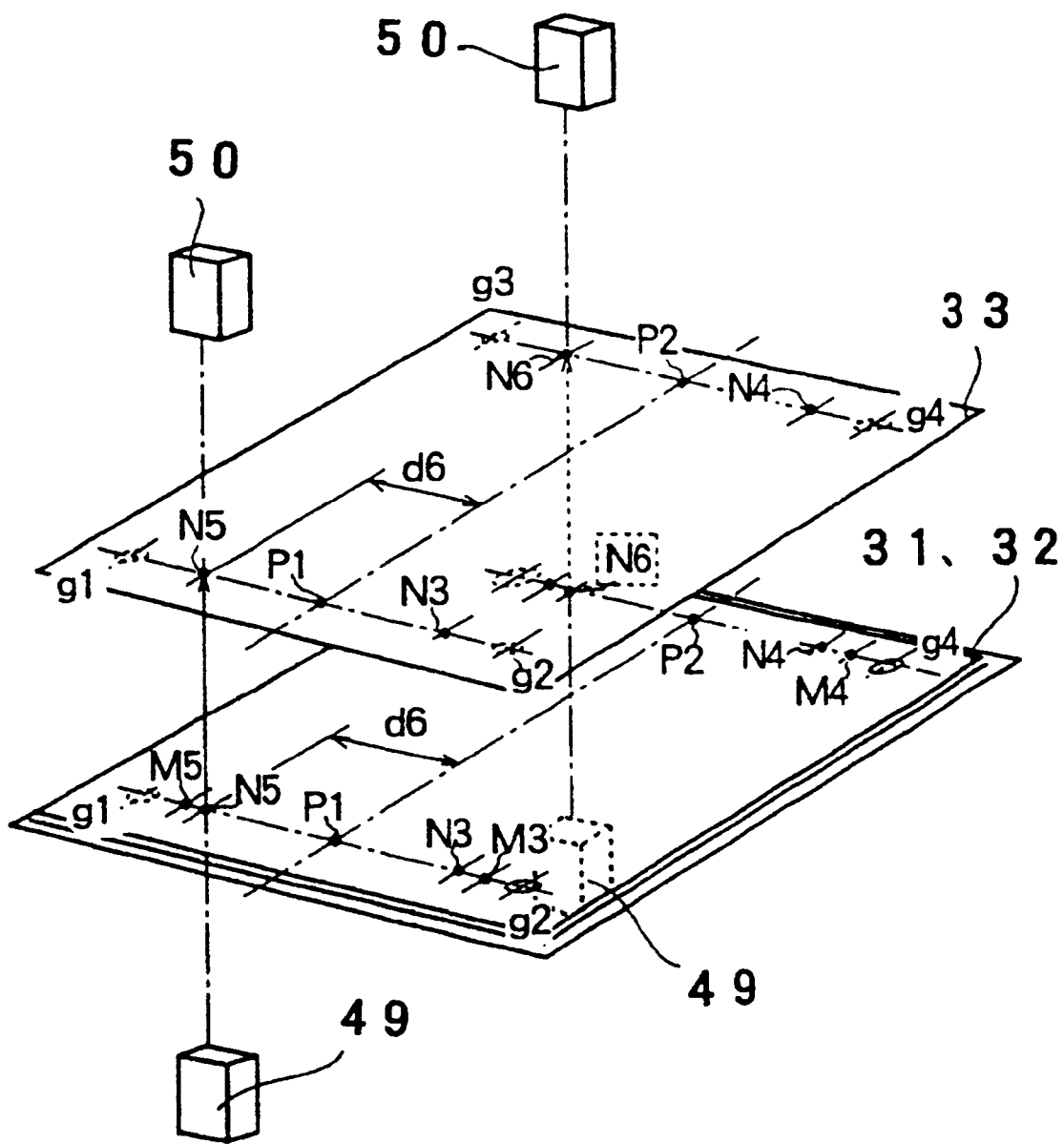

Then, the base materials are backed by d5 therefrom as the starting point, and further the alignment marks N5 and N6 disposed at the positions that are offset by d6 are detected by the respective X-ray optical system (FIG. 10E). Then, the respective positional relation of the alignment marks N3, N4, N5 and N6 are calculated, and the amount of back to the alignment points P1 and P2 is calculated by proportionally distributing. The base materials are backed by the obtained amount, thereby they are aligned so that the displacements between the respective alignment points P1 and P2, and the optical axes of the X rays are minimized and equalized.

Figure 10F:
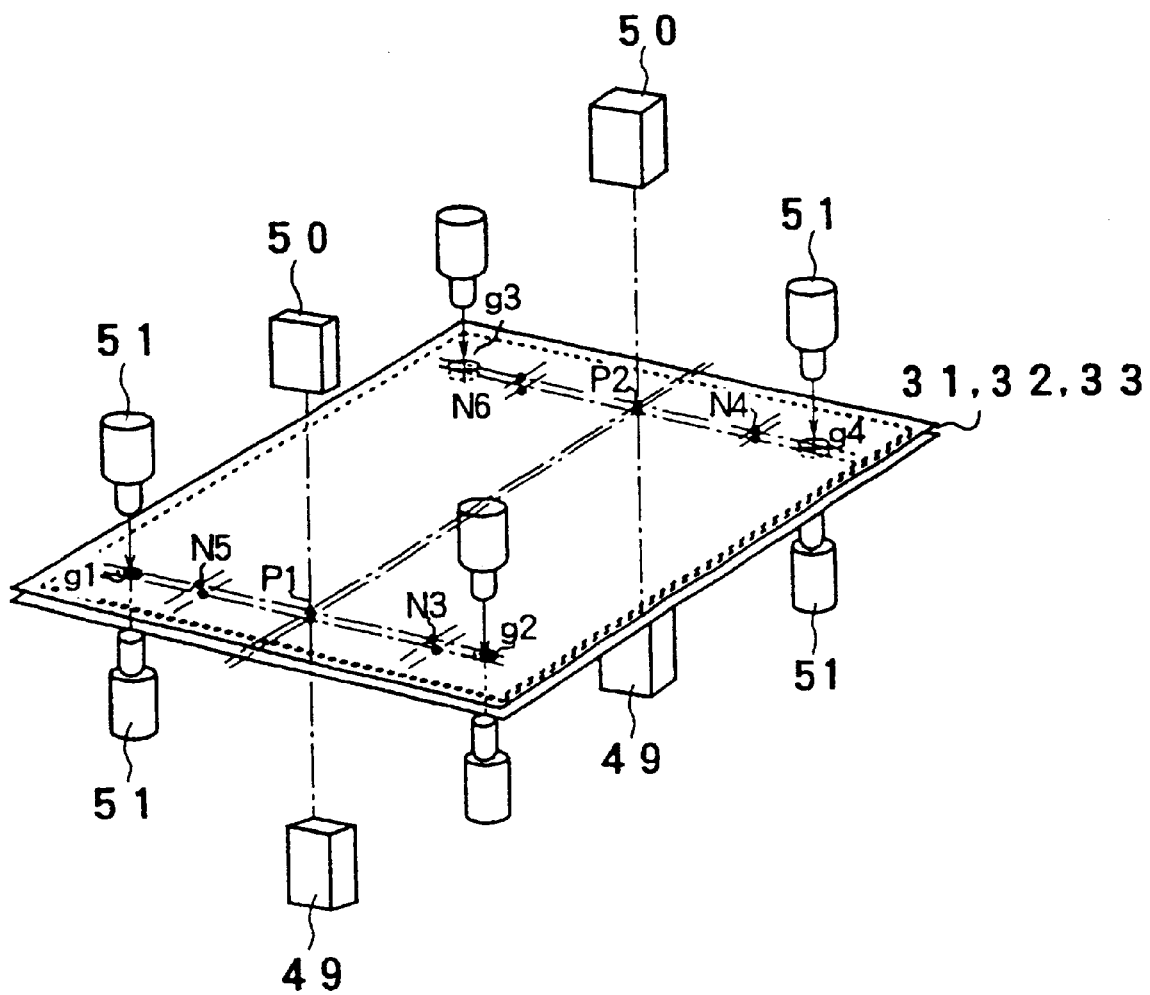
Figure 11A:
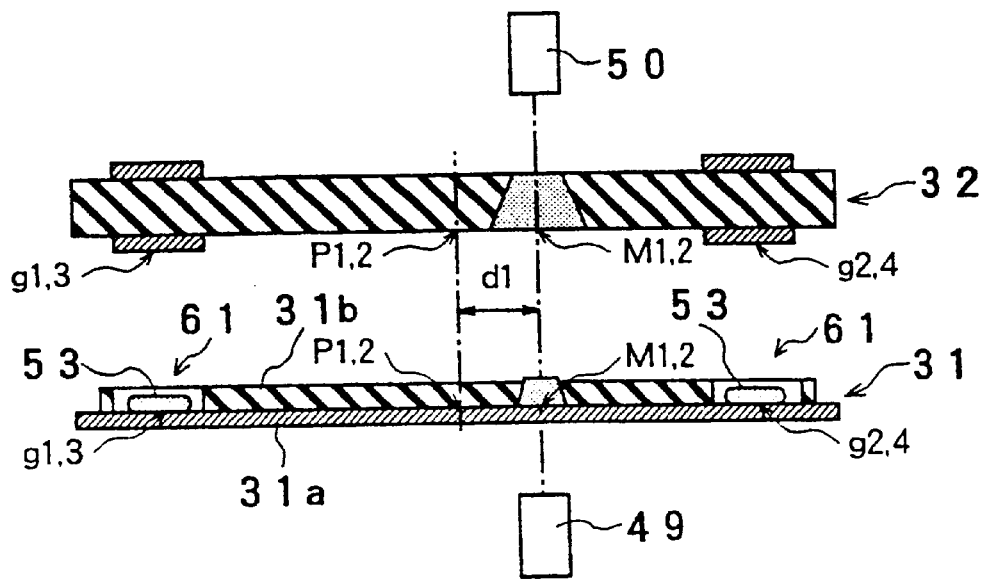
FIG. 11A, FIG. 11B, FIG. 11C and FIG. 11D are diagrams for describing an example of a structure of alignment mark and connecting area.
Figure 11B:
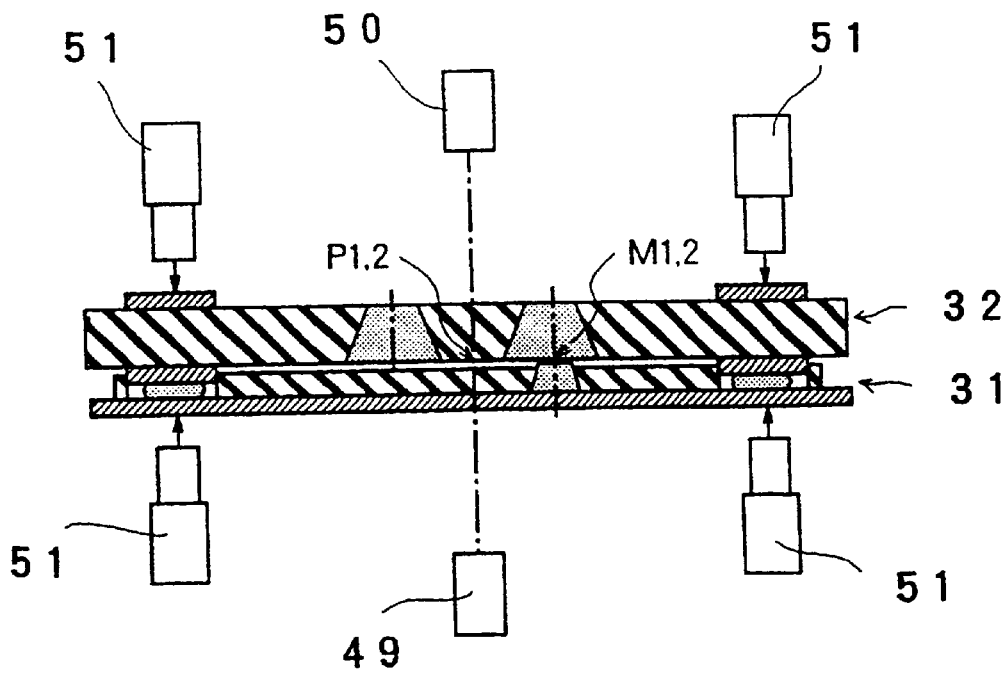
Figure 11C:
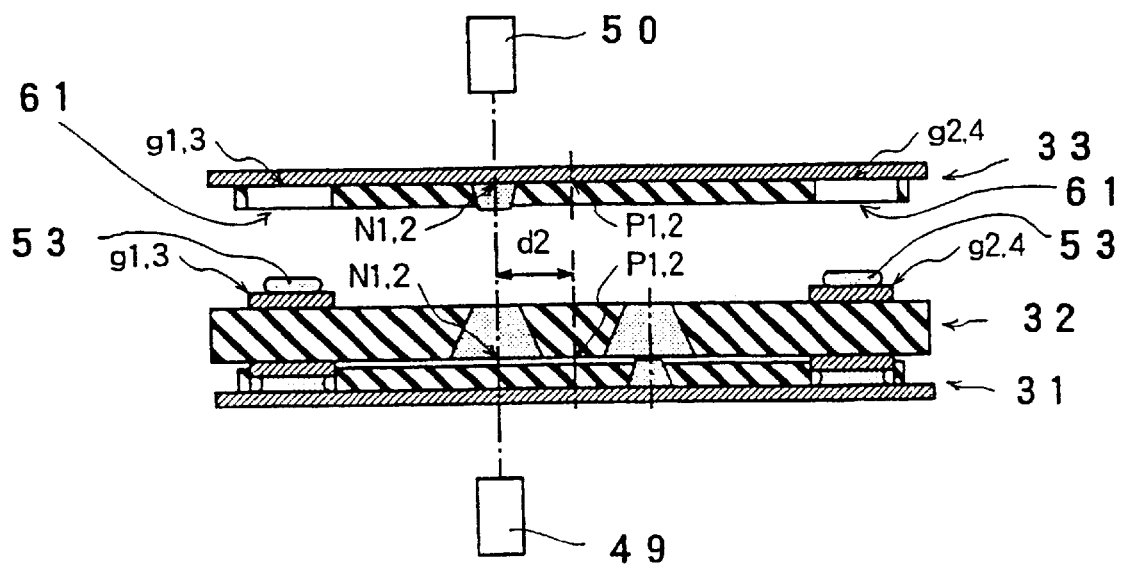
Figure 11D:
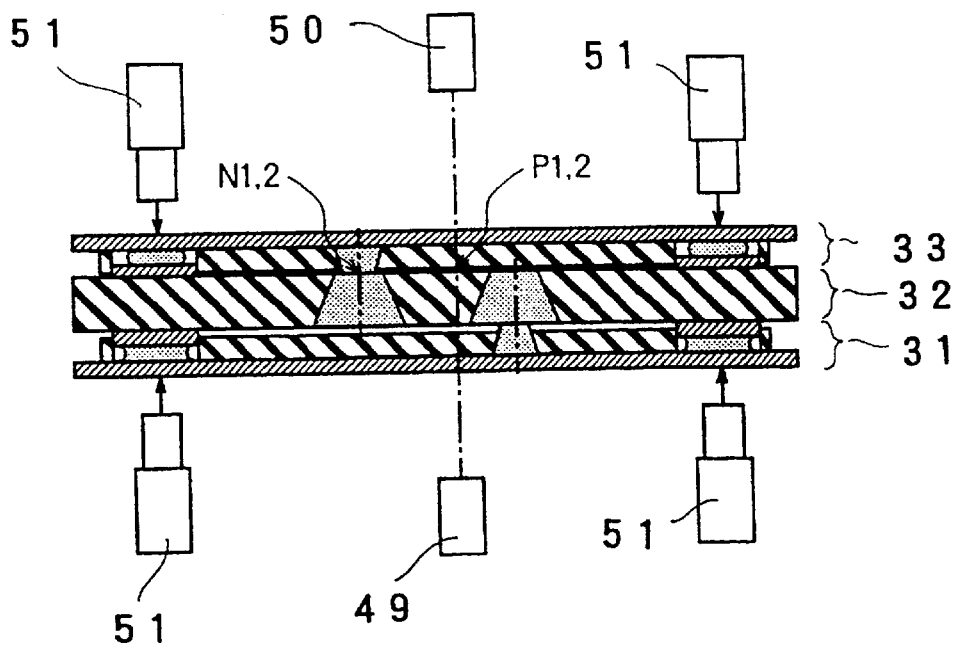
Figure 12A:
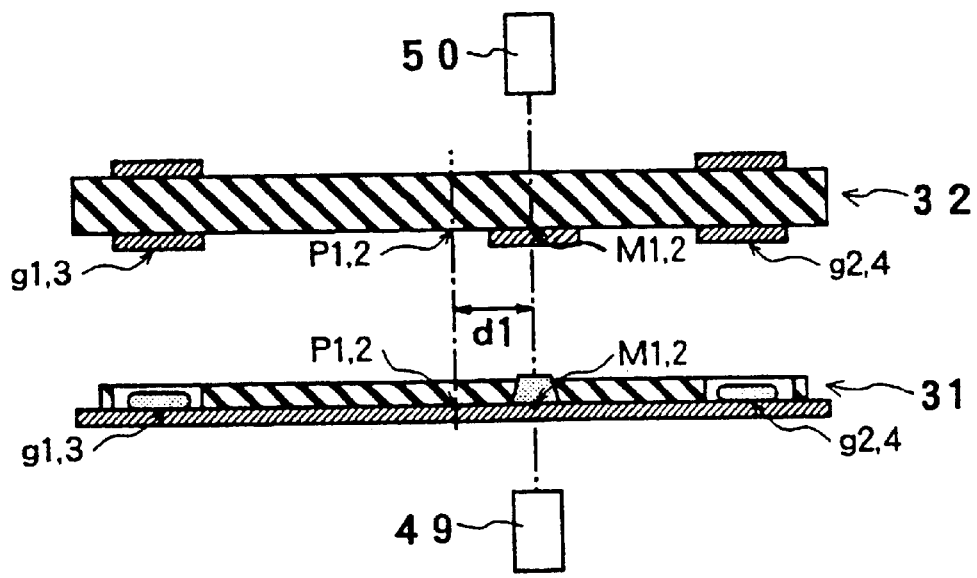
FIG. 12A, FIG. 12B, FIG. 12C and FIG. 12D are diagrams for describing an example of alignment mark and a structure of connecting area.
Figure 12B:
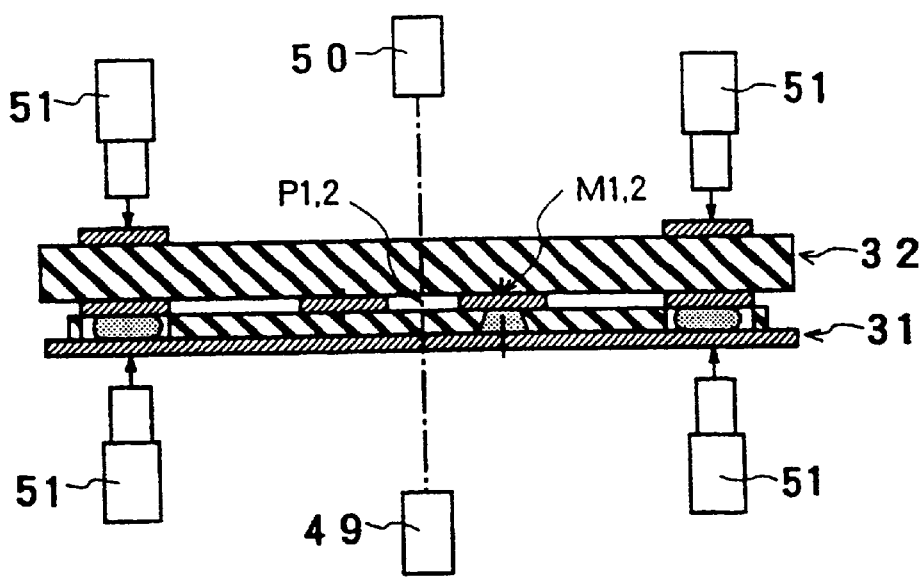
Figure 12C:
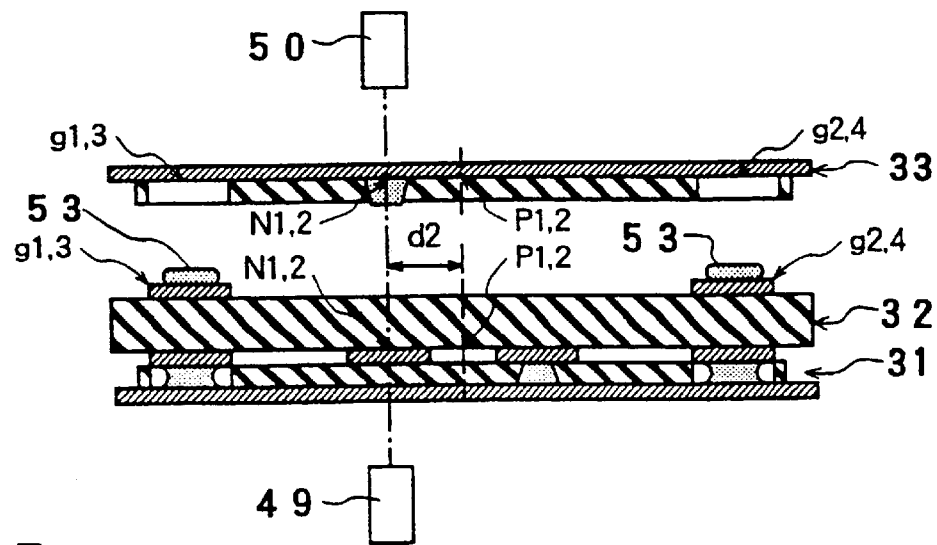
Figure 12D:
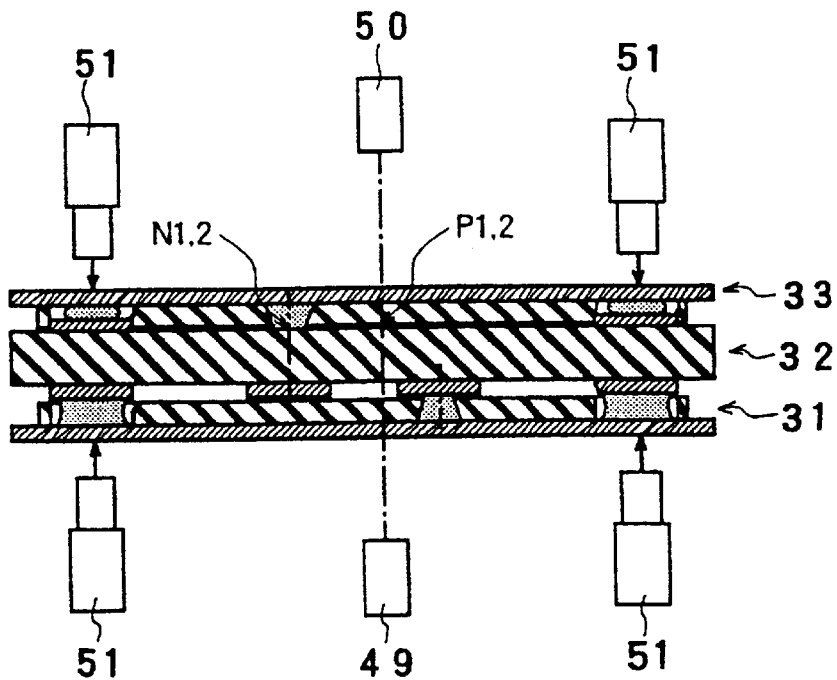
Figure 13A:
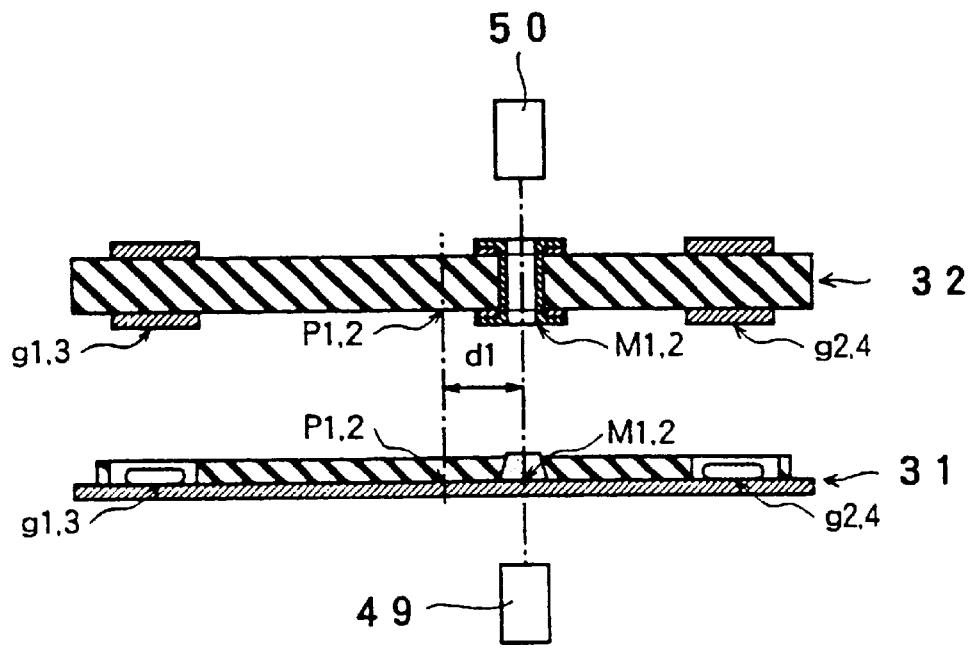
FIG. 13A, FIG. 13B, FIG. 13C and FIG. 13D are diagrams for describing an example of alignment mark and structure of connecting area.
Figure 13B:
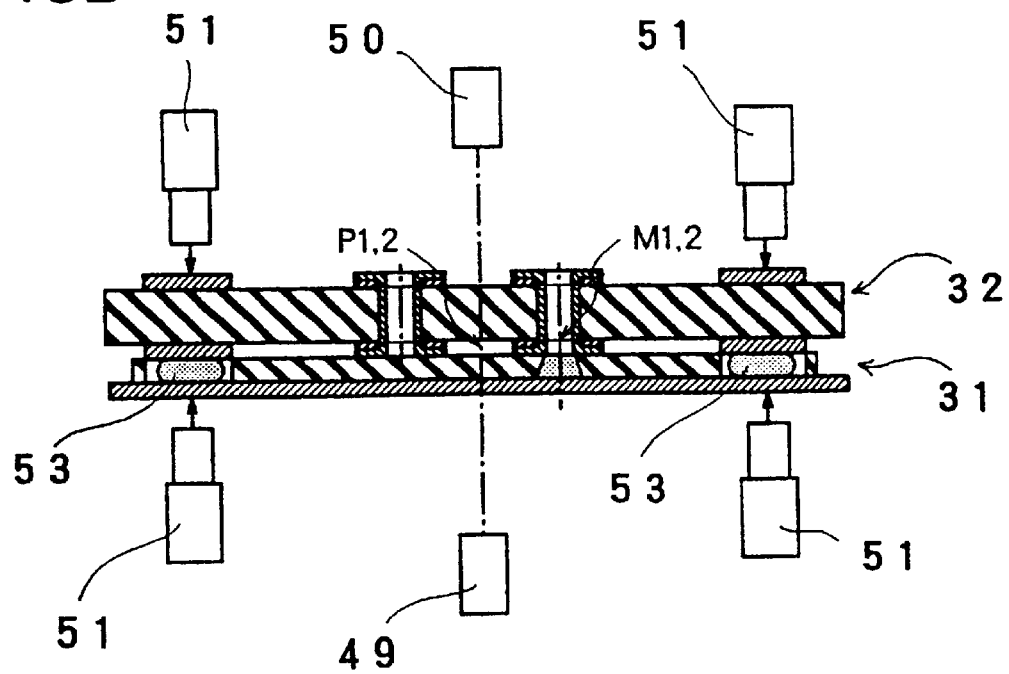
Figure 13C:
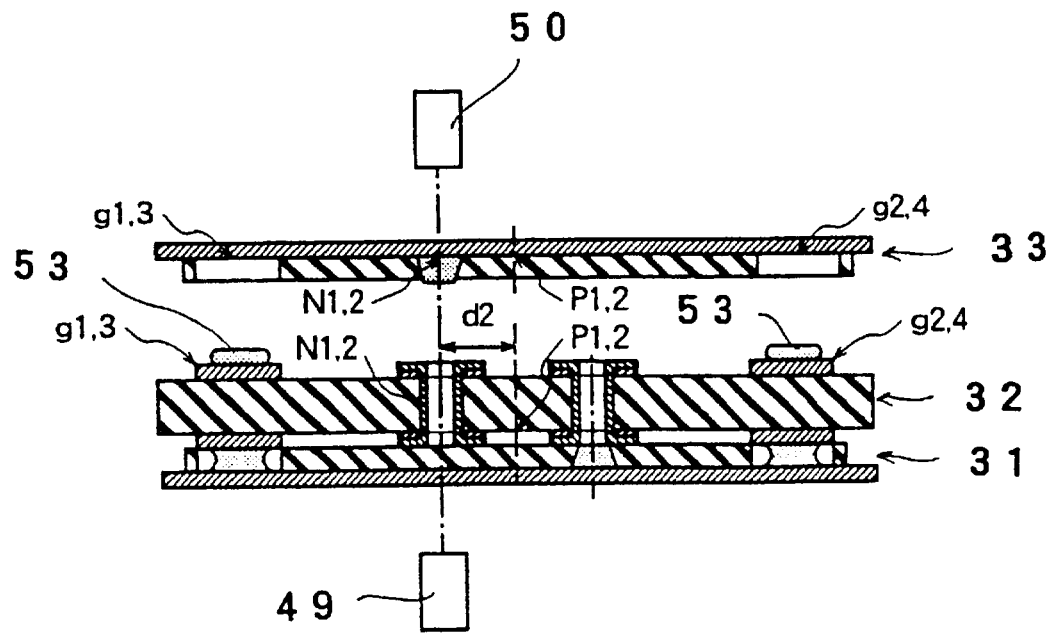
Figure 13D:
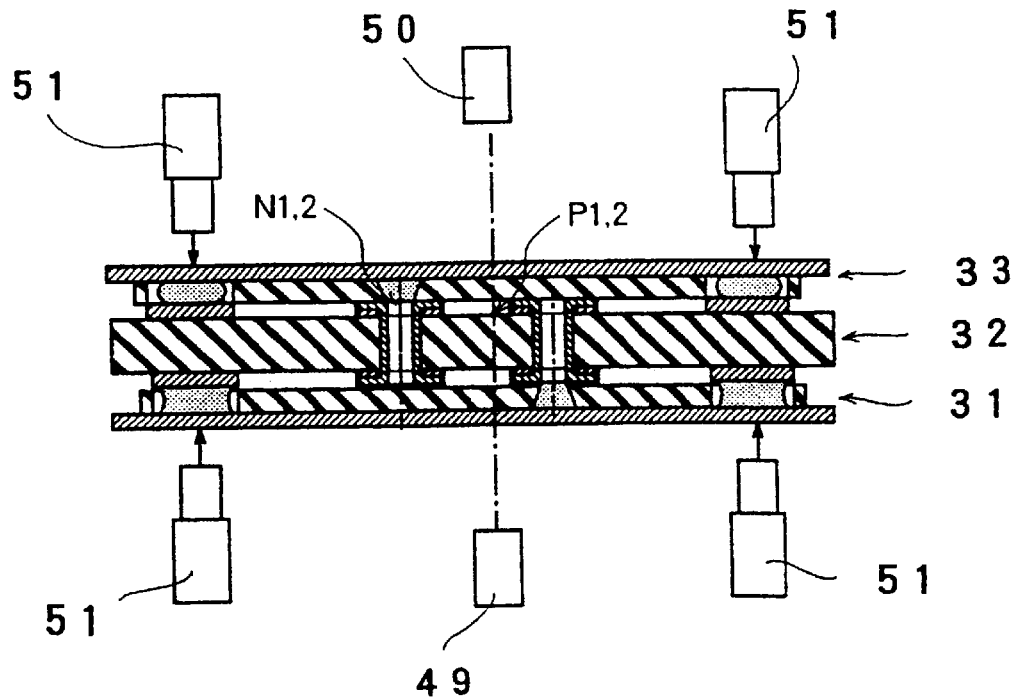

While maintaining this positional relation, the base materials 31, 32 and 33 are contacted in parallel with the optical axis direction of the X rays. Thereafter the solder coated in advance on the connecting areas g1, g2, g3, and g4 of the base material 32 is melted and solidified to connect the base materials 31 and 32, and the base material 33. Thereby, relative positional relation is maintained (FIG. 10F).

According to the method described above, mutual positional relation of the base materials can be coordinated in more equalized way, thereby productivity and reliability of the multi-layered wiring boards can be enhanced.

(Embodiment 6)

An example of the alignment marks and a structure of connecting areas will be described.

FIG. 11A, FIG. 11B, FIG. 11C and FIG. 11D are diagrams for describing an example of the alignment marks and the structure of the connecting areas, and they show schematically cross-sectional structures in the BB direction of embodiment 4. In this example, the multi-layered wiring board laminate establishing all the interlayer connections using the conductive pillars is described.

As the alignment marks M1 and M2 being employed upon laminating the base materials 31 and 32, the conductive pillars formed at positions that are offset by d1 from the alignment points P1 and P2 are employed. These conductive pillars are formed simultaneously at the process forming the conductive pillars that connect different wiring layers.

For connecting areas g1, g2, g3 and g4 that fix the base materials laminated by connecting member such as the solder, conductor patterns are employed that are patterned simultaneously when the wiring layers are patterned.

When laminating a prepreg 31b of semi-cured state on a copper foil 31a, at prescribed positions of the prepreg 31b, holes 61 are formed in advance. Thereby, the connecting areas g1, g2, g3 and g4 of the base material 32 are constituted so that the copper foil 31a is exposed at the prescribed positions of which reference points are the alignment points P1 and P2. On such connecting areas g1, g2, g3 and g4, for example during being held at the sidetrack position, the solder 53 may be coated by a solder coating device 52.

As the alignment marks N1 and N2 being employed in laminating further the laminated base materials 31 and 32, and the base material 33, the conductive pillars disposed on the base material 32 and 33 in advance at positions that are offset by d2 from the alignment points P1 and P2 are employed. The connecting areas are similar to the above embodiment.

(Embodiment 7)

FIG. 12A, FIG. 12B, FIG. 12C and FIG. 12D are diagrams for describing an example of the alignment marks and a structure of connecting areas. They show an example of a multi-layered wiring board in which the interlayer connection is performed by combining the through holes and the conductive pillars.

The respective alignment marks M1 and M2 of the base material 31 and 32 that are employed in contacting the base material 31 and the base material 32 are as follows. Surface layer conductor patterns that are formed in advance at positions offset by d1 from the alignment points P1 and P2 are employed as the marks for the base material 31, and conductive pillar bumps formed at position offset by d1 from the alignment points P1 and P2 are employed for the base material 32. The connecting areas are similar to those for the aforementioned embodiment.

The respective alignment marks N1 and N2 of the base material 32 and the base material 33 for contacting the base material 31, the base material 32 and the base material 33 are as follows. Surface layer conductor patterns formed in advance at positions offset by d2 from the alignment points P1 and P2 are employed as the marks for the base material 32, and conductive pillars formed at positions that are offset by d2 from the alignment points P1 and P2 are employed as the marks for the base material 33. The connecting areas are similar to those for the aforementioned embodiment.

(Embodiment 8)

FIG. 13A, FIG. 13B, FIG. 13C, and FIG. 13D are diagrams for describing the alignment marks and an example of a structure of connecting areas. In this example, an example of a multi-layered wiring board in which the interlayer connection is performed by combining hole-filling inner core material and conductive pillar.

The respective alignment marks M1 and M2 of the base material 31 and 32 employed in contacting the base material 31 and the base material 32 are as follows. Holes bored on a surface conductor layer formed in advance at positions offset by d1 from the alignment points P1 and P2 are employed as the marks for the base material 31, and conductive pillars formed respectively at positions offset by d1 from the virtual alignment points P1 and P2 are employed as the marks for the base material 31. The connecting areas are same with the aforementioned embodiment.

As the respective positioning alignment marks N1 and N2 of the base material 32 and the base material 33 that are employed in contacting the base material 31 and the base material 32, and the base material 33, for the base material 32, holes bored in the surface conductor layer that are formed in advance at positions that are offset by d2 from the alignment points P1 and P2 are employed. For the base material 33, conductive pillars formed respectively at positions that are offset by d2 from the virtual alignment points P1 and P2 are employed.

Incidentally, any resin that, due to high transparency to X rays, does not obscure contour of holes may be filled in the holes of alignment marks M1 and M2 of the base material 31. The connecting areas are similar to those of the aforementioned example.

(Embodiment 9)

Next, disposition of the alignment points, the alignment marks and connecting areas to the respective base materials will be described.

Figure 14A:
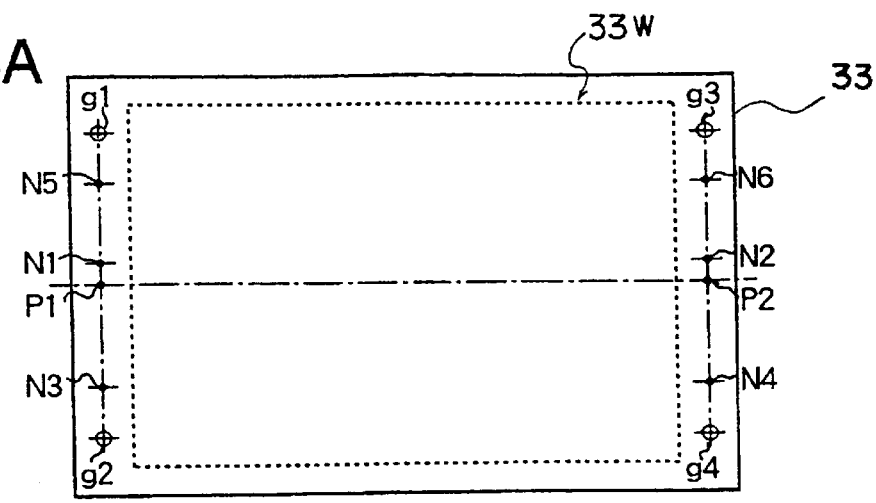
FIG. 14A, FIG. 14B and FIG. 14C are diagrams showing positional relationship between disposition of alignment marks and connecting areas disposed on a base material, and positioning points P1 and P2.
Figure 14B:
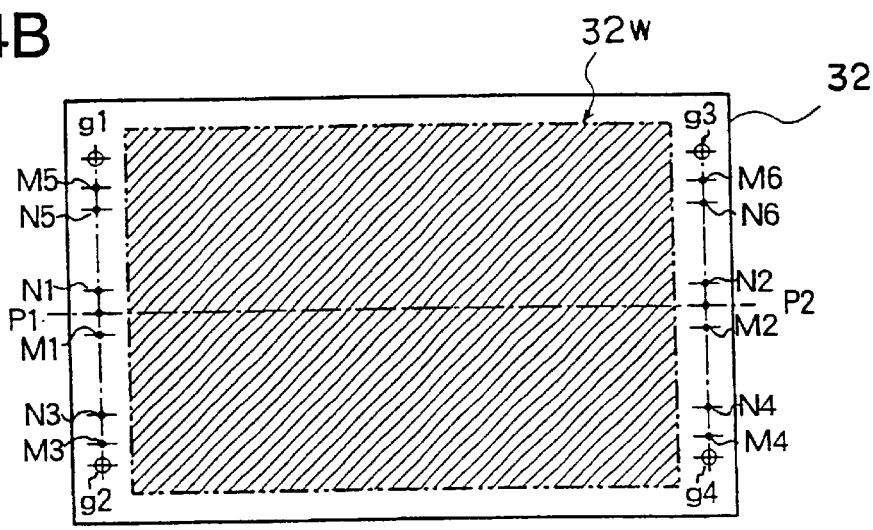
Figure 14C:
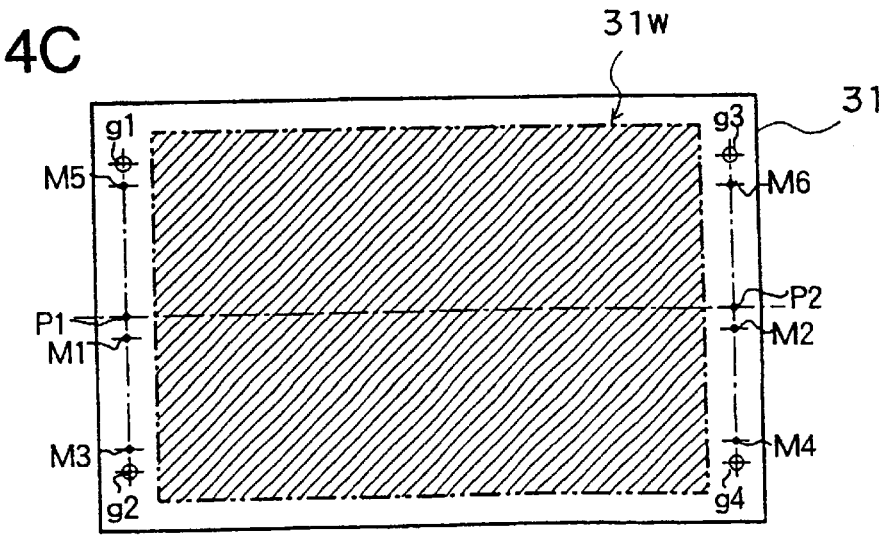

FIG. 14A, FIG. 14B and FIG. 14C are diagrams showing positional relation between disposition of the alignment marks and connecting areas disposed on the base material, and alignment points P1 and P2. Figures show relation of the disposition of the alignment marks and connecting areas and the alignment points P1 and P2, showing FIG. 14A for the base material 33, FIG. 14B for the base material 32 and FIG. 14C for the base material 33, respectively.

For all the base materials, the alignment points P1 and P2 and alignment marks are disposed along the shorter sides that put the wiring pattern formation areas 33w, 32w 31w between the sides of rectangular base materials.

Usually, they are disposed on two shorter opposing sides when a rectangular base material is employed. They may be disposed around the center thereof or may be predominantly disposed in the neighborhood of the longer sides thereof. The alignment marks are disposed on two parallel straight lines that are orthogonal with a straight line connecting the alignment points P1 and P2, and going through the alignment points P1 and P2, respectively. Further, the alignment marks are distanced by the prescribed offset amount from the alignment points P1 and P2, respectively to form M1-M2, M3-M4, M5-M6, N1-N2, N3-N4, and N5-N6 pairs. Incidentally, the alignment marks M1 and M2, and N1 and N2 (used when two-point alignment method is used) may be preferably disposed at near the middle point of the shorter sides of the rectangular base material for obtaining more equalized coordination over the whole base material. In addition, for the similar reason, the alignment marks of M3 and M4, M5 and M6, N3 and N4, and N5 and N6 (used when four-point alignment method is used) are preferably disposed around four corners of the respective base materials as much as possible.

Figure 15A:
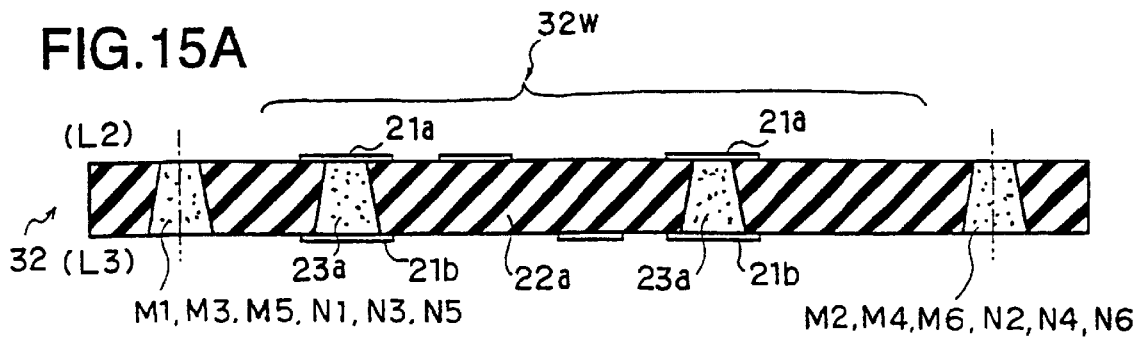
FIG. 15A, FIG. 15B, FIG. 15C and FIG. 15D are diagrams showing schematically cross section structure along P1-P2 of base material 32.

FIG. 15A is a diagram showing schematically a cross-sectional structure along P1-P2 of the base material 32. Here, an example of a multi-layered wiring board in which all the interlayer connections is performed by the conductive pillars is shown.

In this example, the alignment marks M1, M2, M3, M4, M5, M6, N1, N2, N3, N4, N5, and N6, are formed as the conductive pillars simultaneously when the conductive pillars 23a connecting the interlayer of wiring layer L2 and wiring layer L3 are formed during formation of the base material 32. The surface wiring patterns L2 and L3 including via-lands 21a and 21b of the base material 32, during patterning step thereof, are patterned with the prescribed accuracy with respect to the conductive pillars for interlayer connection by, for example, a photo-etching process or the like.

Figure 15B:
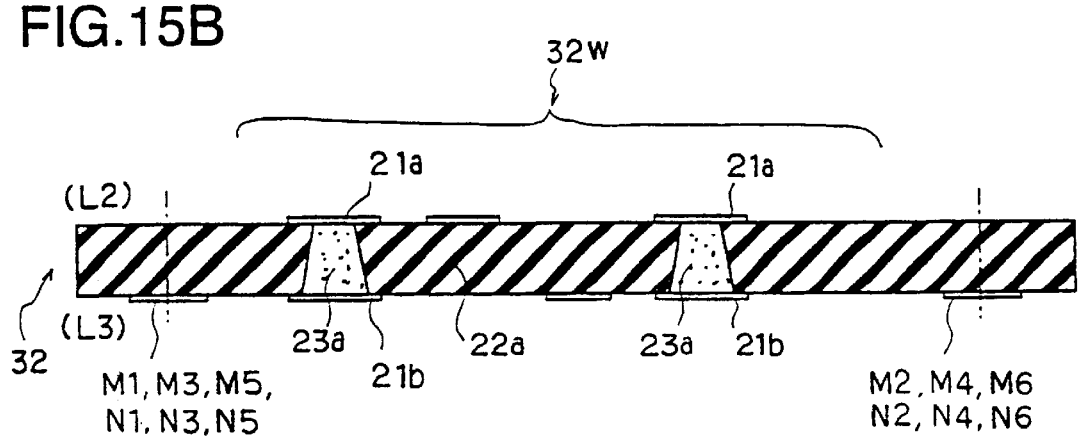

FIG. 15B is a diagram showing schematically a cross-sectional structure along P1-P2 of the base material 32. For the alignment marks M1, M2, M3, M4, M5, M6, N1, N2, N3, N4, N5, and N6, conductor patterns formed simultaneously when the surface wiring pattern L3 of the base material 32 is patterned is employed. The surface wiring patterns L2 and L3 of the base material 32 are formed securing the necessary accuracy during the formation step thereof. The embodiment shown in FIG. 15B can be applied to the multi-layered wiring board in which the conductive pillars and the through-holes are combined to form the interlayer connection.

Figure 15C:
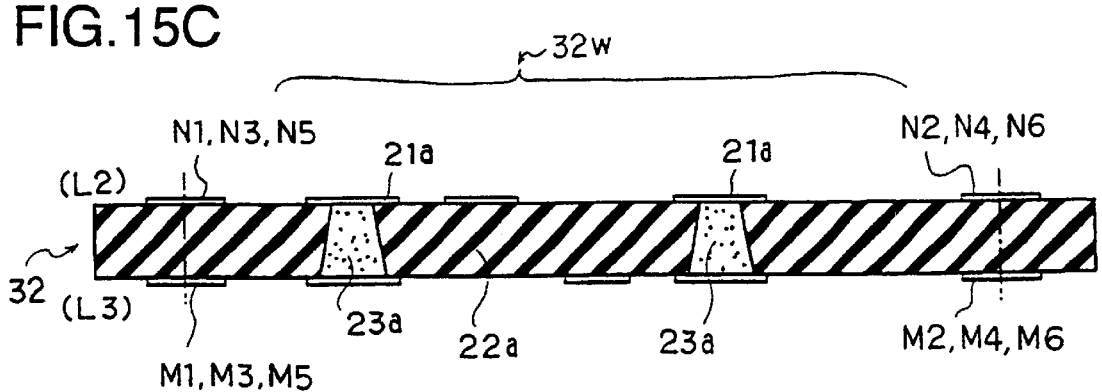

In the aforementioned example, the alignment marks M1, M2, M3, M4, M5, M6, N1, N2, N3, N4, N5, and N6 are formed by the surface wiring pattern L3. However, these alignment marks may be formed by the surface wiring pattern L2. Further, as shown in FIG. 15C, the alignment marks N1, N2, N3, N4, N5, and N6 of the base material 33 may be formed together with L2, and the alignment marks M1, M2, M3, M4, M5, and M6 with the base material 31 may be formed together with L3.

Figure 15D:
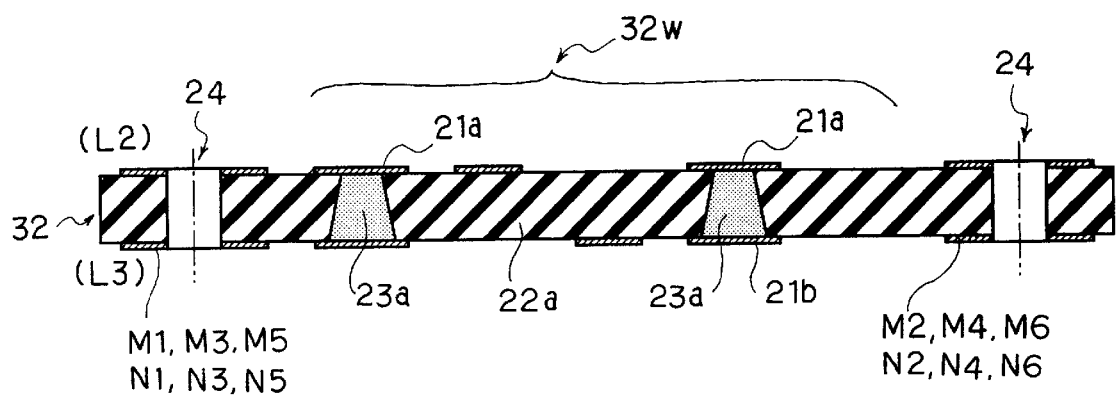

FIG. 15D is a diagram showing schematically an example of a cross-section along P1-P2 of the base material 32. In this example, the alignment marks M1, M2, M3, M4, M5, M6, N1, N2, N3, N4, N5, and N6 are constituted of through-holes 24 disposed on the base material 32. Such a constitution can be applied to a multi-layered wiring board of which interlayer connection is performed by combining the conductive pillars and the through-holes.

Figure 16:
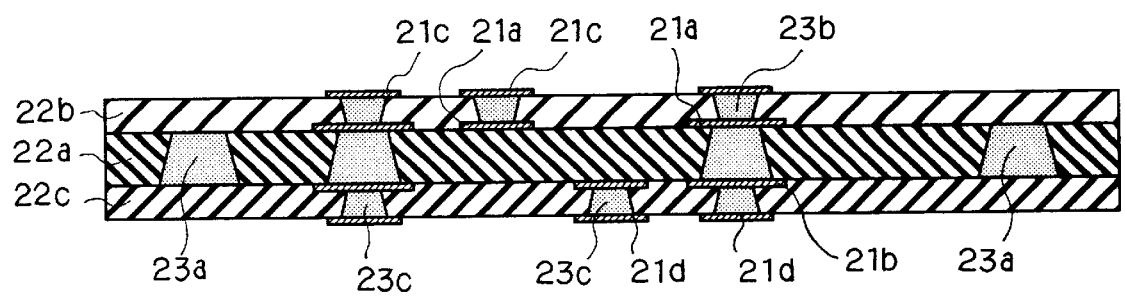
FIG. 16 is a diagram showing schematically an example of a structure of a multi-layered wiring board of the present invention.

FIG. 16 is a diagram showing schematically an example of a structure of a multi-layered wiring board of the present invention. In this example, the alignment marks M1, M2, M3, M4, M5, M6, N1, N2, N3, N4, N5, and N6 are disposed on the base material 32. With such a constitution, a multi-layered wiring board having, for example, four layers or more of wiring layers can be manufactured. In addition to this example in which the conductive pillars 23a are employed as the alignment marks M1, M2, M3, M4, M5, M6, N1, N2, N3, N4, N5, and N6, another example in which alignment marks are through-holes or patterned wiring layers can be applicable.

Figure 17:
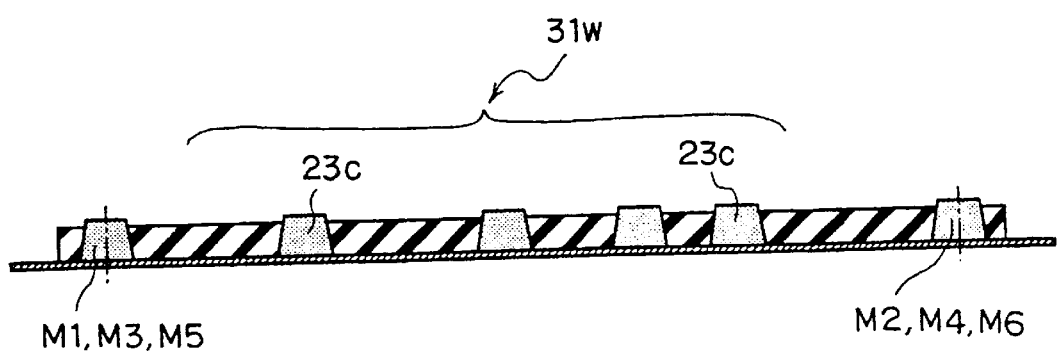
FIG. 17 is a diagram showing diagrammatically an example of a cross section structure along P1-P2 of base material 31.
Figure 18:
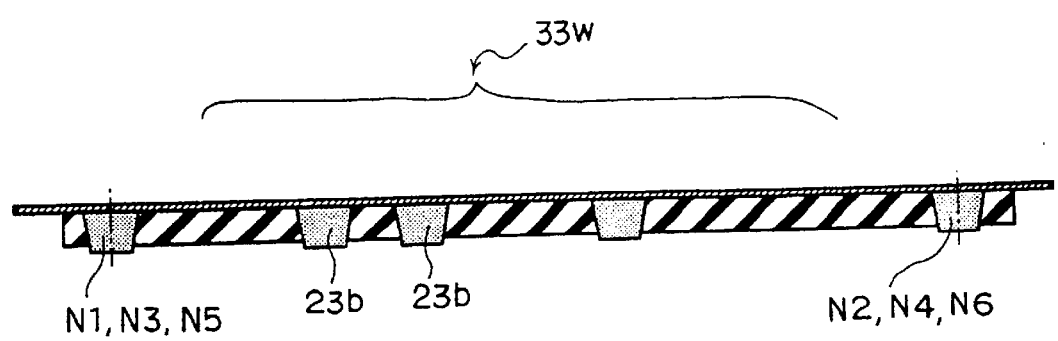
FIG. 18 is a diagram showing diagrammatically an example of a cross section structure along P1-P2 of base material 33.

FIG. 17 is a diagram showing schematically an example of a cross-sectional structure along P1-P2 of the base material 31. FIG. 18 is a diagram showing schematically an example of a cross-sectional structure along P1-P2 of the base material 33. The alignment marks M1, M2, M3, M4, M5, and M6 of the base material 31 are formed simultaneously at the step when the conductive pillars for interlayer connection of the base material 31 are formed. In addition, the alignment marks N1, N2, N3, N4, N5, and N6 of the base material 33 are formed simultaneously at the step when the conductive pillars for interlayer connection of the base material 33 are formed.

(Embodiment 10)

Methods for confirming accuracy of alignment at the aforementioned laminating step (lay up) during lamination, and methods for confirming accuracy of the alignment of conductor patterns, conductive pillars, and IVHs of the respective layers after laminating multi-layered wiring board are explained.

For implementing confirmation operation for the alignment accuracy, marks for accuracy confirmation may be disposed inside the multi-layered wiring board for example.

Figure 19:
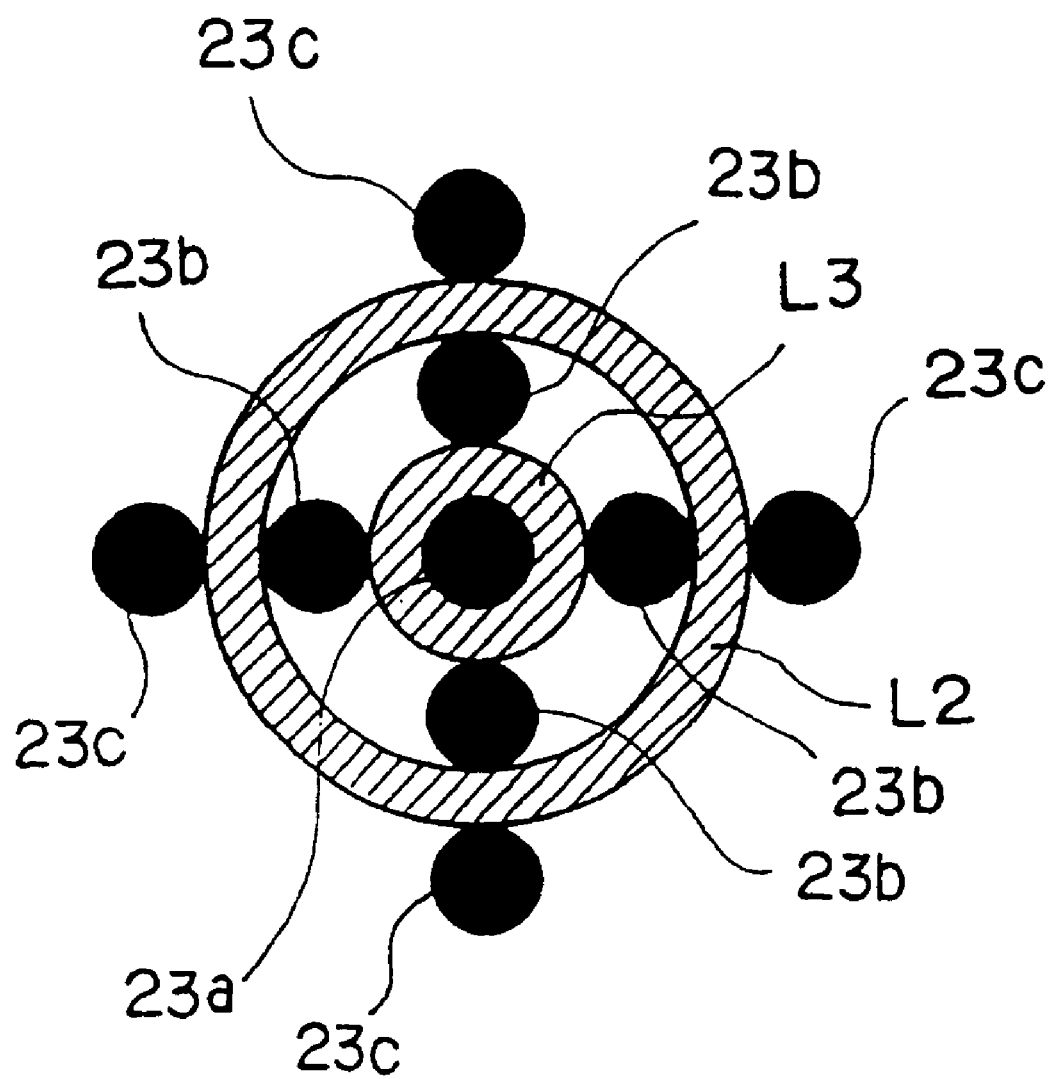
FIG. 19 is a diagram showing an example of such an accuracy confirmation mark.

FIG. 19 is a diagram showing an example of marks for accuracy confirmation that are constituted by combining the conductive pillars 23a, 23b, and 23c disposed on the respective laminated base materials 31, 32 and 33 and the conductor patterns L2 and L3. By adopting such a structure, displacements of the respective base materials that are laminated can be easily detected.

Further, by disposing such marks at alignment points P1 and P2 at the respective steps of lamination for example, the alignment accuracy can be confirmed using the image sensors.

(Embodiment 11)

This method may further comprise a step of forming a plurality of alignment patterns including metal at the prescribed positions of the base material surface to be laminated where the wiring pattern is not formed, a step of stacking the base materials to be laminated on the surface thereof the alignment patterns are disposed and performing alignment operation in the stacking direction detecting the alignment patterns by X-ray transmission, and a step of integrating into a laminate by pressing the stacked base materials in the thickness direction.

Further, this method may comprise a step of forming a plurality of alignment patterns including metal at the prescribed positions of the base material surface to be laminated where the wiring pattern is not formed, a step of stacking the base material to be laminated thereon the alignment patterns are disposed through the prepreg layer, performing alignment operation to the stacking direction and detecting the alignment patterns by irradiating X rays, and a step of integrating into a laminate by pressing in the thickness direction of the aligned base materials.

An apparatus for manufacturing the multi-layered wiring boards of the present invention may comprise a laminating table for disposing by stacking the base materials to be laminated having a plurality of alignment marks including metal at the prescribed positions of the surface where the wiring pattern is not formed, alignment mark detection means consisting of an X-ray generator and an X-ray receiver disposed opposing to the X ray generator having the optical axis approximately perpendicular to the surface of the table of the laminating table, a correction system for moving the base materials for laminating stacked on the laminating table in X-axis, Y-axis and θ directions respectively corresponding to the position detection of the alignment mark detection means, and a pressing system for integrating the aforementioned stacked and aligned base materials into a laminate.

In the present invention, the base materials after circuit patterning of the copper foil of the copper-clad insulating substrate and prepreg-type insulating layer of which external layer is patterned in circuit or the like are cited as the base materials to be laminated. The alignment marks are disposed on the area where the wiring pattern is not formed, at the outside of the external form processing line for example. Naturally, the alignment marks may be disposed favorably on the area where the density of the wiring patterns is sparse, even the marks may be disposed inside the external form processing line. To reduce the detection error, they can be preferably disposed at the neighborhood or outside of the external form processing line. Here, the shape of the alignment marks is desirable to be circular from the viewpoint of positioning (ease of determining reference position), however, other shapes such as rectangle or ellipse are acceptable. That is, the shape thereof is not particularly restricted.

These alignment marks may be formed and disposed simultaneously at the step when, for example, the copper foil is patterned into circuit, or conductive paste containing dispersed conductive metallic powder such as silver may be printed separately to form and be disposed. However, in all cases, to perform the necessary positioning with high accuracy, they are required to form and dispose at least at two places. Incidentally, upon forming and disposing the alignment marks, the secondary alignment marks can be formed and disposed in the neighborhood of the reference alignment marks, and the reference alignment marks are corrected in their positions by detecting the secondary alignment marks.

In addition, the wiring pattern is usually made of conductive metals such as copper, aluminum or the like, and the pattern is formed by photo etching treatment of these metal foils. Alternatively, the conductive paste, for example, can be printed using screen-printing method to form the pattern.

Further, the insulating layers stacked and disposed between the base materials to be laminated, for example, prepreg layers. The prepreg is not in the strict meaning, but can be sited hot-melt sheets including polycarbonate resin, polysulfone resin, thermoplastic polyimide resin, polytetrafluoroethylene resin, hexafluoropolypropylene resin, polyetheretherketone resin, or sheets of crude rubber which show adhesiveness through heating to melt such as not-cured epoxy resin, bismaleimide-triazine resin, polyimide resin, phenolic resin, polyester resin, melamine resin, butadiene rubber, butyl rubber, natural rubber, neoprene rubber, silicone rubber or the like. These synthetic resins can be used alone but can contain the insulating inorganic filler or organic filler. Further, they can be sheets obtained by combining with reinforcement such as glass cloth and matte, organic synthetic fiber sheet and matte, or paper.

In the present invention, the position detection means detecting the alignment marks of the stacked base materials to be laminated in the laminated direction is usually an X-ray transmission device, but may be an optical recognition means depending on the kind and the material quality (for example, X ray transmission coefficent) of the base materials to be laminated. In the present invention, a means for feeding and transferring the necessary materials for lamination to the surface of the position correction table is not restricted particularly. By disposing tables for feeding and transferring in parallel, the feeding and transferring of the materials for lamination can be easily automated. Here, the position correction table is provided with a system capable of arbitrarily transporting and controlling at least in X-axis, Y-axis, and θ direction.

Further, in the present invention, the stacked and positioned base materials to be laminated, after alignment thereof, are tentatively fixed if necessary and fed and transferred from the position correction table to pressing system. Then, after integrated into a laminate, if necessary, they are fed again to the side of the position correction table. There, another base material to be laminated is stacked and aligned to repeat the integration and multiple wiring.

Further, in the present invention, the alignment marks are detected by X-ray transmission method to perform positioning of the base materials to be laminated. Thereafter, they are pressed in the laminating direction and integrated. That is, this method can perform positioning with high accuracy avoiding the reference position shift liable to occur for contact positioning since the positioning of the base materials to be laminated and integrated is carried out by so-called in non-contact way. Therefore, the highly reliable multi-layered wiring boards in which the wiring pattern layers are laminated and disposed securely and with high accuracy can be manufactured with high yield.

Further, in the present invention, since the highly accurate lamination is performed with good reproducibility, mass production of multi-layered wiring boards of high reliability can be easily carried out.

(Embodiment 12)

Figure 20:
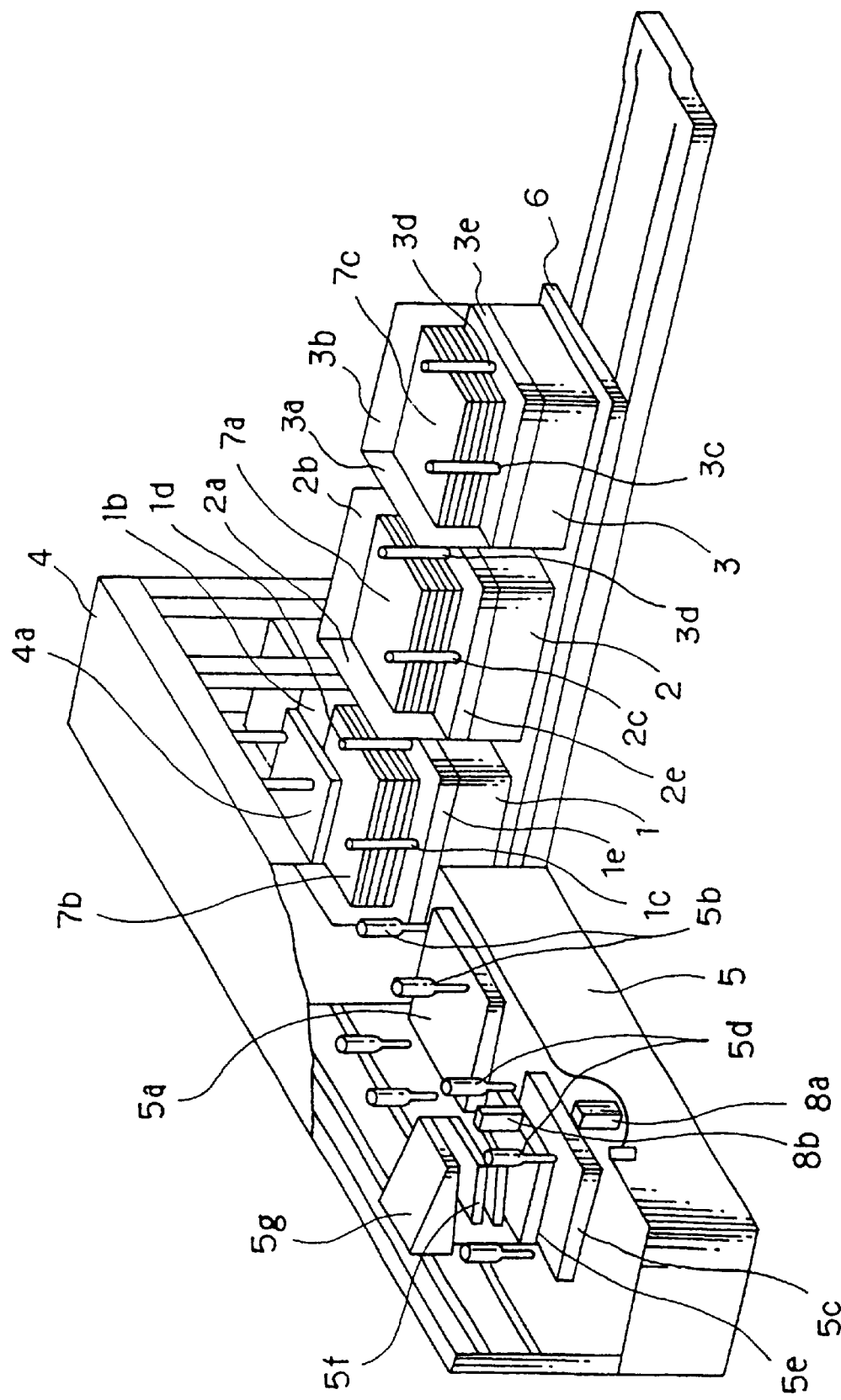
FIG. 20 is a perspective view showing an essential constitution of a apparatus for manufacturing multi-layered wiring boards of the present invention.

FIG. 20 is a perspective view showing a constitution of an essential portion of a apparatus for manufacturing multi-layered wiring boards. In FIG. 20, reference numerals 1, 2, and 3 designate triple storage spaces that automatically feed base materials (for example, core sheets) and attaching sheets stacked to the both surfaces of the base materials. Reference numeral 4 designates a base material feeding handler that feeds the base materials at the triple storage spaces 1, 2, and 3 to an assembly device 5.

Here, the triple storage spaces 1, 2 and 3 are constituted of length reference plates 1a, 2a and 3a, side reference plates 1b, 2b and 3b, transverse width control bars 1c, 2c and 3c, longitudinal width control bars 1d, 2d, and 3d, and elevators 1e, 2e and 3e, respectively. These storage spaces are fixed on a slider 6 which moves laterally. Among them, the transverse width control bars 1c, 2c and 3c and the longitudinal width control bars 1d, 2d and 3d have mechanisms for sliding behind during setting the base materials.

The storage space 1, storage space 2 and storage space 3 store lower side attaching sheet base materials 7B, base material (core board, for example) 7a, and upper side sheet materials 7c material, respectively. These base materials at the storage spaces are stacked in order by pushing two sides thereof to the length reference plates 1a, 2a and 3a, and side reference plates 1b, 2b and 3b. Incidentally, after the respective base materials 7a, 7b and 7c are stacked in order, the transverse width control bars 1c, 2c and 3c, and the longitudinal width control bars 1d, 2d and 3d back to a position where the respective base materials 7a, 7b and 7c stacked in order do not collapse.

Further, the slider 6 has a function for moving and controlling the respective storage spaces 1, 2 and 3 to place positions where the base material feeding handler 4 can transfer the respective base materials 7a, 7b and 7c at a definite position.

On the other hand, the elevators 1e, 2e and 3e of the respective storage spaces 1, 2 and 3 positioning and control at the height direction such that the base material feeding handler 4 can catch securely the uppermost one of the respective base materials 7a, 7b and 7c.

The base material feeding handler 4 is constituted of a vacuum catcher 4a that can be arbitrary driven in X-axis and Y-axis direction and a box 4b for taking out interleaves.

Then, the handler receives the base materials 7a, 7b and 7c from the respective storage spaces 1, 2 and 3 by the vacuum catcher 4a, together with transferring the base materials to the assembly device 5 side. The handler then takes out the interleaves interposed between the respective base materials 7a, 7b and 7c for mechanical protection purpose and removes into the box 4b.

Here, the assembly device 5 coordinates the respective base materials that are transferred and fed in turn in their positions and fixes tentatively by solder or the like. It is constituted as follows. That is, the assembly device comprises a vacuum catcher system for receiving and fixing the respective base materials 7b, 7a and 7c that are fed by the base material feeding handler 4, a first vacuum stage 5a having a smooth surface, a solder coating device 5b having a mechanism capable of moving in up and down direction, a vacuum catcher mechanism for holding the base materials 7a, 7b and 7c received for performing positioning and tentative fixing horizontally with keeping smooth surface, a second vacuum stage 5c having a smooth surface, and an X-ray generator 8a and a camera 8b disposed for detecting the alignment marks disposed in advance on the respective base materials 7a, 7b and 7c as transmitted images putting the second vacuum stage 5c between them.

The assembly device further comprises opposed heat bars 5d disposed upside and downside putting the second vacuum stage 5c between them that perform soldering for tentative fixing of the solders, a downward directing vacuum catcher system for receiving the laminated body 7 of the base materials 7a, 7b and 7c held by the first vacuum stage 5a horizontal and kept smooth, and a main sucker plate 5e having smooth surface, a suspending positioning system 5f having X, Y, Z and θ driving mechanisms for driving and controlling freely the main sucking plate 5e on a horizontal surface, and a moving head 5g for moving the alignment marks of the received base materials 7a, 7b and 7c (stacked body 7) to a position that coincides approximately with the X ray optical axis of the X-ray generator 8a and the camera 8b. Here, the moving head 5g moves the suspension positioning system 5f and the main sucker plate 5e horizontally for moving the marks to the position that coincides approximately with the optical-axis of the X rays.

Next, operation of feeding the base materials 7a, 7b and 7c of the three-series storage spaces 1, 2 and 3 to the assembly device 5 by the base material feeding handler 4 will be described.

A lower side attaching sheet 7b for a base material 7a, a base material (for example, core board) 7a and an upper side attaching sheet 7c fed in order from the three-series storage spaces 1, 2 and 3 are accepted and held on a surface of the first vacuum stage 5a with a positioning accuracy that locates the alignment marks disposed on an X-ray axis that the X-ray generator 8a and the camera 8b form. Here, the lower side attaching sheet 7b fed are coated with paste solder on the soldering spot by a solder feeding device 5b.

Thereafter, they are moved by driving control of the suspension positioning system 5f and moving head 5g, on an X-ray axis formed by the X-ray generator 8a and the camera 8b while sucked and held by the main sucker plate 5e. Then the alignment marks are coincided accurately to this X-ray axis. While maintaining this coincided state, the lower side attaching sheet 7b is delivered to the second vacuum stage 5c to let suck and hold on the surface of the second vacuum stage 5c as in its position. Also as for the base material 7a and the upper side attaching sheet 7c, similar operation is performed. That is, on the surface of the second vacuum stage 5c, the lower side attaching sheet 7b, the base material 7a and the upper side attaching sheet 7c are coordinated in their positions in this order for stacking.

By a series of operations of coordination for stacking, in the stage where the lower side attaching sheet 7b is stacked on the surface of the second vacuum stage 5e, the stacking base materials are thrust up by the heat-bars 5d for soldering from below to melt the solder paste coated in advance. Thereby, mutually opposed solders are connected to integrate mechanically the lower side attaching sheet 7b and the base material (for example, core material) 7a. Thus integrated lower side attaching sheet 7b and the base material 7a are sucked and held by the main sucking plate 5e, and for the alignment marks thereof to coincide accurately with the X-ray axis formed by the X-ray generator 8a and the camera 8b, the suspension positioning system 5f is driven controlled. Then, while keeping this state, the connected body of the lower side attaching sheet 7b and the base material 7a is delivered again to the second vacuum stage 5c and is held by vacuum as in its position.

Then, the connected body of the lower side attaching sheet 7b and the base material 7a, and the upper side attaching sheet 7c, by carrying out the similar operations as the case of a series of procedures of connection/integration of the base material 7a to the lower side attaching sheet 7b, are made a connected body of the lower side attaching sheet 7b-the base material 7a-the upper side attaching sheet 7c. That is, using the alignment marks, the multi-layered wiring boards laminated and aligned with high accuracy using non-contact method are obtained.

(Embodiment 13)

Figure 21:
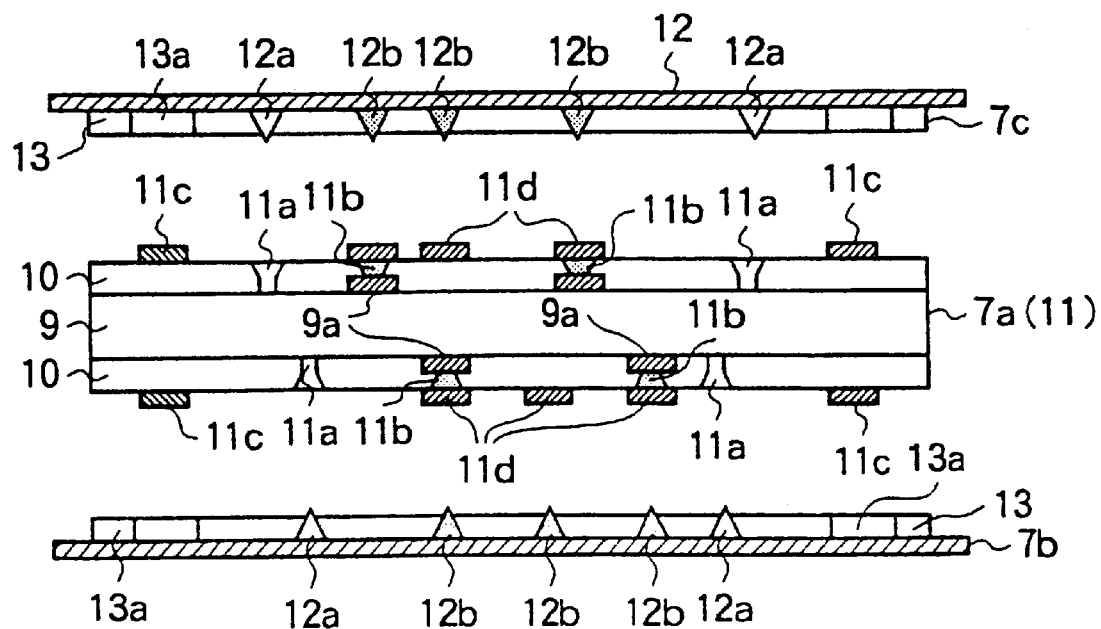
FIG. 21 is a cross section showing diagrammatically a laminated state of base materials in the present invention.
Figure 22:
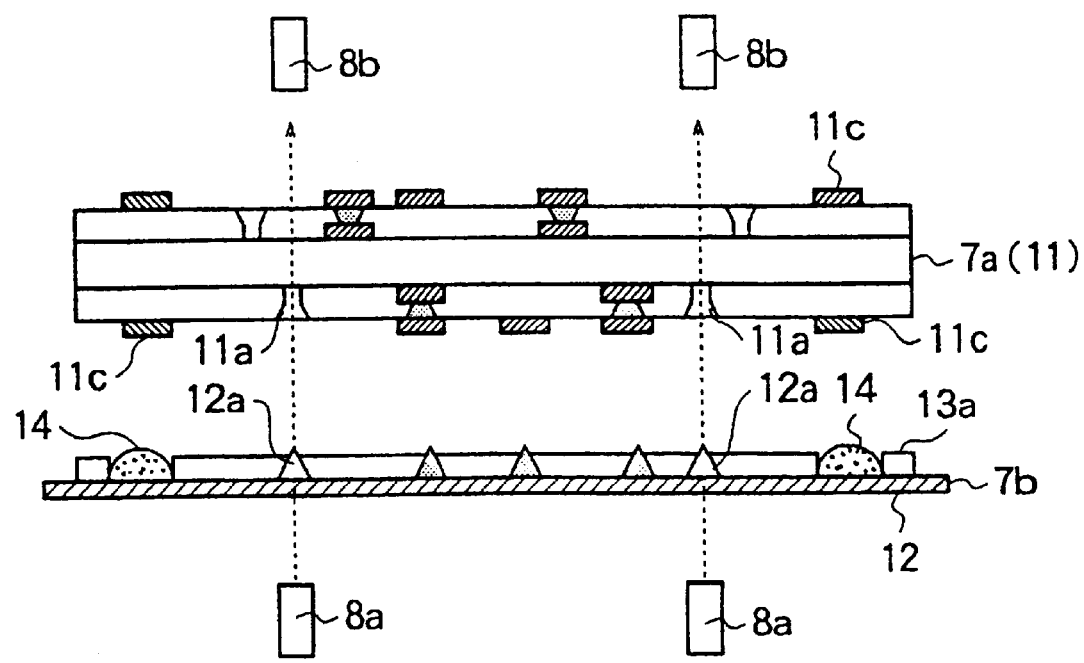
FIG. 22 is a cross section showing diagrammatically state of piling up and positioning of two layers of base materials in the present invention.
Figure 23:
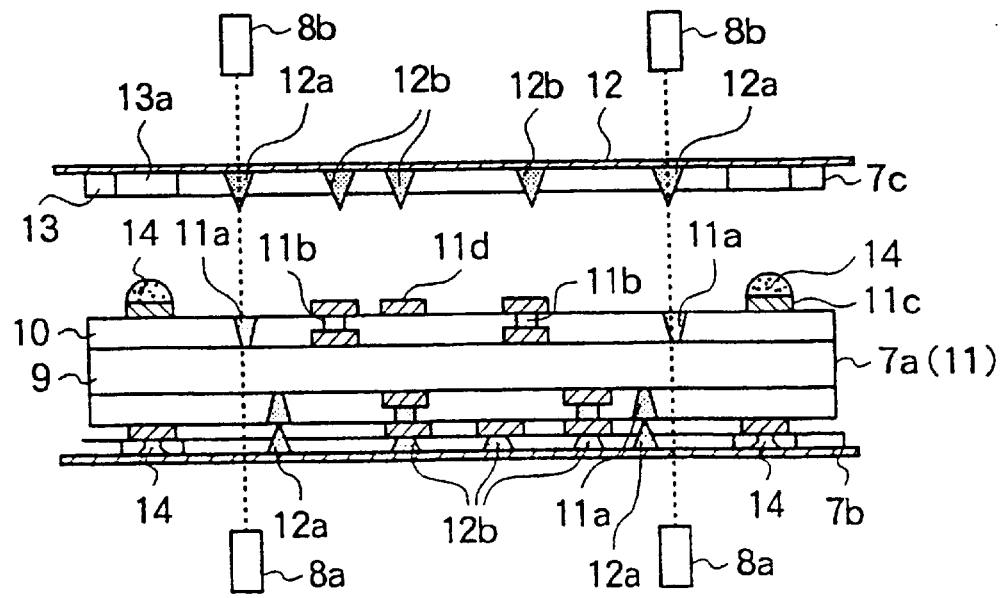
FIG. 23 is a cross section showing diagrammatically a state of lamination of base materials due to the present invention.

FIG. 21, FIG. 22 and FIG. 23 are cross-sections showing schematically states of practice of this embodiment. Here, FIG. 21 shows a state of lamination and disposition of the core substrate 7a, the lower side attaching sheet 7b and the upper side attaching sheet 7c, and FIG. 22 and FIG. 23 show states of positioning due to alignment patterns, respectively.

First, a double-sided wiring base material 9 for lamination having wiring patterns 9a on the both surfaces thereof is prepared. On the both wiring surfaces of this double-sided wiring base material for lamination 9, insulating layers 10 are disposed, respectively. Thereafter, on the surfaces of these insulating layers 10, foils of electrolytic copper on the prescribed positions thereof conductive bumps 11 are disposed are disposed, and they are integrated through pressing and heating. Then, the foils of the electrolytic copper are treated using photo etching to prepare a core base material 11 having alignment marks 11a, and circuit patterns 11d thereon via-connections 11b and soldering lands 11c are formed.

Next, on the surface of the electrolytic copper 12 on one main surface thereof conductive bumps 12a and 12b are disposed corresponding to the alignment marks 11a and wiring patterns 11d of the core base material 11, respectively, an insulating layer 13 of which portions corresponding to the soldering lands 11c of the core base material 11 are opened (soldering spots) 13a is disposed. Thereafter, they are pressed to make tip ends of the conductive bumps 12a and 12b and are threaded through and out of the insulating layer 13 to prepare attaching sheets 7b and 7c of which tip ends are pierced out of the insulating layers. Incidentally, in preparing the core base material 11 (7a) and the attaching sheets 7b and 7c, there are at least two alignment marks 11a on each main surface, the alignment marks being disposed to give relative positional relation having sufficient positioning accuracy when overlapped.

Thereafter, the core base material 7a and the attaching sheets 7b and 7c are stacked and accommodated respectively in the corresponding storage spaces 1, 2 and 3, and transported and fed to position of the base material feeding handler 4. Then, the lower side attaching sheet 7b and the core base material 7a are transferred on a surface of a first vacuum stage 5a of an assembly device 5 for their mutual position to be coordinated. In addition, at this time, on openings (soldering spots) 13a of the insulating layer 13 of the lower side attaching sheet 7b, solder 14 is fed by the solder feeding device 5b.

Next, by driving a suspension type positioning system 5f to position mutual alignment marks 11a and conductive bumps 12a to coincide with the optical axes when an X-ray beam emitted from an X-ray generator 8a is received by a camera 8b, respectively, the alignment marks 11a and conductive bumps 12a are overlapped while coinciding them to the optical axes of the X rays. While maintaining this overlapped state, the solder 14 fed on the soldering spot is heated by spot heating to connect the soldering land 11c of the core base material 7a and the soldering spot 13a.

Next, on an exposed surface of the core board 7a of the connected body, the upper attaching sheet 7c is stacked in order by the similar operation. Thereafter, by driving a suspension type positioning system 5f, the overlapping alignment patterns 11a and 12a are positioned to coincide with the optical axes when an X-ray beam emitted from an X-ray generator 8a is received by a camera 8b, respectively, thereafter the alignment marks 11a and 12a are overlapped while coinciding to the optical axes of the X rays. While maintaining in this overlapped state, the solder 14 fed on the soldering spot 11c is heated by spot heating to connect the soldering land 11c of the core board 7a and the soldering spot 13a.

On both surfaces of the core board 7a (11), the laminate that connected the lower side attaching sheet 7b and the upper side attaching sheet 7c aligned and coordinated are pressed to integrate. Thereby, a double-sided board pasted on the both surfaces thereof by the attaching sheets 7b and 7c in which a plurality of wiring layers is included is prepared. Then, the copper foils on both surfaces are photo-etched to form external layer wiring pattern and the conductive bumps are formed as interlayer connections 11b. Thus a multi-layered wiring board is obtained. Incidentally, with this multi-layered wiring board as the core board, thereon the lower side attaching sheet 7a and upper side attaching sheet 7c are stacked and aligned, and they are pressed to integrate. By repeating like this, a further multi-layered wiring board can be prepared. Thereafter, along the external form line located inside of the positioning patterns 12a, the integrated body is cut to be a multi-layered wiring board of prescribed rating.

(Embodiment 14)

Figure 24:
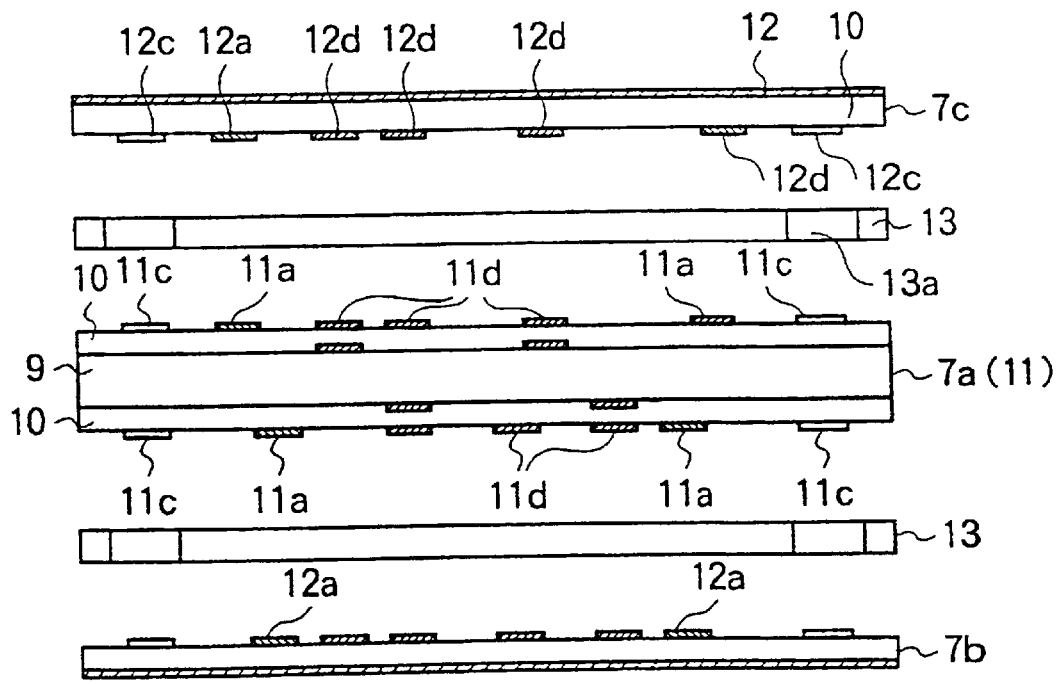
FIG. 24 is a cross section showing diagrammatically a state of lamination of base materials due to the present invention.
Figure 25:
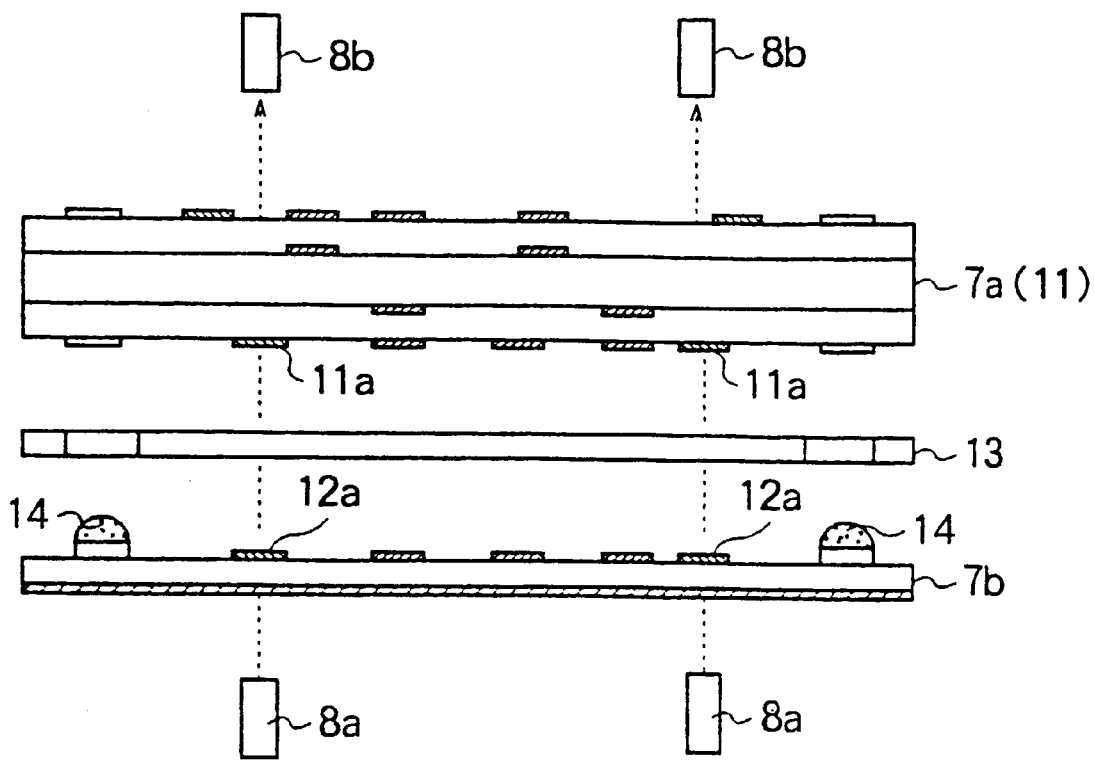
FIG. 25 is a cross section showing diagrammatically a state of lamination of and positioning of three layers of base materials due to the present invention.
Figure 26:
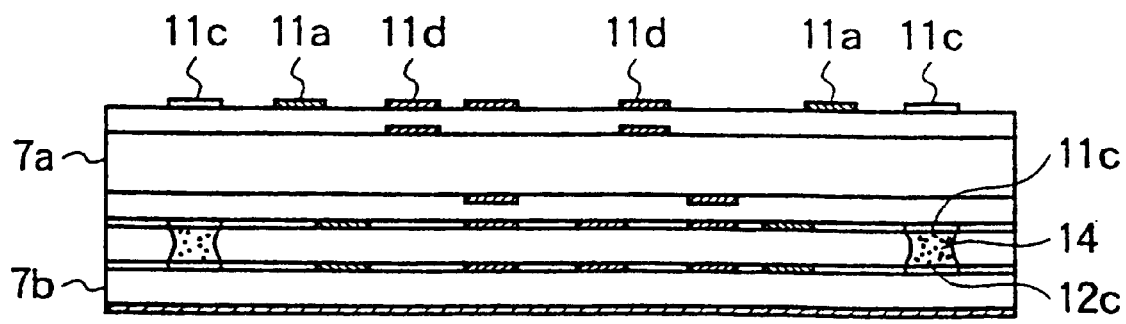
FIG. 26 is a cross section showing diagrammatically a state integrated by pressing three layers of base materials in the present invention.
Figure 27:
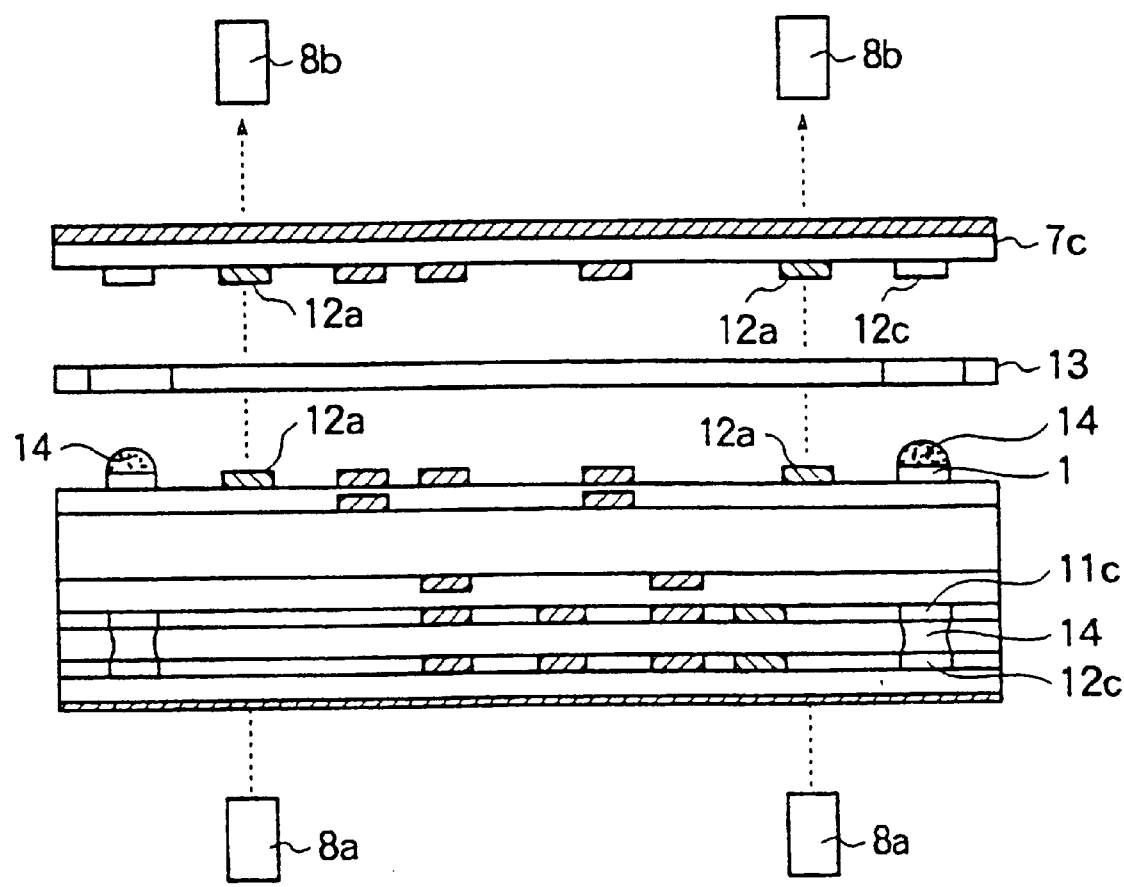
FIG. 27 is a cross section showing diagrammatically a state of lamination and positioning of three layers including laminated body shown in FIG. 26.
Figure 29A:
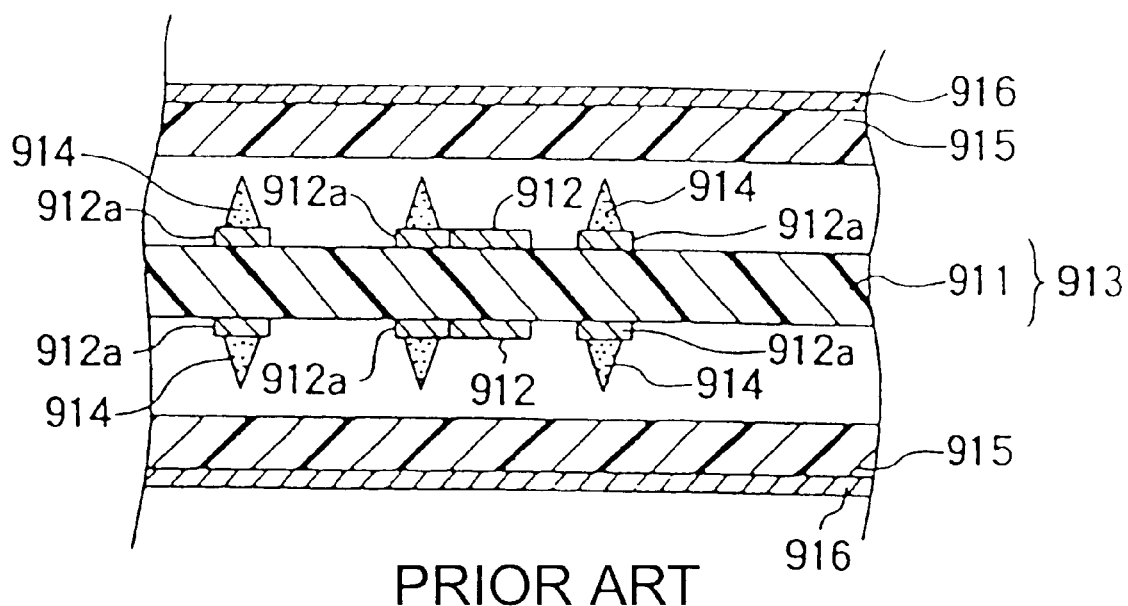
FIG. 29A and FIG. 29B are diagrams showing an example of a method for manufacturing a multi-layered wiring board that is connected between wiring layers using the conventional conductive bumps.
Figure 29B:
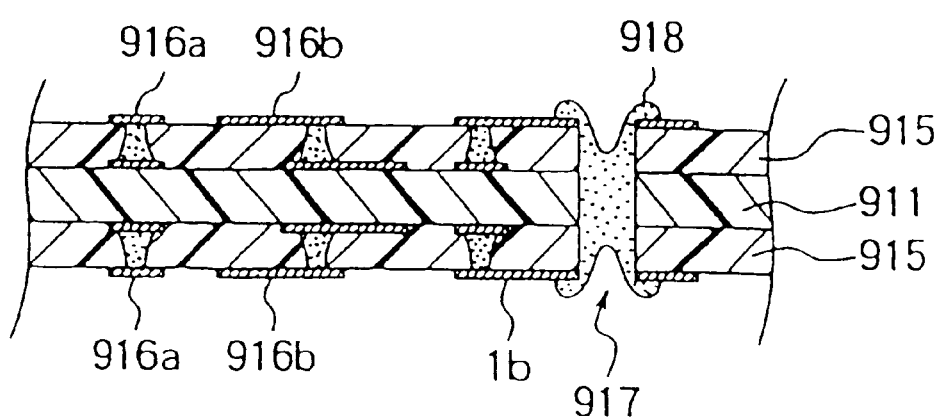
Figure 30A:
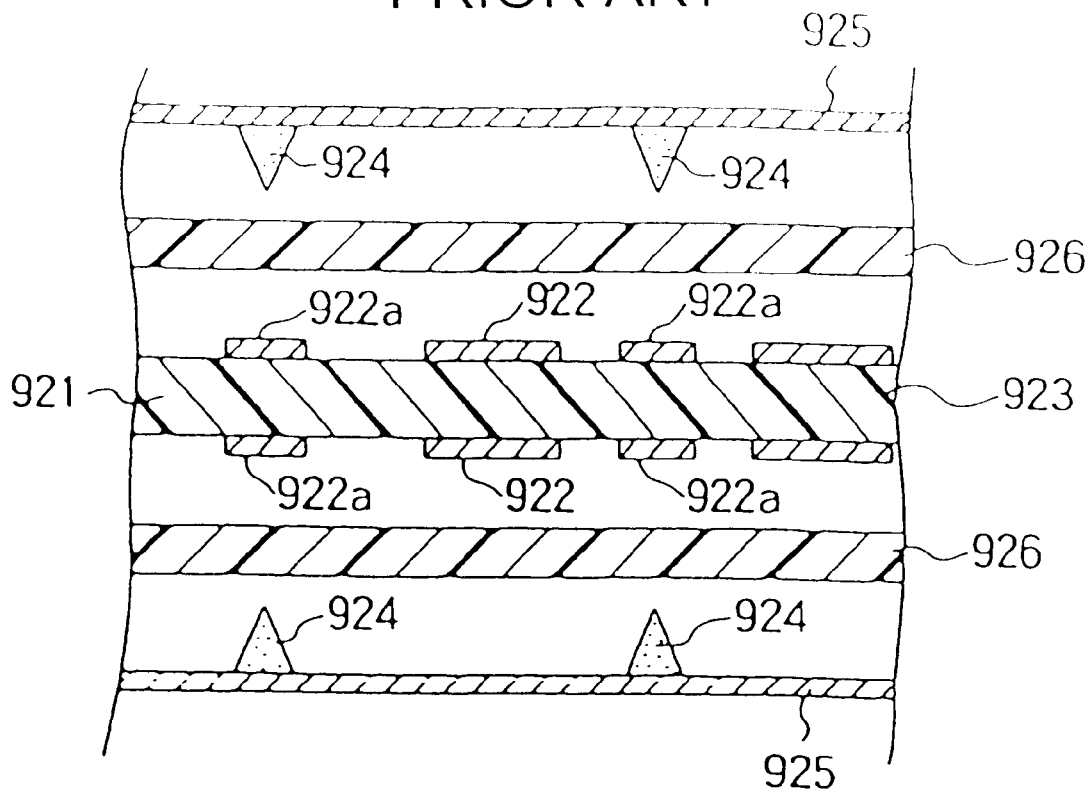
FIG. 30A and FIG. 30B are diagrams showing another example of a method for manufacturing multi-layered wiring boards that are connected between wiring layers using conductive bumps.
Figure 30B:
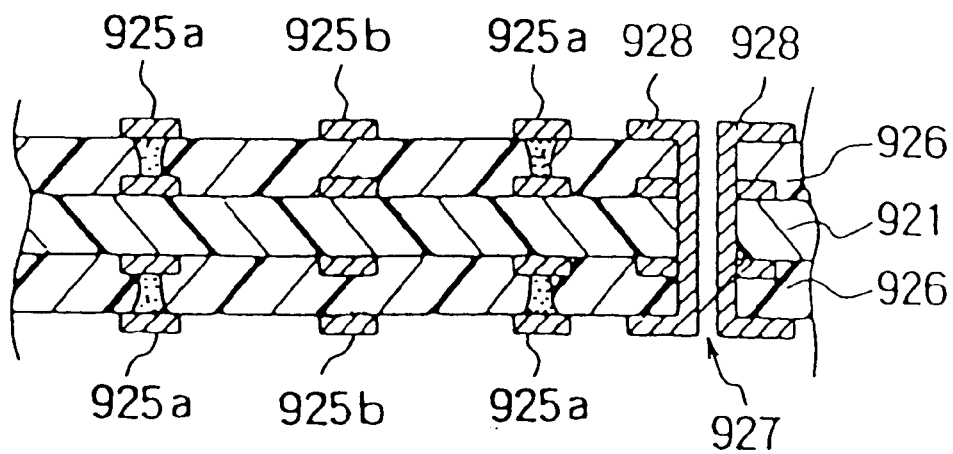

FIGS. 24 through FIG. 27 are cross-sections showing schematically states of practice of this embodiment. Here, FIG. 24 shows a state of lamination and disposition of a core board 7a, a lower side attaching sheet 7b and an upper side attaching sheet 7c, FIG. 25 shows a state of positioning of the lower side attaching sheet 7b with positioning patterns, FIG. 26 shows an integrated state of the core board 7a and the lower side attaching sheet 7b, and FIG. 27 shows a state of positioning of the upper side attaching sheet 7c with the positioning patterns.

In this embodiment, the alignment marks 12a of the core board 7a, the lower side attaching sheet 7b and the upper side attaching sheet 7c are disposed inside of the external shape processing line (multi-layered wiring board) and on the area where the wiring pattern is not formed simultaneously in the process of circuit patterning of the copper foils. Other than this, the multi-layered wiring board of this embodiment is prepared under the same conditions and operations as the case of the aforementioned embodiment 2. That is, a double-sided wiring base material 9 for lamination that is provided with wiring patterns 11d on both surfaces thereof is prepared, and on both wiring surfaces of this base material 9, the insulating layers 10 are disposed, respectively. Thereafter, on the surfaces of these insulating layers 10, electrolytic copper foils are disposed. Then, they are pressed and heated to integrate into one body. Next, the electrolytic copper foils are treated using photoetching method to prepare a core board 11 having wiring patterns 11d together with the alignment marks 11a and soldering lands 11c.

Next, attaching sheets 7b and 7c in which alignment marks 12a and soldering lands 12c are disposed on the surface of the electrolytic copper foil through an insulating layer 13, and an insulating layer 13 of which portions corresponding to the soldering lands 11c of the core board 7a (11) and the soldering lands 12c of the attaching sheets 7b and 7c are opened (soldering spots) 13 are prepared. Here, the alignment marks of the attaching sheets 7b and 7c are disposed on positions corresponding to the alignment marks 11a of the core board 11 (7a). Incidentally, in the core board 11 and the attaching sheets 7a and 7b, the alignment marks 11a and 12a on each main surface are at least two, and set to have enough relative positional relation that gives sufficient positioning accuracy when being overlapped.

To thus constituted core board 11 (7a), the attaching sheets 7b and 7c, and the insulating layer, the step of feeding from the base material feeding storage space 1, 2 and 3 (in this embodiment, the base material feeding storage space for feeding the insulating layer 13 is added) to the first vacuum stage 5a, the step of feeding solder using the solder feeding device 5b, the step of positioning and coordinating due to X-ray transmission with the positioning pattern at the second vacuum stage 5c as reference, the step of tentative fixing due to soldering, the step of pressing to integrate, or the like are performed according to the embodiment 2, thereby the multi-layered wiring boards can be obtained.

Incidentally, the present invention is not restricted to the aforementioned embodiments. Within the range not deviating from the points of the present invention, various modifications can be applicable. For example, in the manufacturing apparatus, the constitution of the base material feeding storage space and positioning system are not restricted to the illustrated constitutions.

INDUSTRIAL APPLICABILITY

As described above, according to the manufacturing method and apparatus for manufacturing the multi-layered wiring boards of the present invention, a plurality of base materials can be laminated with high accuracy. Therefore, including, for example, reliability of interlayer connection, reliability of multi-layered wiring boards can be enhanced. Further, since the present invention can also cope with the multi-layered wiring boards having more finer wiring patterns, wiring boards that mount highly integrated semiconductor elements, wiring boards that mount electronic components with high packing density or the like can be provided with high productivity.

In addition, in the present invention, since any mechanical positioning method that involves such as pins or eyelets is not employed, deterioration of reliability and productivity due to deformation of the base material is not caused.

Further, since the present invention is appropriate for automation of laminating operation of base materials such as automatic control due to computers, the multi-layered wiring boards of high accuracy can be manufactured with high productivity.

According to the present invention, the multi-layered wiring boards having a structure that enables for the interlayer connection to be highly accurate and highly productive can be provided. Further, the present invention can provide multi-layered wiring boards having a structure capable of laminating easily with high accuracy.

What is claimed is:

1. A method for manufacturing a multi-layered wiring board by laminating base materials on which an electrically conductive alignment mark is disposed, the method comprising the steps of:

(a) moving a base material by a first offset amount in a first direction;

(b) detecting the alignment mark on the moved base material by irradiating an X-ray beam onto the moved base material;

(c) diminishing a displacement of the detected alignment mark from an optical axis of the X-ray beam which is a criteria of the laminating; and (d) moving back the moved base material having the diminished displacement of the detected alignment mark from the optical axis of the X-ray beam by the first offset amount in a second direction opposite to the first direction.

2. A method for manufacturing a multi-layered wiring board by laminating base materials on which an electrically conductive alignment mark is disposed, the method comprising the steps of:

(a) moving a base material by a first offset amount in a first direction perpendicular to a line normal to the base material;

(b) detecting the alignment mark on the moved base material by irradiating an X-ray beam in a direction along a line normal to the moved base material onto the moved base material;

(c) diminishing a displacement of the detected alignment mark from an optical axis of the X-ray beam which is a criteria of the laminating; and (d) moving back the moved base material having the diminished displacement of the detected alignment mark from the optical axis of the X-ray beam by the first offset amount in a second direction opposite to the first direction.

3. The method for manufacturing the multi-layered wiring board as set forth in claim 2, the method further comprising the step of:

(e) transporting the moved-back base material in a direction along a line normal to the moved-back base material and stacking with another base material.

4. A method for manufacturing a multi-layered wiring board by laminating base materials on which an electrically conductive alignment mark is disposed, the method comprising the steps of:

(a) holding a base material having an alignment mark on a first surface of a first holding member having a flat first surface;

(b) irradiating an X-ray beam in a direction along a line normal to the first surface;

(c) moving the first holding member in a first direction by a first offset amount up to a position where the alignment mark is irradiated by the X-ray beam;

(d) detecting the alignment mark by the irradiated X-ray beam;

(e) diminishing a displacement of the detected alignment mark from an optical axis of the X-ray beam which is a criterion of the laminating; and (f) moving back the first holding member by the first offset amount in a second direction opposite to the first direction.

5. The method for manufacturing the multi-layered wiring board as set forth in claim 4, the method further comprising the steps of:

(g) stacking the moved-back base material on a second surface of a second holding member that has the second surface opposing to the first surface of the first holding member.

6. A method for manufacturing a multi-layered wiring board by laminating a first base material of an insulating resin layer in a semi-cured state laminated with a conductor layer and a second base material, the method comprising the steps of:

disposing the first base material on a second surface of a second holding member;

coating solder on the first surface of the first base material;

disposing the second base material on the first surface of the first base material; and fixing the first base material and the second base material by melting the solder before curing the insulating resin layer.

7. The method for manufacturing the multi-layered wiring board as set forth in claim 6, the method further comprising the steps of:

curing the insulating resin layer by pressing and heating the soldered first base material and second base material.

8. A method for manufacturing a multi-layered wiring board by laminating a first base material of an insulating resin layer in a semi-cured state laminated with a conductor layer and a second base material, the first base material having an alignment mark, the method comprising the steps of:

holding the first base material on a first surface of a first holding member having a flat first surface;

moving the first holding member by a first offset amount in a first direction;

detecting the alignment mark by irradiating an X-ray beam in a direction along a line normal to the first surface;

diminishing a displacement of the detected alignment mark from an optical axis of the X-ray beam which is a criterion of the laminating;

moving back the first holding member by the first offset amount to a second direction opposite to the first direction;

holding the first base material on the second surface of the second holding member;

coating solder on the first surface of the first base material;

disposing the second base material on the first surface of the first base material; and fixing the first base material and the second base material by melting the solder before curing the insulating resin layer.

9. A method for manufacturing a multi-layered wiring boards by laminating a first base material of an insulating resin layer in a semi-cured state laminated with a conductor layer and a second base material, the second base material having an alignment mark, the method comprising the steps of:

disposing the first base material on a second surface of a second holding member;

coating solder on the first surface of the first base material;

holding the second base material on the first surface of the first holding member having a flat first surface;

moving the first holding member by a second offset amount in a first direction;

detecting the alignment mark by irradiating the X-ray beam in a direction along a line normal to the first surface;

diminishing a displacement of the detected alignment mark from an optical axis of the X-ray beam which is a criterion of the laminating;

moving back the first holding member by the second offset amount in a second direction opposite to the first direction;

stacking the second base material to the first surface of the first base material; and fixing the first base material and the second base material by melting the solder before curing the insulating resin layer.

10. An apparatus for manufacturing a multi-layered wiring board laminating base materials on which an electrically conductive alignment mark is disposed, the apparatus comprising;

a transferring mechanism which transfers a base material in a first direction and a second direction opposite to the first direction;

a detector which detects an alignment mark on the transferred base material transferred by irradiating an X-ray beam onto the transferred base material;

a position correcting mechanism which corrects a position of the transferred base material, based on the alignment mark detected by the detector;

a holding member which holds the base material having the corrected position so as to stack the base material to another base material.

11. An apparatus for manufacturing a wiring board laminating base materials on which an electrically conductive alignment mark is disposed, the apparatus comprising:

a first holding member which holds a base material having an alignment mark, the member having a flat first surface;

an X-ray beam irradiating device capable of irradiating X-ray beams to the base material held by the first folding member in a direction along a line normal to the first surface, an optical axis of the irradiated X-ray beams being a criteria of the laminating;

a transporting mechanism which transports the first holding member so as to keep a normal direction of the first surface parallel to the optical axis of the irradiated X-ray beams;

a detector, disposed opposed to the X-ray beam irradiating device, capable of detecting the alignment mark of the base material held by the first holding member; and a position correcting mechanism which corrects a position of the transported first holding member so as to diminish a displacement of the detected alignment mark from the optical axis of the irradiated X-ray beams.

12. The apparatus for manufacturing a wiring board as set forth in claim 11.
  wherein the X-ray beam irradiating device is disposed at least in a pair.

13. The apparatus for manufacturing a wiring board as set forth in claim 11.
  wherein the first holding member comprises at least a pair of slits disposed in parallel.

14. The apparatus for manufacturing a wiring board as set forth in claim 11;
  wherein the transporting mechanism transports the first holding member in parallel by a first offset amount in a first direction, and by the first offset amount in a second direction opposite to the first direction.

15. The apparatus for manufacturing a wiring board as set forth in claim 14:
  wherein the transporting mechanism further transports the first holding member in parallel to a direction along a line normal to the first surface.

16. The apparatus for manufacturing a wiring board as set forth in claim 11:
  wherein the position correcting mechanism corrects the position of the transported first holding member so as to minimize the displacement.

17. The apparatus for manufacturing a wiring board as set forth in claim 16:
  wherein the position correcting mechanism corrects the position of the transported first holding member by shifting in parallel or rotating the first holding member based on the displacement to keep the first surface perpendicular to the optical axis of the irradiated X-ray beams.

18. The apparatus for manufacturing a wiring board as set forth in claim 11:
  wherein the detector has an image sensor, a center of a imaging field of which coincides with the optical axis of the irradiated X-ray beams.

19. The apparatus for manufacturing a wiring board as set forth in claim 18:
  wherein the position correcting mechanism brings a center of the detected alignment mark to the center of the imaging field of the image sensor.

20. The apparatus for manufacturing a wiring board as set forth in claim 18:
  wherein the X-ray beam irradiating device is disposed at least in a pair, and the position correcting mechanism diminishes the pair of the displacements so that the respective displacements are equalized.

21. A multi-layered wiring board, comprising:
  a rectangular base material having a first area and a second area;
  a wiring pattern disposed on the first area of the base material;
  an interlayer connection consisting of conductive resin disposed connecting with the wiring pattern; and
  alignment marks consisting of the conductive resin, the alignment marks being disposed in a row on the second area of the base material in parallel with shorter sides of the base material.

22. The multi-layered wiring board, comprising:
  a rectangular base material having a first area and a second area;
  a wiring pattern disposed on the first area of the base material;
  an interlayer connection consisting of conductive resin disposed connecting with the wiring pattern; and
  alignment marks disposed in a row on the second area of the base material in parallel with shorter sides of the base material;
  wherein the alignment marks are conductive pillars having an approximately conical shape.

* * * * *

UNITED STATES PATENT AND TRADEMARK OFFICE
CERTIFICATE OF CORRECTION

PATENT NO. : 6,237,218 B1
DATED : May 29, 2001
INVENTOR(S) : Ogawa et al.

It is certified that error appears in the above-identified patent and that said Letters Patent is hereby corrected as shown below:

Title page,
Item [54], Title, change "MULTILAYERED" to -- MULTI-LAYERED --.

Item [30], Foreign Application Priority Data,
Delete line 2, "Jan. 20, 1997   (JP)................................9-015313."

Column 32, claim 9,
Line 2, change "boards" to -- board --.

Column 32, claim 10,
Lines 31 and 32, change "comprising;" to -- comprising: --.

Column 32, claim 11,
Line 56, change "criteria" to -- criterion --.

Column 33, claim 12,
Line 2, change "claim 11." to -- claim 11: --.

Column 33, claim 13,
Line 6, change "claim 11." to -- claim 11: --.

Column 33, claim 14,
Line 10, change "claim 11;" to -- claim 11: --.

Signed and Sealed this

Ninth Day of April, 2002

Attest:

*Attesting Officer*

JAMES E. ROGAN
*Director of the United States Patent and Trademark Office*